(12) United States Patent
Buhrman et al.

(10) Patent No.: US 11,444,240 B2
(45) Date of Patent: Sep. 13, 2022

(54) GIANT ENHANCEMENT OF SPIN-ORBIT TORQUE BY INTERFACE SCATTERING FROM ULTRA-THIN INSERTION LAYERS

(71) Applicant: Cornell University, Ithaca, NY (US)

(72) Inventors: Robert A. Buhrman, Ithaca, NY (US); Lijun Zhu, Ithaca, NY (US)

(73) Assignee: Cornell University, Ithaca, NY (US)

( * ) Notice: Subject to any disclaimer, the term of this patent is extended or adjusted under 35 U.S.C. 154(b) by 158 days.

(21) Appl. No.: 16/820,496

(22) Filed: Mar. 16, 2020

(65) Prior Publication Data

US 2021/0280775 A1  Sep. 9, 2021

Related U.S. Application Data

(60) Provisional application No. 62/819,419, filed on Mar. 15, 2019.

(51) Int. Cl.
*H01L 43/04* (2006.01)
*H01L 43/10* (2006.01)
*H01L 43/06* (2006.01)

(52) U.S. Cl.
CPC ............. *H01L 43/04* (2013.01); *H01L 43/06* (2013.01); *H01L 43/10* (2013.01)

(58) Field of Classification Search
CPC ..................................................... H01L 43/04
See application file for complete search history.

(56) References Cited

U.S. PATENT DOCUMENTS

| 4,038,216 A | * | 7/1977 | Henrich | ............ H01J 1/32 252/514 |
| 2018/0033954 A1 | * | 2/2018 | Aradhya | ............ H01F 10/3272 |

* cited by examiner

*Primary Examiner* — Moazzam Hossain
*Assistant Examiner* — Hajar Kolahdouzan
(74) *Attorney, Agent, or Firm* — Perkins Coie LLP

(57) ABSTRACT

Methods, systems, and devices are disclosed for enhancement of spin-orbit torque. In one aspect, a magnetic device includes a magnetic tunneling junction (MTJ), including a free magnetic layer, a pinned magnetic layer and a non-magnetic junction layer between the free magnetic layer and the pinned magnetic layer, and a spin Hall effect metal layer that includes one or more insertion metal layers operable to introduce interfacial scattering of electrons flowing in the spin Hall metal layer to increase the spin current that interacts with and changes the magnetization of the free magnetic layer of the MTJ.

20 Claims, 38 Drawing Sheets

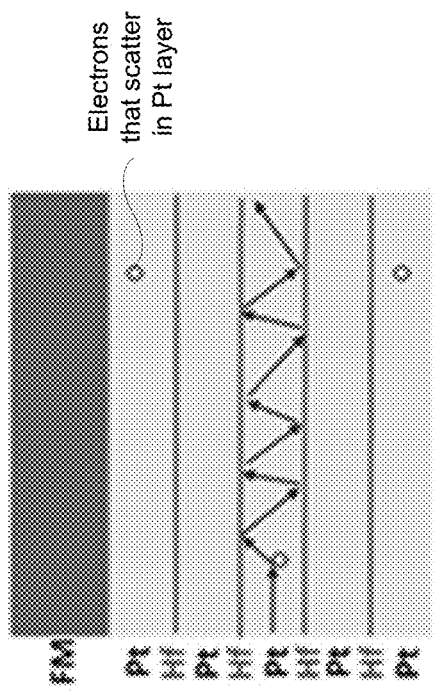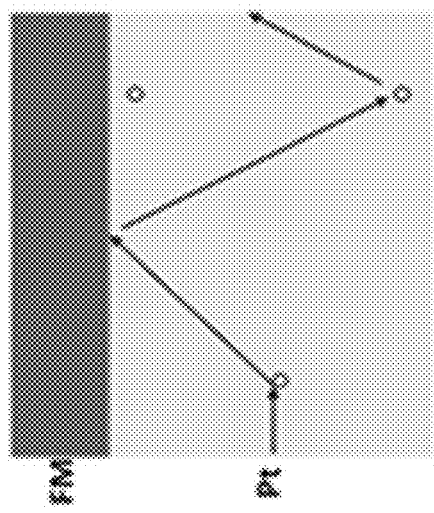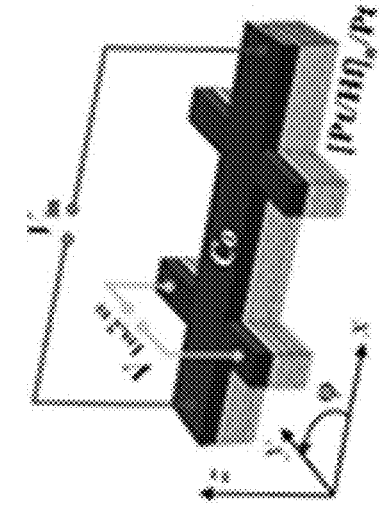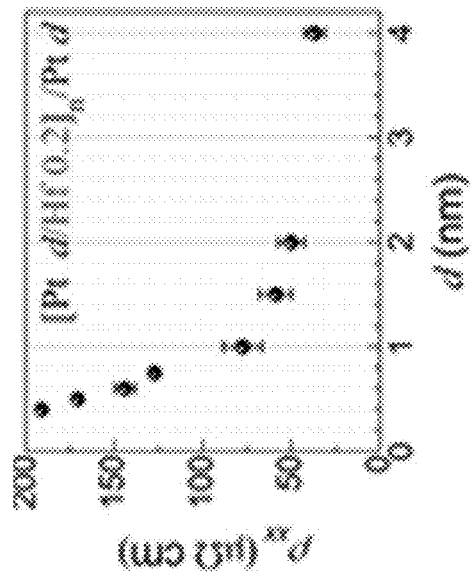
FIG. 1A
FIG. 1B
FIG. 1C

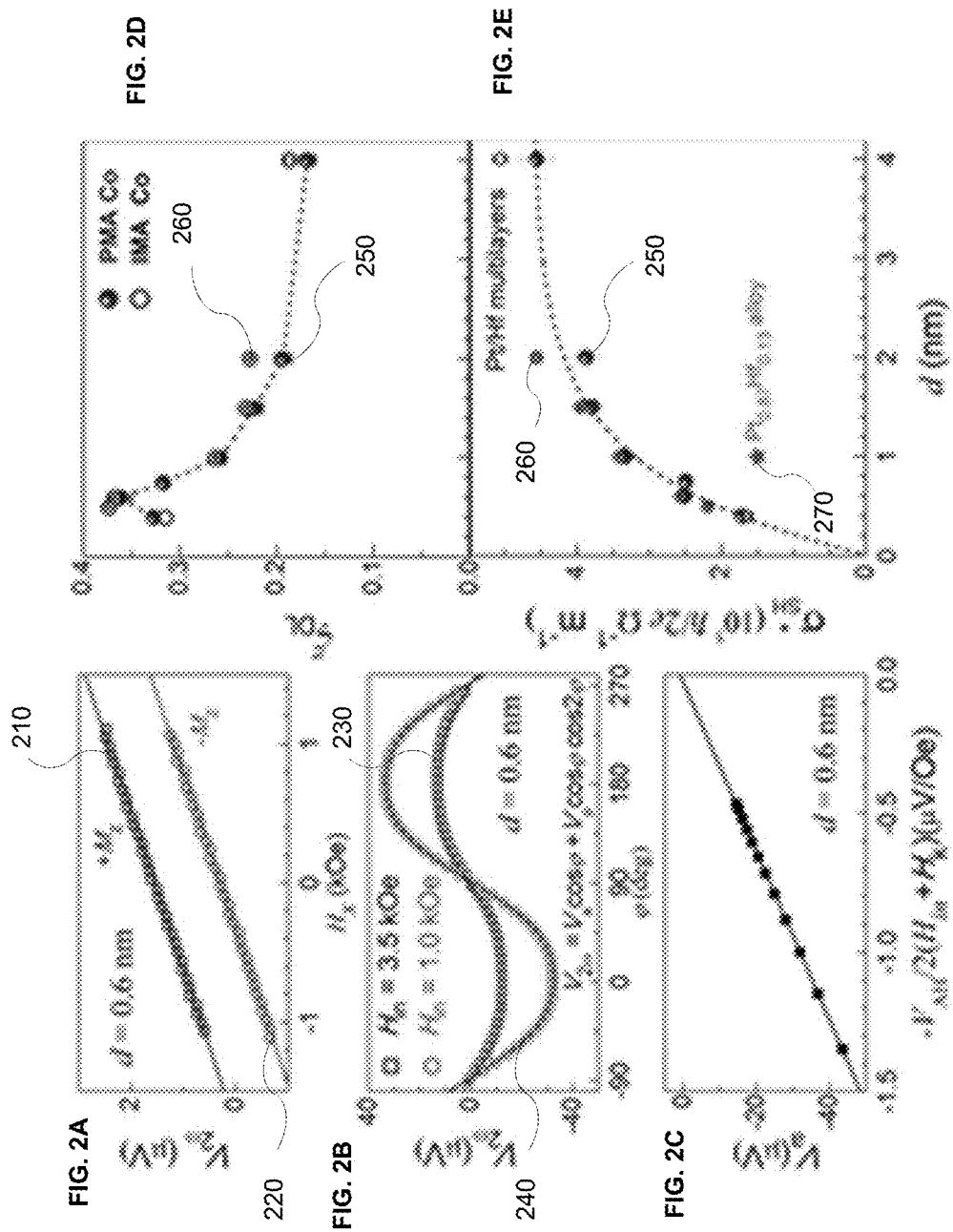

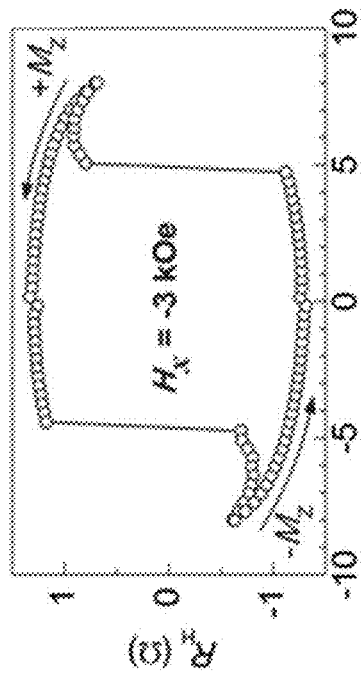
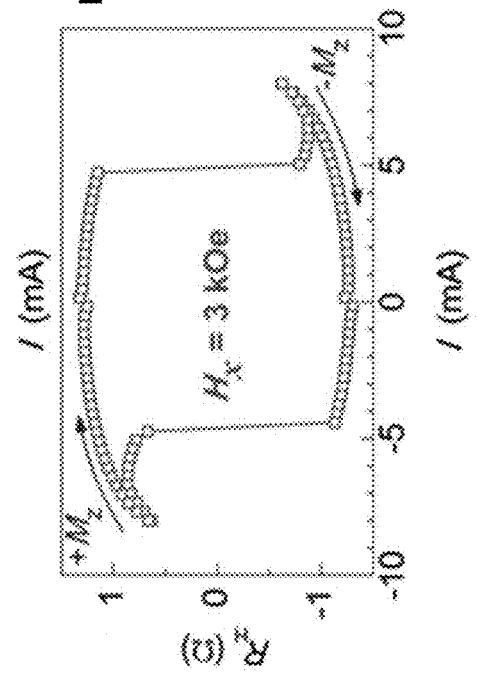
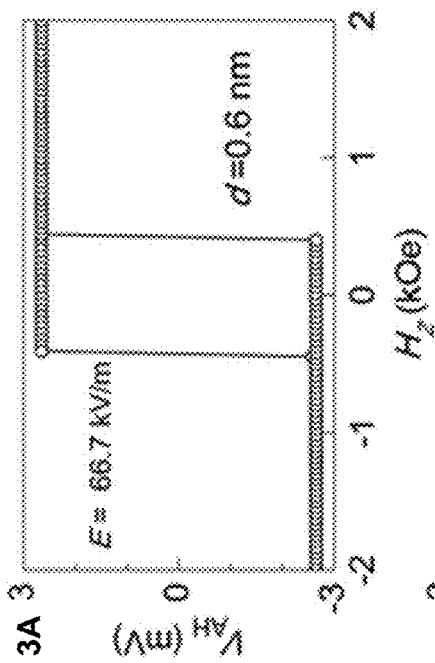
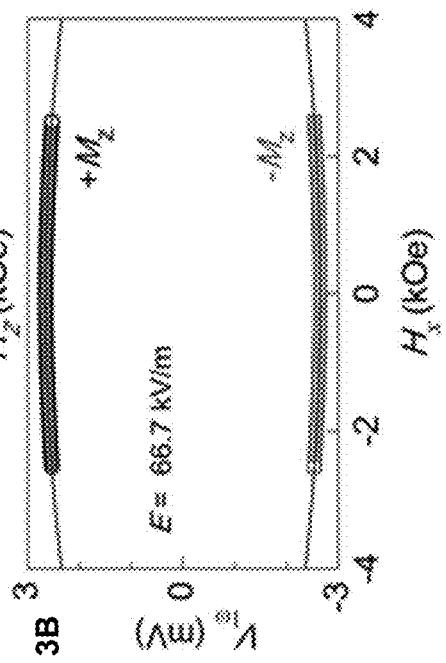

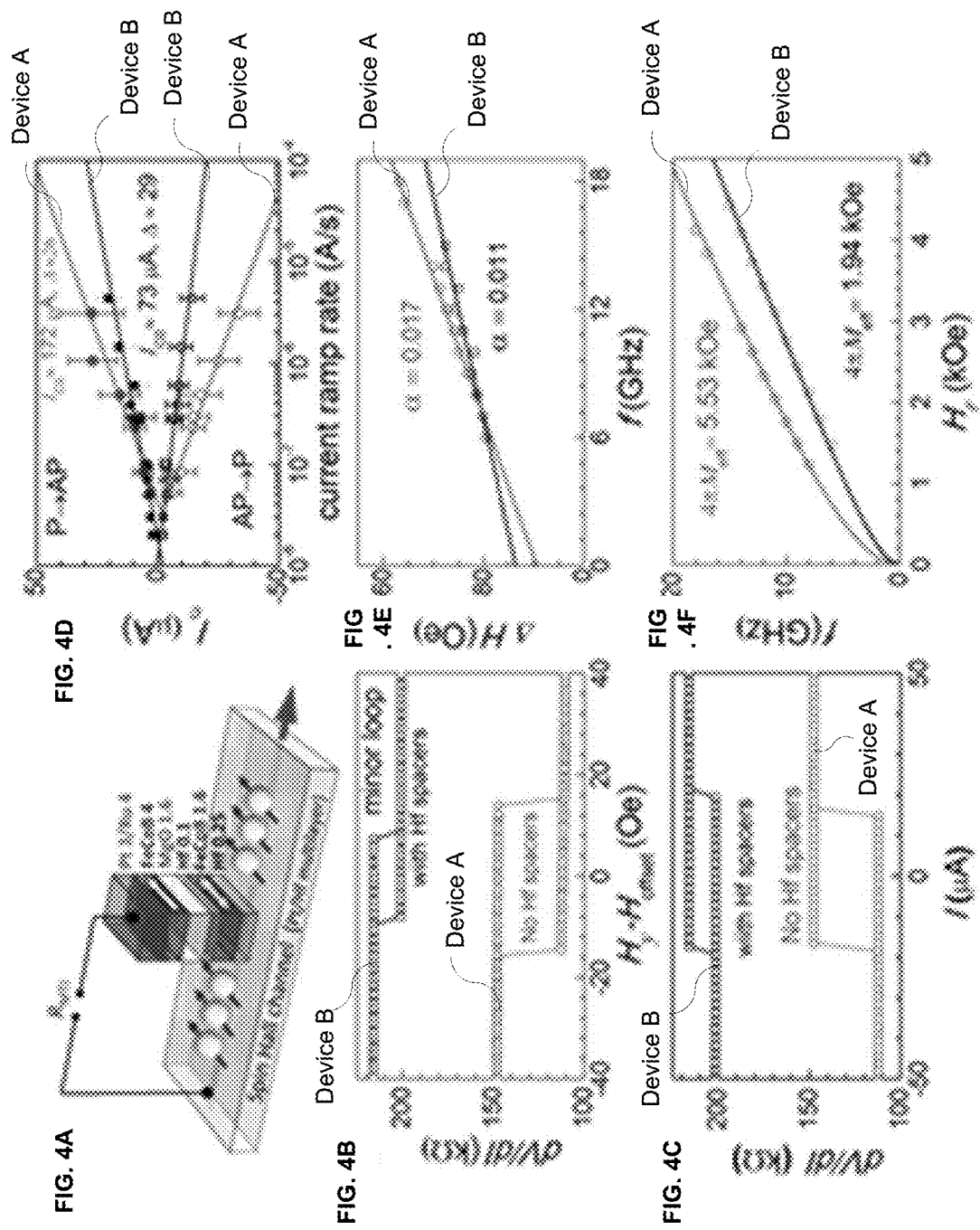

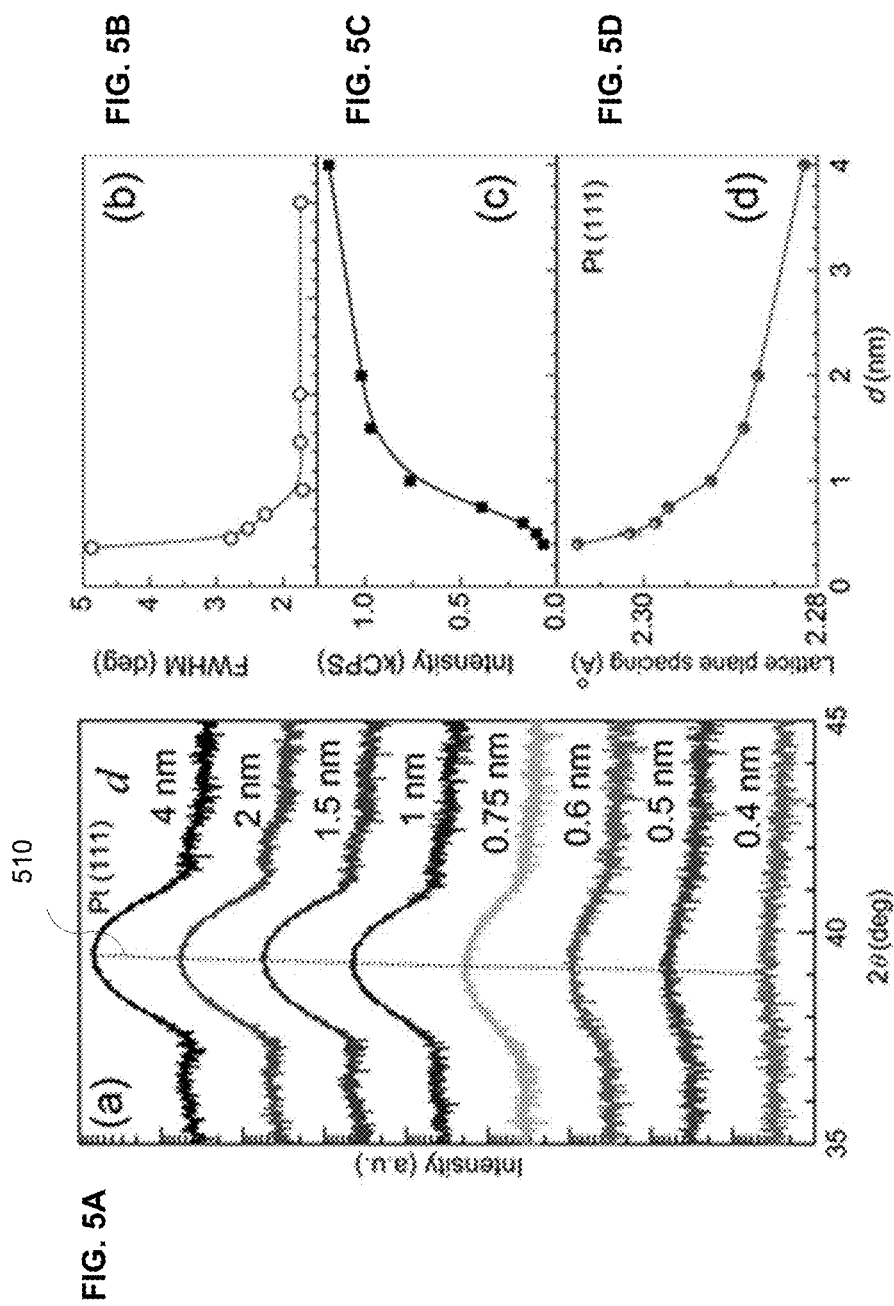

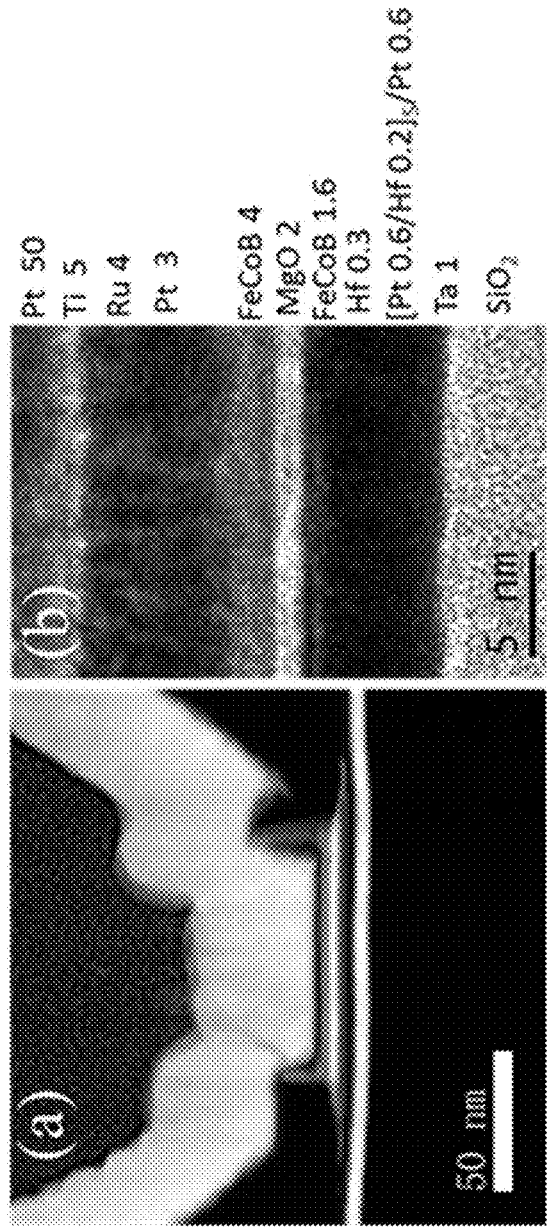
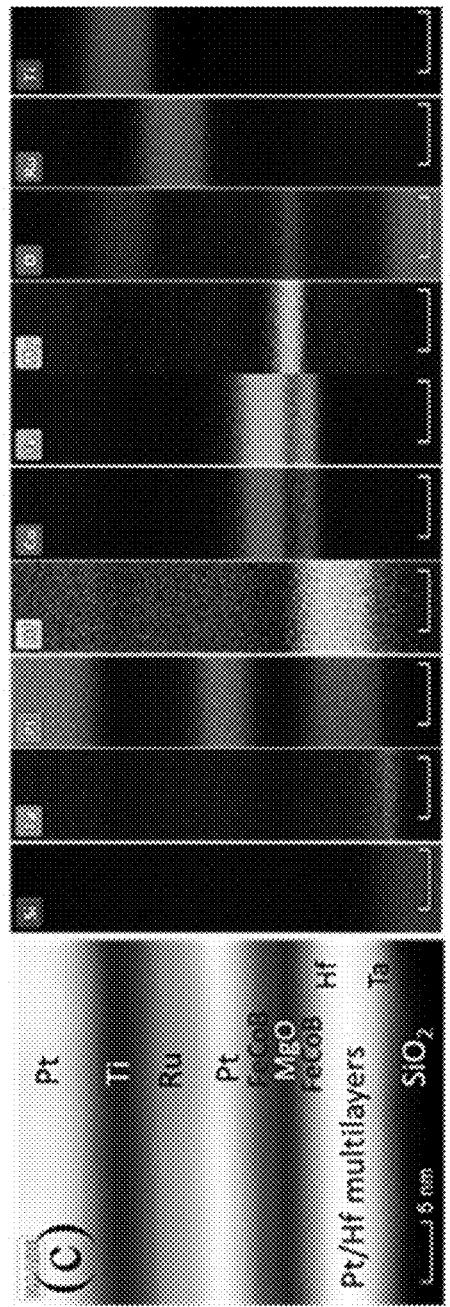
FIG. 7A
FIG. 7B
FIG. 7C

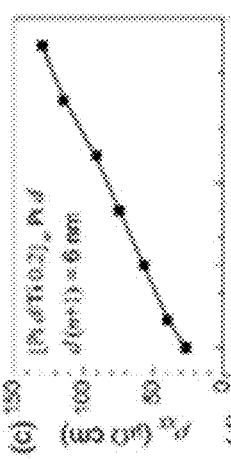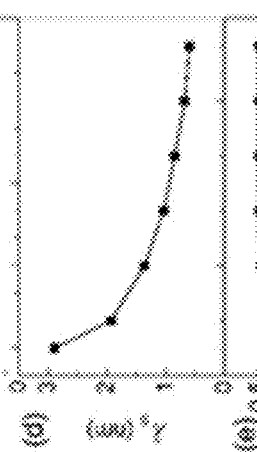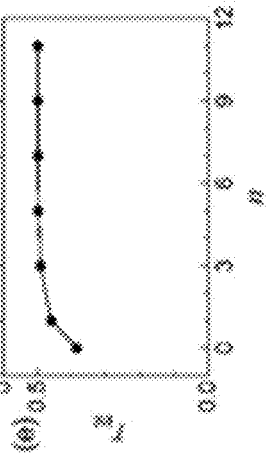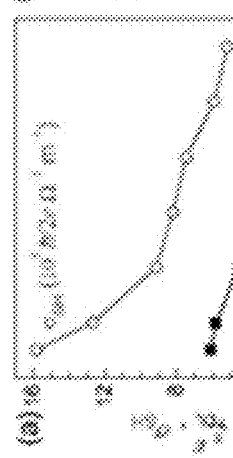
FIG. 11A  FIG. 11B  FIG. 11C  FIG. 11D  FIG. 11E

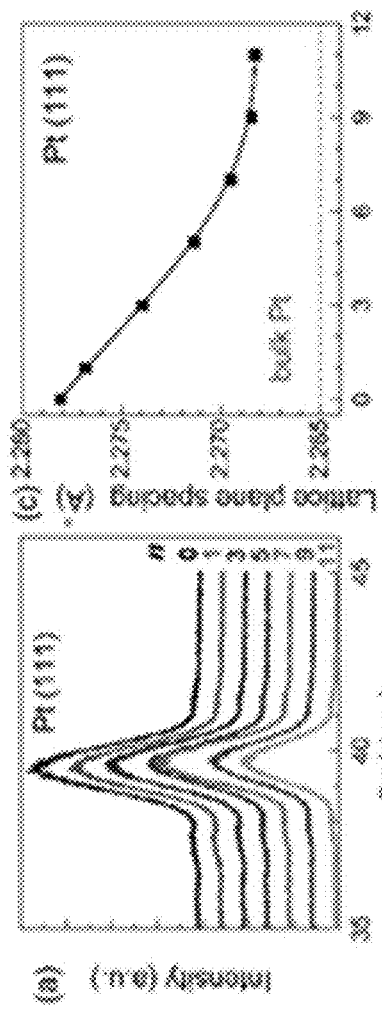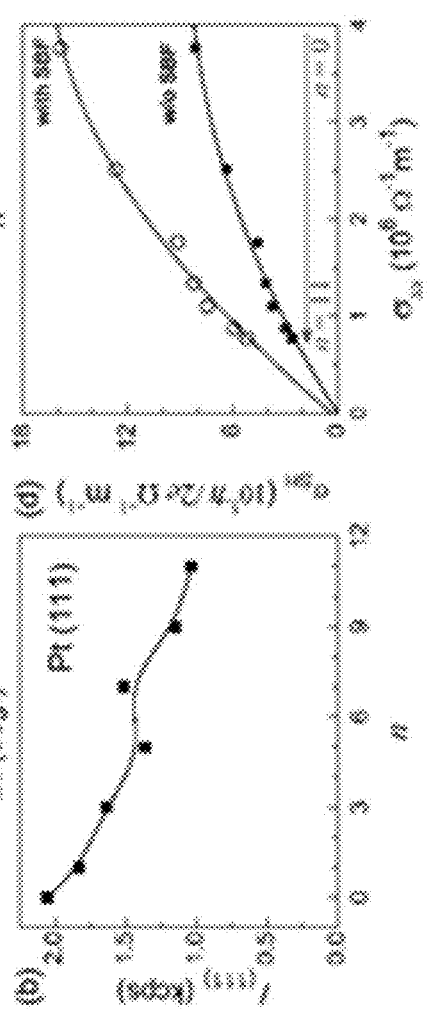
FIG. 12A  FIG. 12B  FIG. 12C  FIG. 12D

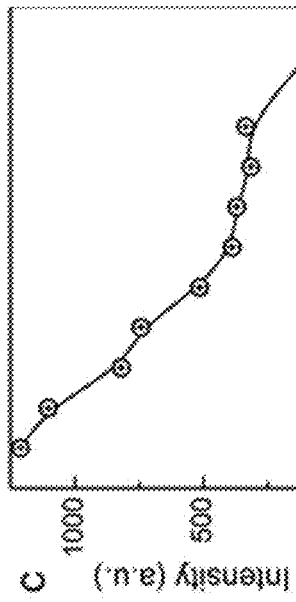
FIG. 22A
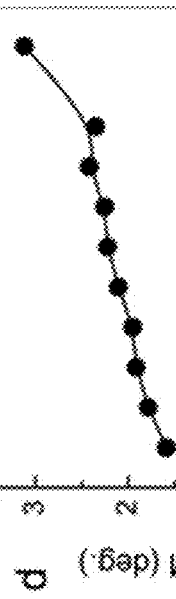
FIG. 22C
FIG. 22D
FIG. 22E
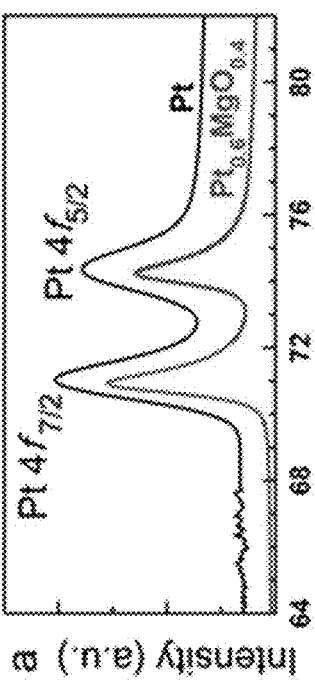
FIG. 22B
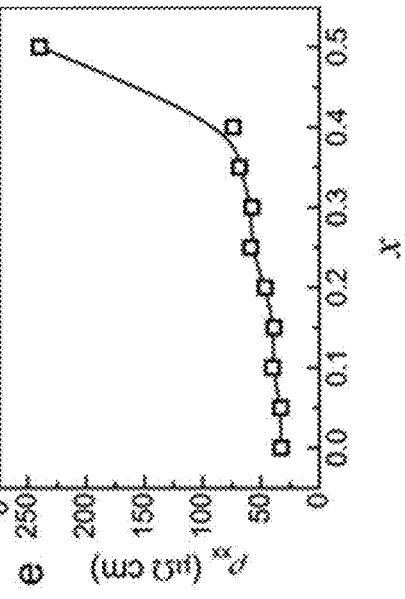

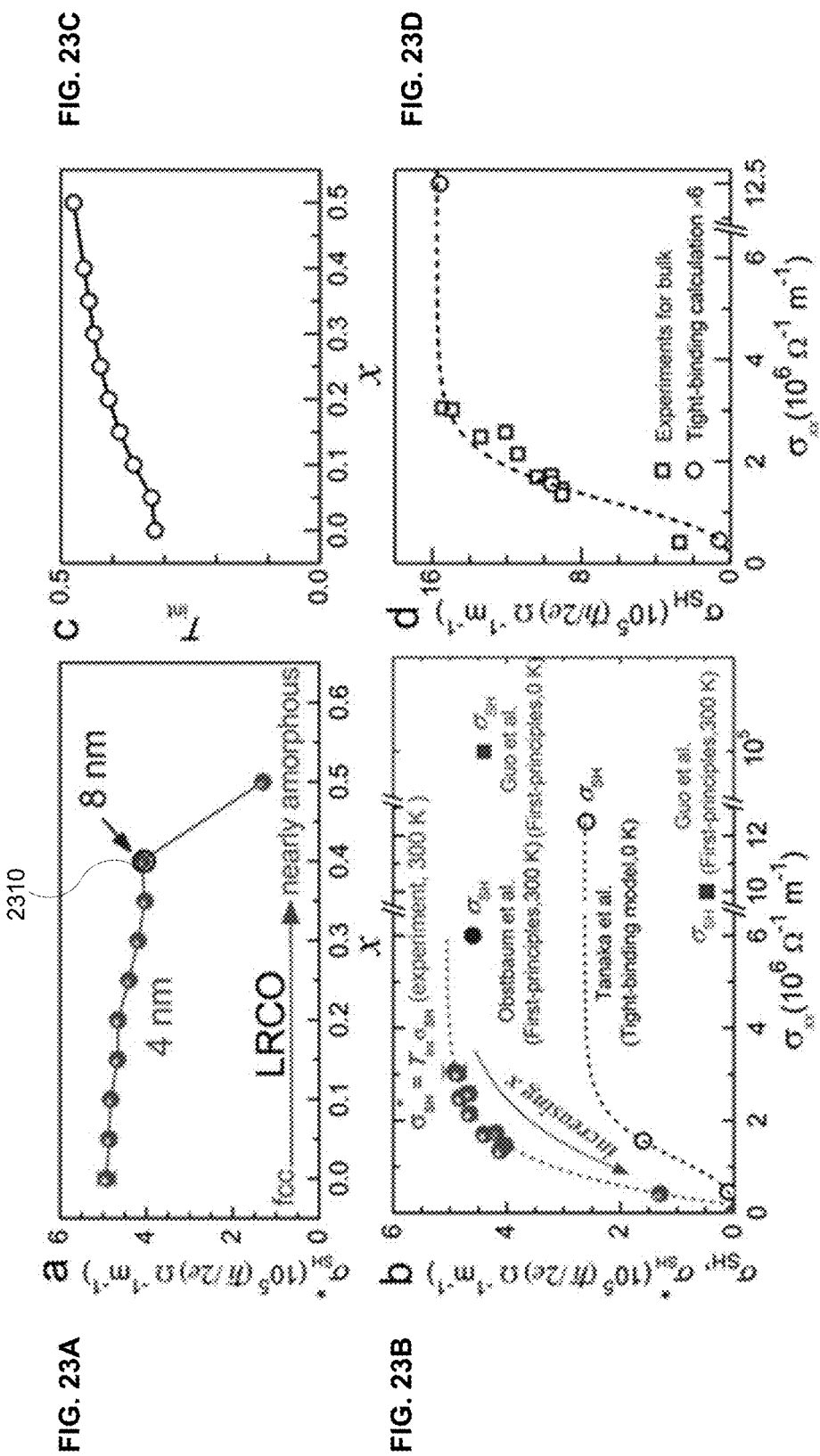

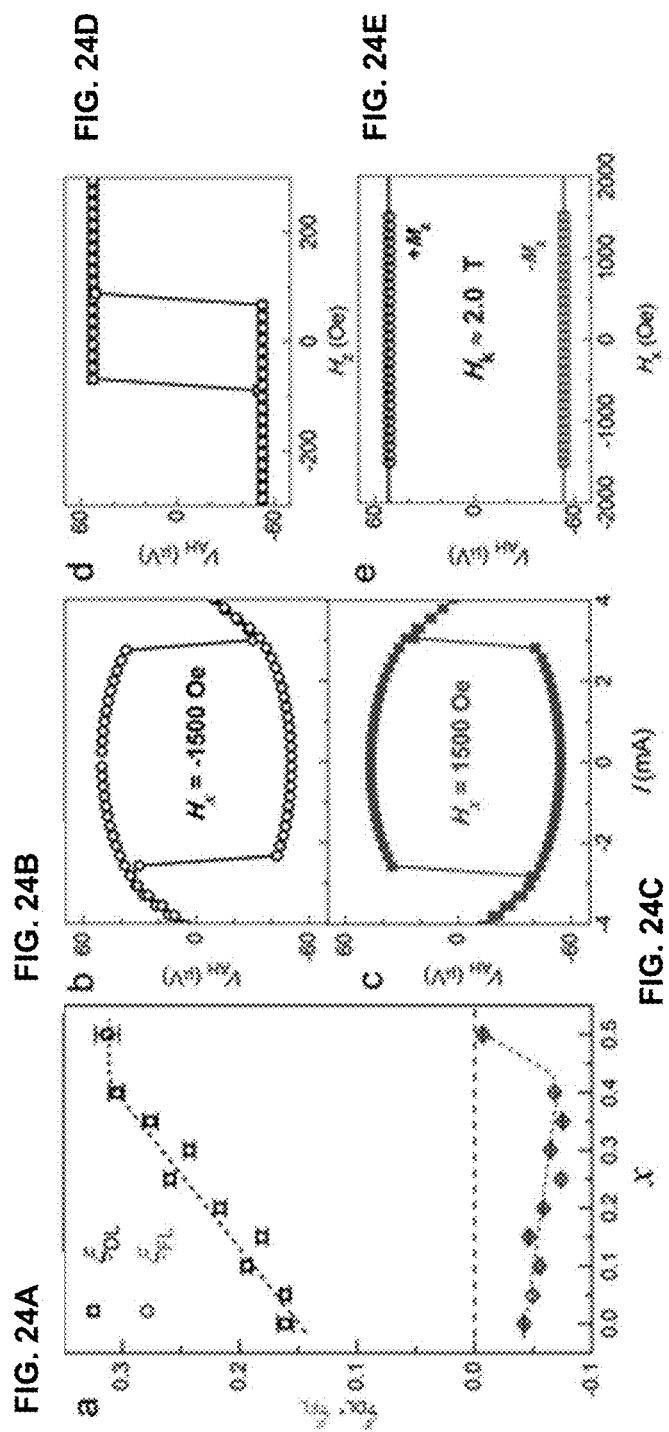

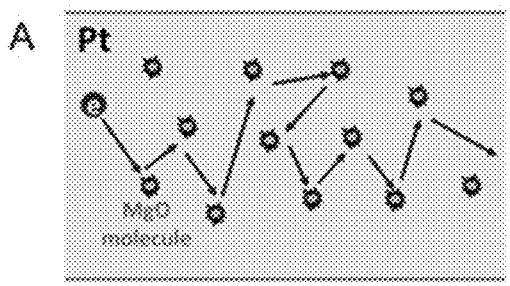
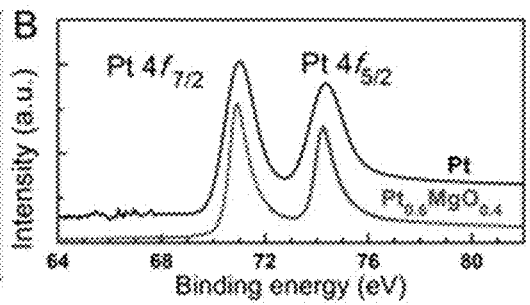
FIG. 25A  FIG. 25B
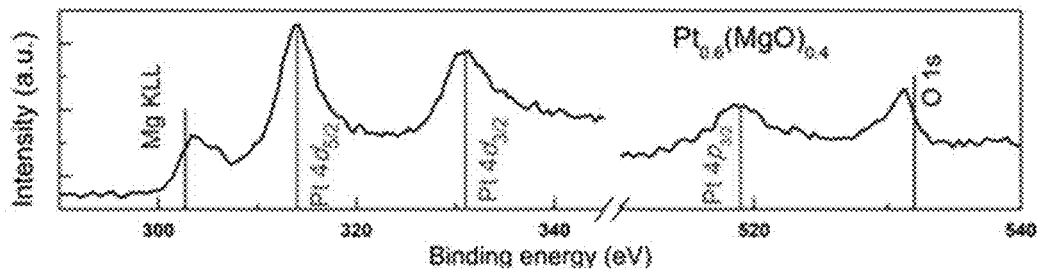
FIG. 25C
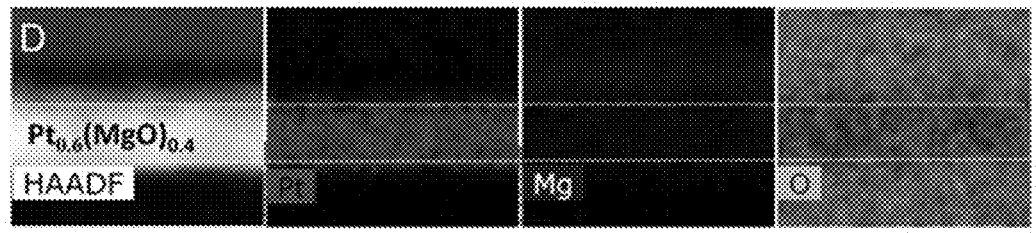
FIG. 25D
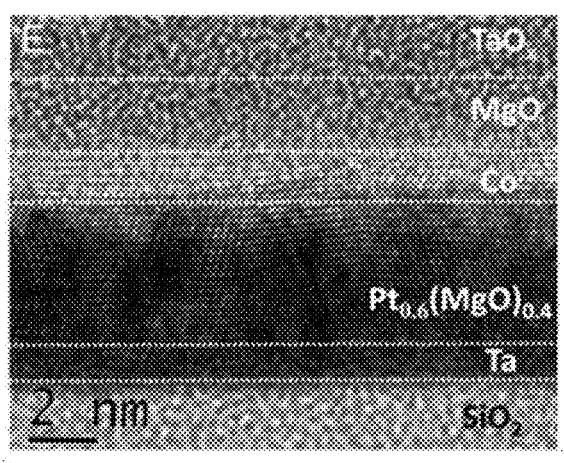
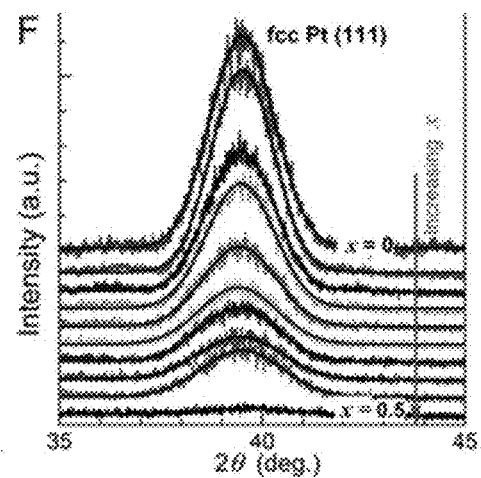
FIG. 25E  FIG. 25F

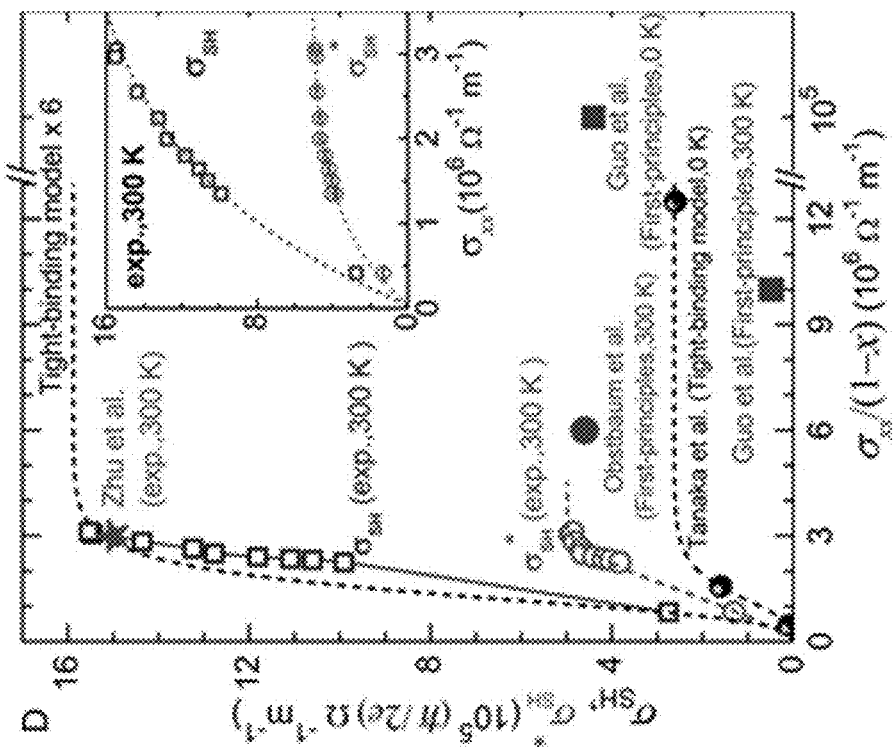
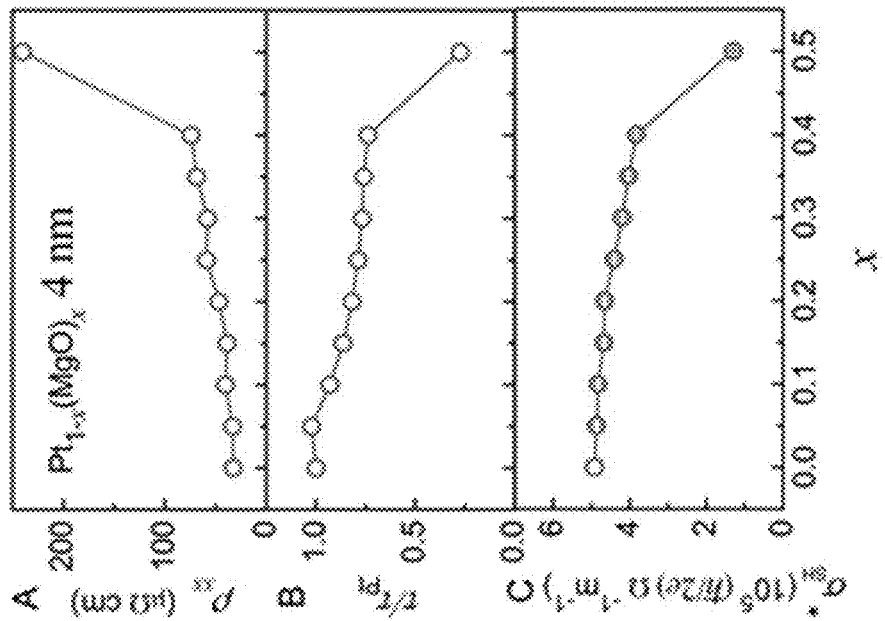
FIG. 26A
FIG. 26B
FIG. 26C
FIG. 26D

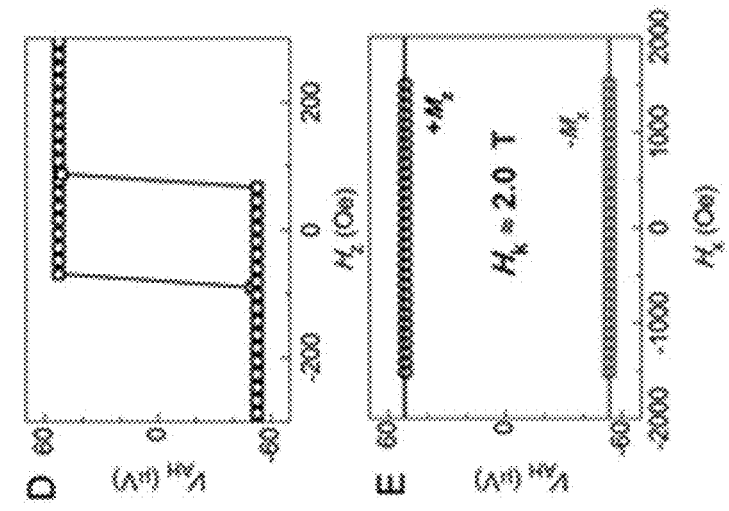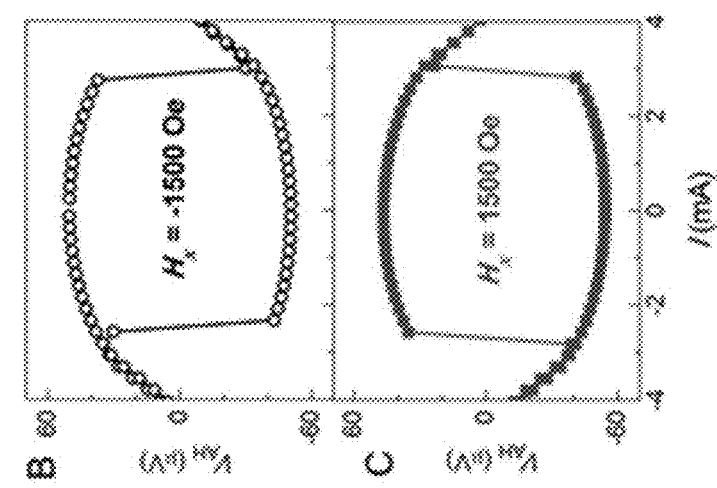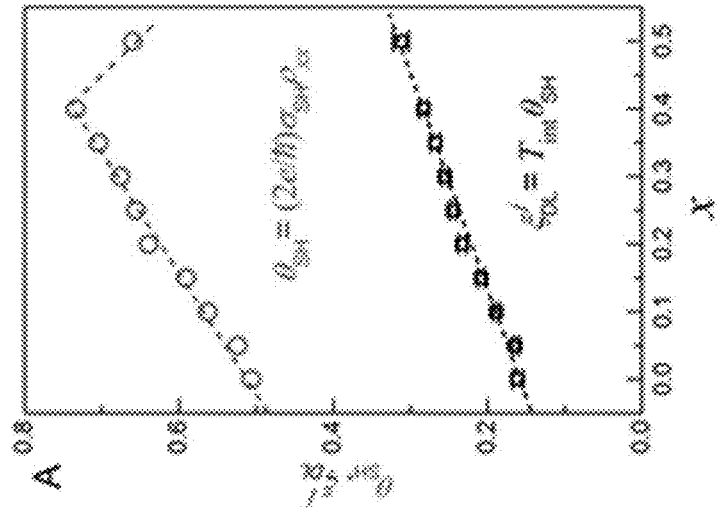
FIG. 27A FIG. 27B FIG. 27C FIG. 27D FIG. 27E

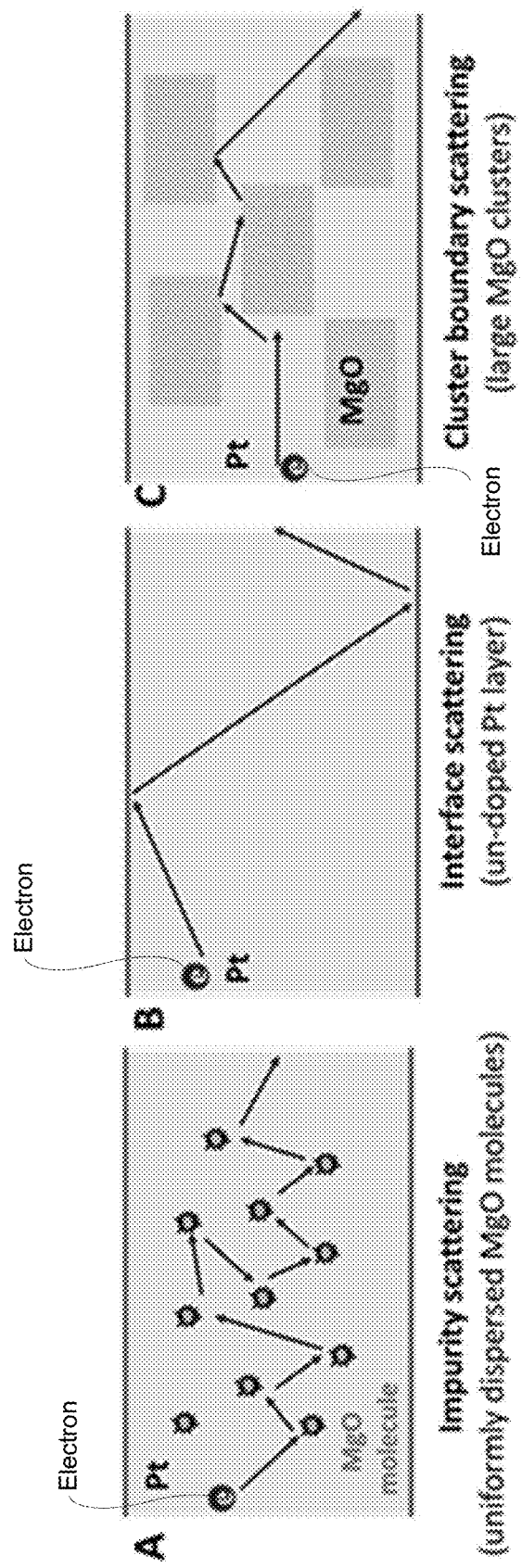

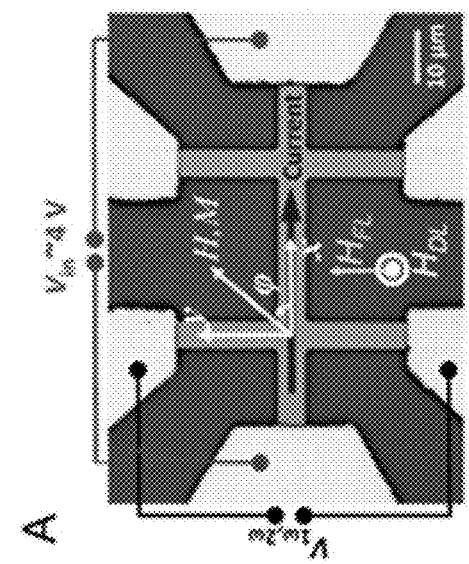
FIG. 31A
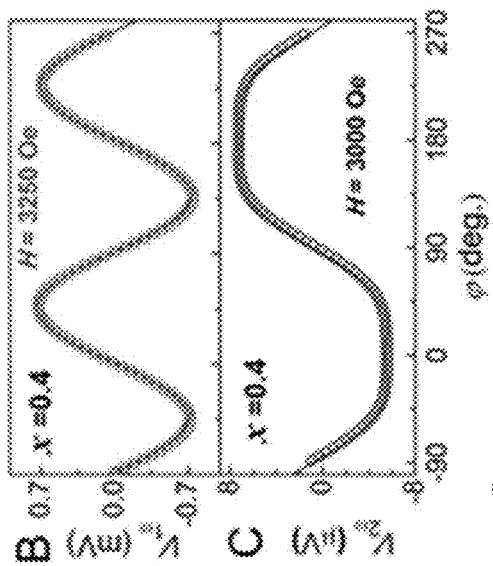
FIG. 31B
FIG. 31C
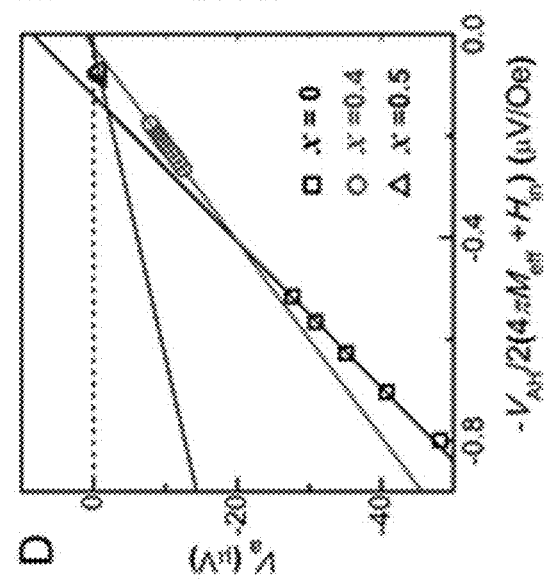
FIG. 31D
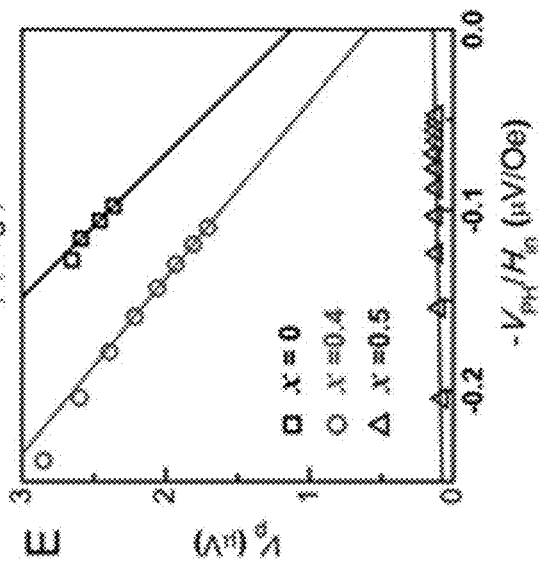
FIG. 31E

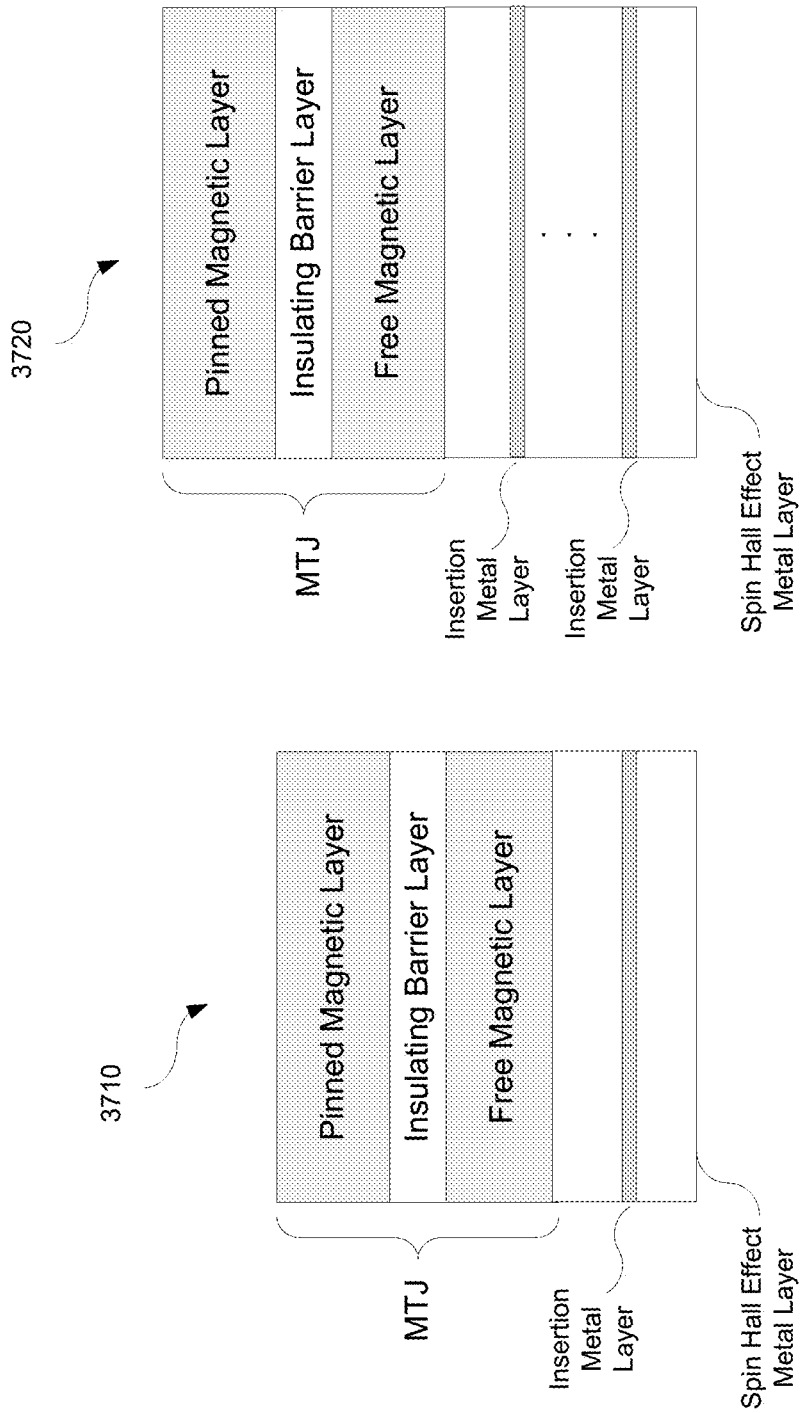

GIANT ENHANCEMENT OF SPIN-ORBIT TORQUE BY INTERFACE SCATTERING FROM ULTRA-THIN INSERTION LAYERS

CROSS-REFERENCE TO RELATED APPLICATION(S)

This application timely claims priority to and the benefits of U.S. Provisional Application No. 62/819,419, entitled "GIANT ENHANCEMENT OF SPIN-ORBIT TORQUE BY INTERFACE SCATTERING FROM ULTRA-THIN INSERTION LAYERS" and filed on Mar. 15, 2019, the disclosure of which is hereby incorporated by reference herein in its entirety.

STATEMENT REGARDING FEDERALLY SPONSORED RESEARCH OR DEVELOPMENT

This invention was made with government support by the Office of Naval Research (N00014-15-1-2449), by the NSF MRSEC program (DMR-1719875) through the Cornell Center for Materials Research, by the Office of the Director of National Intelligence (ODNI), Intelligence Advanced Research Projects Activity (IARPA), via contract W911NF-14-C0089 and by the Cornell NanoScale Facility, an NNCI member supported by NSF Grant ECCS-1542081. The government has certain rights in the invention.

TECHNICAL FIELD

This patent document relates to circuits and devices having magnetic materials or structures based on electron spin torque effects and their applications.

BACKGROUND

Electrons and other charged particles process spins as one of their intrinsic particle properties and such a spin is associated with a spin angular momentum. A spin of an electron has two distinctive spin states. Electrons in an electrical current may be unpolarized by having equal probabilities in the two spin states. The electrons in an electrical current are spin polarized by having more electrons in one spin state than electrons in the other spin state. A spin-polarized current can be achieved by manipulating the spin population via various methods, e.g., by passing the current through a magnetic layer having a particular magnetization. In various magnetic microstructures, a spin-polarized current can be directed into a magnetic layer to cause transfer of the angular momenta of the spin-polarized electrons to the magnetic layer and this transfer can lead to exertion of a spin-transfer torque (STT) on the local magnetic moments in the magnetic layer and precession of the magnetic moments in the magnetic layer. Under a proper condition, this spin-transfer torque can cause a flip or switch of the direction of the magnetization of the magnetic layer.

SUMMARY

The technology for enhancing the spin Hall effect (SHE) disclosed in this patent document relates to enhancing spin currents for spin-orbit torque excitation, switching and displacement of nanoscale magnetism for memory, logic and electronic communications applications.

In some embodiments of the disclosed technology, a magnetic device includes a magnetic tunneling junction (MTJ) that includes (1) a pinned magnetic layer having a fixed magnetization direction, (2) a free magnetic layer having a changeable magnetization direction, and (3) a non-magnetic junction layer between the magnetic free layer and the pinned magnetic layer and formed of an insulator material sufficiently thin to allow tunneling of electrons between the magnetic free layer and the pinned magnetic layer, and a spin Hall effect metal layer including a metal exhibiting a large spin Hall effect (SHE) to react to a charge current directed into the spin Hall effect metal layer to produce a spin-polarized current that is perpendicular to the charge current, and the spin Hall effect metal layer being parallel to and adjacent to the free magnetic layer to direct the spin-polarized current generated in the spin Hall effect metal layer into the free magnetic layer. The spin Hall effect metal layer includes one or more insertion metal layers to interface with the MTJ to introduce interfacial scattering of electrons.

In some embodiments of the disclosed technology, a magnetic device includes a magnetic tunneling junction (MTJ) that includes (1) a pinned magnetic layer having a fixed magnetization direction, (2) a free magnetic layer having a changeable magnetization direction, and (3) a non-magnetic junction layer between the free magnetic layer and the pinned magnetic layer and formed of an insulator material sufficiently thin to allow tunneling of electrons between the free magnetic layer and the pinned magnetic layer, and a spin Hall effect metal layer including a metal exhibiting a large spin Hall effect to react to a charge current directed into the spin Hall effect metal layer to produce a spin-polarized current that is perpendicular to the charge current, and the spin Hall effect metal layer being parallel to and adjacent to the free magnetic layer to direct the spin-polarized current generated in the spin Hall effect metal layer into the free magnetic layer, wherein the spin Hall effect metal layer includes one or more insertion metal layers operable to introduce interfacial scattering of electrons flowing in the spin Hall metal layer to increase the spin current that interacts with and changes the magnetization of the free magnetic layer of the MTJ. Here, the one or more insertion metal layers include at least one of Hf layer or Ti layer, or some other metallic element or compound that enhances the resistivity of the spin Hall effect metal layer by interfacial scattering.

In some embodiments of the disclosed technology, a magnetic device includes a magnetic spin-orbit torque structure including multi-layer stack of layers structured to include a magnetic layer to exhibit a spin-orbit torque, a spin Hall metal layer coupled to the magnetic layer to produce a charge current in the spin Hall metal layer, and a scattering enhancement layer arranged in the spin Hall metal layer to induce interfacial scattering of electrons within the spin Hall metal layer. The scattering enhancement layer includes at least one of Hf layer or Ti layer, or any other metallic layer that enhances the scattering of electrons in the spin Hall effect metal layer.

BRIEF DESCRIPTION OF THE DRAWINGS

FIG. 1A shows schematic depiction of interfacial scattering enhancement of resistivity of a metal exhibiting the spin Hall effect (SHE), FIG. 1B shows measured resistivity of [Pt d/Hf $0.2]_n$/Pt d multilayers as a function of the "slice" thickness d of the individual Pt layers, and FIG. 1C shows geometry and coordinates for the SOT measurements.

FIG. 2A shows in-plane field ($H_x$) dependence of the second harmonic voltages ($V_{2\omega}$) for the PMA stack. FIG. 2B shows in-plane angle ($\varphi$) dependence of $V_{2\omega}$ for the IMA stack. FIG. 2C shows $V_a$ versus $-V_{AH}/2(H_{in}+H_k)$. FIG. 2D shows the damping-like spin-torque efficiency ($\xi_{DL}$) and FIG. 2E shows the apparent spin Hall conductivity ($\sigma^*_{SH}$) determined from harmonic-response measurements for both PMA and IMA samples.

FIG. 3A shows anomalous Hall voltage ($V_{AH}$) hysteresis curve showing abrupt field switching as a function of an applied perpendicular magnetic field. FIG. 3B shows $V_{1\omega}$ as a function of $H_x$ for initial magnetization states $\pm M_z$. FIGS. 3C-3D show Hall resistance (RH) hysteresis as a function of direct current (I).

FIG. 4A shows schematic of the 3-terminal MRAM device, FIG. 4B shows minor loop for switching by an in-plane applied magnetic field, FIG. 4C shows direct current switching loop, FIG. 4D shows critical current for P→AP (solid) and AP→P (open) switching as a function of current ramp rate, FIG. 4E shows FMR linewidth ΔH as a function of the resonance frequency f, and FIG. 4F shows FMR resonance field Hr for the 1.6 nm FeCoB magnetic free layers for Device A and Device B.

FIGS. 5A-5D show gradual degradation of the crystalline ordering in Pt due to the insertion of ultra-thin Hf layers. FIG. 5A shows Pt (111) x-ray diffraction peaks for the multilayers Si/SiO$_2$/Ta 1/[Pt d/Hf 0.2]$_n$/Pt 0.6/Co 1.4/MgO 2/Ta 1.5 with different individual Pt layer thicknesses d but similar total Pt thicknesses. FIG. 5B shows the full width at the half maximum (FWHM) and FIG. 5C shows the integrated intensity the Pt (111) peak, and FIG. 5D shows the spacing of Pt (111) lattice planes.

FIGS. 7A-7C show cross-sectional STEM and EDS imaging of a MRAM device.

FIG. 11A shows the dampinglike spin-torque efficiency per applied electric field $\xi_L$ and the spin Hall conductivity $\sigma_{SH}$, FIG. 11B shows the dampinglike spin-torque efficiency per unit bias current density $\xi_{DL}^j$ and the bulk spin Hall ratio $\theta_{SH}$, FIG. 11C shows the averaged resistivity $\rho_{xx}$, FIG. 11D shows the spin diffusion length $\lambda_s$, and FIG. 11E shows the spin transparency $T_{int}$ for Pt/Ti multilayers with different n.

FIG. 12A shows X-ray diffraction θ-2θ patterns, FIG. 12B shows the integrated intensity of Pt (111) peak $I_{(111)}$, FIG. 12C shows lattice plane spacing of Pt (111), and FIG. 12D shows scaling of spin Hall conductivity with electrical conductivity for Pt/Ti multilayers with different n.

FIG. 22A shows XPS spectrum for Pt 4f peaks in a Pt$_{0.6}$(MgO)$_{0.4}$ layer (black line) and a pure Pt layer (red line), indicating non-oxidization of Pt in both cases, FIG. 22B shows XRD θ-2θ patterns for Pt$_{1-x}$(MgO)$_x$/Co bilayers with different x, indicating the tuning of the LRCO of Pt (within each crystal grain) from fcc to be almost amorphous with increasing MgO incorporation (Insert: Carton schematically illustrating the effect of the interstitial MgO in degrading the LRCO of Pt). FIGS. 22C-22E show integrated intensity of the Pt (111) peak, FWHM of the Pt (111) peak, and the average resistivity of the Pt$_{1-x}$(MgO)$_x$ layer plotted as a function of Pt concentration x.

FIG. 23A shows the experimental values of the apparent spin Hall conductivity (SHC) ($\sigma^*_{SH}$) plotted as a function of MgO concentration (x) of the Pt$_{1-x}$(MgO)$_x$ layers. FIG. 23B shows comparison of $\sigma^*_{SH}$ and theoretical values for the intrinsic SHC ($\sigma_{SH}$) of Pt as a function of electrical conductivity ($\sigma_{xx}$). FIG. 23C shows the calculated spin transparency $T_{int}$ from spin backflow model. FIG. 23D shows scaling of the experimental SHC ($\sigma_{SH}=\sigma_{SH}/T_{int}$) and the theoretical values for intrinsic $\sigma_{SH}$ of Pt with $\sigma_{xx}$.

FIG. 24A shows $\xi_{DL(FL)}$, FIG. 24B $V_{AH}$ versus I ($H_x$=−1500 Oe), FIG. 24C $V_{AH}$ versus I ($H_x$=1500 Oe), FIG. 24D $V_{AH}$ versus Hz, and FIG. 24E $V_{AH}$ versus $H_x$, respectively.

FIG. 25A shows schematic of enhanced impurity scattering in Pt by finely dispersed MgO molecules. FIG. 25B shows XPS spectrum for Pt 4f peaks in a Pt$_{0.6}$(MgO)$_{0.4}$ layer and a pure Pt layer, indicating non-oxidization of Pt in both cases. FIG. 25C shows XPS spectrum for Pt 4d and 4p peaks, Mg KLL peak, and O 1 s. FIG. 25D shows cross-sectional HAADF image and EDS mapping of Pt, Mg, and O, showing no indication of Pt or MgO clusters. FIG. 25E shows cross-sectional high-resolution TEM image (bright field) of a magnetic stack of Ta 1/Pt$_{0.6}$(MgO)$_{0.4}$ 4/Co 1.4/MgO 2/TaO$_x$ 1.5. FIG. 25F shows XRD θ-2θ patterns for Pt$_{1-x}$(MgO)$_x$/Co bilayers with different x.

FIGS. 26A-26C show the experimental values of (A) the average resistivity, (B) carrier lifetime, (C) the apparent SHC ($\sigma_{SH}$) for $Pt_{1-x}(MgO)_x$ 4 nm/Co bilayers plotted as a function of MgO concentration (x) of the $Pt_{1-x}(MgO)_x$ layers. FIG. 26D shows experimental and theoretical values for the (apparent) spin Hall conductivity of Pt plotted as a function of $\sigma_{xx}/(1-x)$.

FIG. 27A shows the MgO-concentration dependence of $\theta_{SH}$ and $\xi_{DL}^j$ for the $Pt_{1-x}(MgO)_x$ 4/Co 1.4 bilayers. FIG. 27B shows $V_{AH}$ versus I ($H_x$=−1500 Oe), FIG. 27C shows $V_{AH}$ versus I ($H_x$=1500 Oe), FIG. 27D shows $V_{AH}$ versus Hz, and FIG. 27E shows $V_{AH}$ versus $H_x$ for a $Pt_{0.7}(MgO)_{0.3}$ 4/Co 0.68 bilayers.

FIG. 29A shows scattering by finely dispersed MgO molecules in an uniform single layer of $Pt_x(MgO)_{1-x}$. FIG. 29B shows interface scattering in a Pt single layer. FIG. 29C shows cluster boundary scattering from large MgO clusters embedded in Pt bulk.

FIG. 31A shows optical microscopy image of Hall bar devices. The effective spin-orbit-torque fields, $H_{DL}$ and $H_{FL}$, are oriented along the z and y directions, respectively. FIG. 31B shows φ dependence of $V_{1\omega}$ (x=0.4), FIG. 31C shows φ dependence of $V_{2\omega}$ (x=0.4), FIG. 31D shows $V_a$ versus $-V_{AH}/2(H_{in}+H_k)$, and FIG. 31E shows $V_p$ versus $-V_{PH}/H_{in}$ for $Pt_{1-x}(MgO)_x/Co$ bilayers with different x.

FIG. 37A-37B show examples of a magnetic device implemented based on some embodiments of the disclosed technology.

DETAILED DESCRIPTION

Figures 6A, 6B:
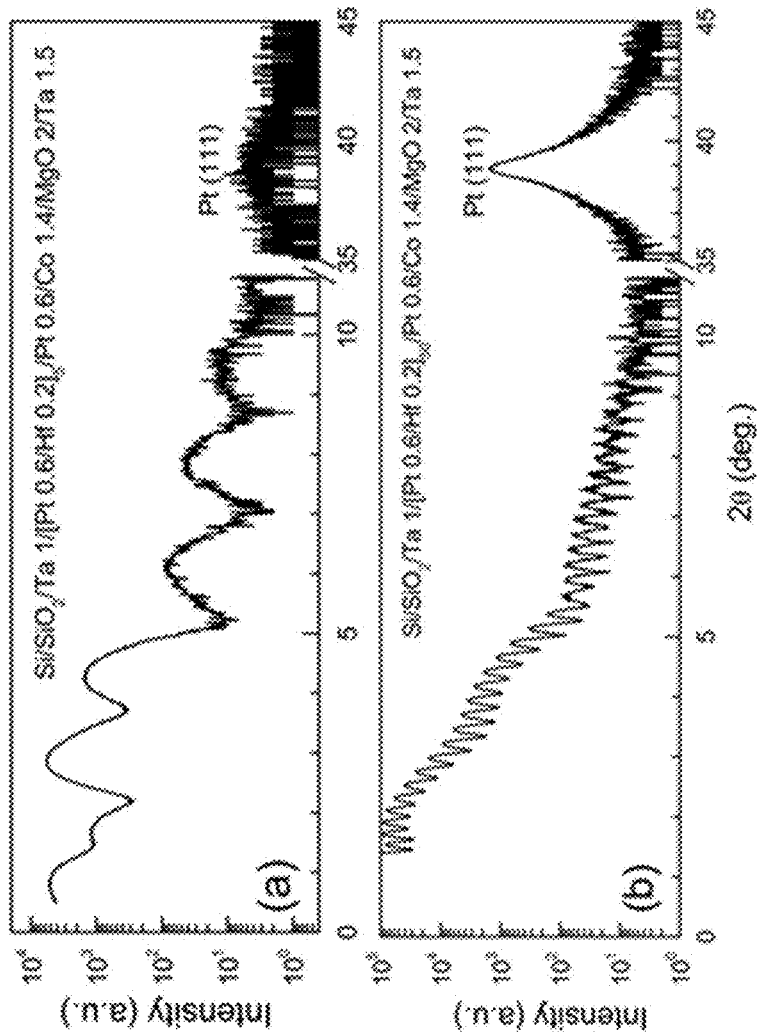
FIGS. 6A-6B show X-ray diffraction (35°-45°) and reflectivity (0.5°-11°) patterns.

The techniques and devices disclosed in this document provide magnetic circuits and devices based on the spin-transfer torque (STT) effect via injection of spin-polarized electrons or charged particles by using a charge current in a spin Hall effect (SHE) metal layer coupled to a magnetic free layer for various applications, including non-volatile memory functions, logic functions and others. The spin Hall effect metal layer can be located adjacent to the free magnetic layer or in direct contact with the magnetic free layer. The charge current is applied to the spin Hall effect metal layer via first and second electrical terminals at two different locations of the spin Hall effect metal layer to generate a spin-polarized current via a spin Hall effect to enter the magnetic free layer. The injected spin-polarized current in the magnetic free layer can cause the magnetization direction of the magnetic free layer to change based on the spin-transfer torque (STT) effect. This SHE-based STT effect can have a higher transfer efficiency and can produce a strong spin-transfer torque in the magnetic free layer. As such, a lower charge current can be used in SHE-based STT designs to achieve the same STT effect which requires a higher driving current in the STT process using a fixed or pinned ferromagnetic layer as a spin polarization layer without a (SHE) metal layer.

Increasing the efficiencies of spin current and spin torque (SOT) generation by the spin Hall effect (SHE) is technologically urgent for advancing spin-torque magnetic memory, logic, and oscillator applications. The examples in this document demonstrate that enhancing interface electron scattering by inserting ultra-thin layers of Hf within the heavy metal Pt can significantly increase the dampinglike SOT efficiency. In some specific sample structures we investigated, the dampinglike SOT efficiency was found to increase from ~0.17 for pure Pt to as large as ~0.37 in a [Pt 0.6 nm/Hf 0.2 nm]5/[Pt 0.6] multilayer by harmonic response measurements on both perpendicular and in-plane magnetic anisotropy magnetic layers. We also confirmed the enhanced dampinglike SOT efficiency by direct measurements of anti-damping spin-orbit-torque switching of in-plane magnetic tunnel junctions. With the magnified SOT efficiency, we demonstrate deterministic magnetic memory devices with critical switching current as low as ~73 μA (switching current density≈3.6×10⁶ A/cm²) in the absence of thermal fluctuations. The disclosed technology demonstrates an effective strategy for maximizing the SOTs generated by SHE metals to benefit the development of low-power spin-torque devices.

Spin-orbit torques (SOTs) generated by the bulk spin Hall effect (SHE) can efficiently switch thin-film nanomagnet devices, excite magnetization oscillations, and drive skyrmion and chiral domain wall displacement. Increasing the efficiency of spin current and SOT generation is of great importance for advancing technological applications of SOTs. Of particular interest in this effort are spin Hall heavy metals (HMs) that can simultaneously provide a large damping-like SOT efficiency per current density ($\xi_{DL}$), easy growth, good chemical/thermal stability, and the capability to be readily integrated into complex experimental configurations and/or into manufacturing processes. A good representative of such spin Hall metals is Pt, which has large values of spin Hall conductivity ($\sigma_{SH}$) and $\xi_{DL}$, arising from the intrinsic Berry curvature of its band structure. The value of $\xi_{DL}$ in sputtered Pt/ferromagnet (FM) systems is 0.1~0.2. Increasing the resistivity ($\rho_{xx}$) of Pt can increase $\xi_{DL}$ in Pt/FM systems provided that $\sigma_{SH}$ is not degraded in the process. This is because for the SHE $\xi_{DL}=T_{int}(2e/\hbar)\sigma_{SH}\rho_{xx}$ with e, $\hbar$, and $T_{int}$ being the elementary charge, the reduced Planck constant, and the spin transparency at the HM/FM interface. Recently, increasing $\rho_{xx}$ by alloying Pt with another fcc metal at optimized compositions or doping Pt with certain impurities has been demonstrated to increase $\xi_{DL}$. However, in all the previous work the increase of $\xi_{DL}$ was limited (e.g., to $\xi_{DL}$=0.15-0.3 for 4 nm Pt alloys) due to a decrease in $\sigma_{SH}$ with doping level or/and only a weak enhancement of $\rho_{xx}$. Exploring new enhancement strategies that can better optimize the trade-offs between $\rho_{xx}$ and $T_{int}\sigma_{SH}$ is of both fundamental interest and technological urgency (e.g., for low-power magnetic memories, logic, and oscillators).

The technology disclosed here can be used in various implementations to introduce sub-monolayers of Hf into Pt as an insertion structure to the magnetic structure to introduce strong interfacial electron scattering. This insertion structure can be used to enhance $\rho_{xx}$ for a ~4 nm Pt layer by a factor of 5, and magnify $\xi_{DL}$ from 0.17 to 0.37. The increase in $\xi_{DL}$ is approximately twice as effective as a uniform alloying of Hf into Pt. This giant enhancement of $\xi_{DL}$ by Hf insertion layers is confirmed by the deterministic switching of in-plane magnetic tunnel junctions (MTJs) at a low critical current of ≈73 μA (current density≈3.6×10$^6$ A/cm$^2$) in absence of thermal fluctuations.

FIG. 1A shows schematic depiction of interfacial scattering enhancement of resistivity of a spin Hall metal, and FIG. 1B shows measured resistivity of [Pt d/Hf 0.2]$_n$/Pt d multilayers as a function of the "slice" thickness d of the individual Pt layers, and FIG. 1C shows geometry and coordinates for the SOT measurements.

The multilayer spin-Hall-effect structure implemented based on some embodiments of the disclosed technology can utilize the interfacial scattering enhancement of resistivity of a spin Hall metal by inserting ultra-thin layers of Hf within the heavy metal Pt, as shown in FIG. 1A. In a single metallic layer of Pt, that is not too thin, e.g. 4 nm as typically used for spin-torque MRAM, the resistivity arises mainly from the electron scattering by impurities and thermal phonons inside the Pt layer and is hence relatively low, e.g. 28-50 μΩ cm at room temperature, depending on material growth protocols. In contrast, the same Pt layer is separated into several layers by inserting multiple ultra-thin Hf layers within the Pt during the deposition process, the new Pt/Hf interfaces should introduce strong additional interfacial scattering of electrons and hence greatly enhance the averaged $\rho_{xx}$. The Pt crystal structure between the interfaces can be disrupted less than would be the case for uniform alloying with Hf, thereby better preserving the large intrinsic spin Hall conductivity of Pt and better enhancing $\xi_{DL}$.

In some embodiments of the disclosed technology, the multilayer spin-Hall-effect structure may be implemented by sputter-depositing magnetic stacks of Ta 1.0/[Pt d/Hf 0.2]$_n$/Pt d/Co t/MgO 2.0/Ta 1.5 (numbers are layer thicknesses in nm) with d=0.4, 0.5, 0.6, 0.75, 1, 1.5, 2, and 4 nm, respectively. Here n (≤7) is chosen to be the integer that can make the total Pt thickness closest to 4 nm under the constraint that the total Hf thickness is no more than 1.4 nm (note that the spin diffusion length $\lambda_s$ of the amorphous Hf is ~1 nm). For the perpendicular magnetic anisotropy (PMA) samples, the Co thickness t is 0.83 nm for d≥1 nm and 0.63 nm for d≤0.75 nm; for in-plane magnetic anisotropy (IMA) samples, t is 1.3 nm for d≥1 nm and 0.93 nm for d≤0.75 nm. As shown in FIG. 1B, by fixing the Hf insertion thickness at 0.2 nm the average resistivity of the [Pt d/Hf 0.2]$_n$/Pt d multilayer is increased from 37 μΩ cm for d=4 nm (pure Pt) to 191 μΩ cm for d=0.4 ([Pt 0.4/Hf 0.2]$_7$/Pt 0.4). Compared to that achieved by alloying or impurity doping (~83 μΩ cm for Au$_{0.25}$Pt$_{0.75}$ and ~110 μΩ cm for Pt$_{0.85}$Hf$_{0.15}$), this is a remarkable resistivity enhancement despite the fact that the submonolayer 0.2 nm Hf insertions are too thin to be distinguishable by either x-ray diffraction/reflectivity or scanning tunneling electron microscopy (STEM)/electron dispersive spectroscopy (EDS) measurements.

FIGS. 2A-2E show harmonic response measurements. Specifically, FIG. 2A shows in-plane field (H$_x$) dependence of the second harmonic voltages (V$_{2\omega}$) for the PMA stack [Pt 0.6/Hf 0.2]$_5$/Pt 0.6/Co 0.63. The solid lines 210 and 220 refer to the best linear fits for initial magnetization states ±M$_z$, respectively. FIG. 2B shows in-plane angle (φ) dependence of V$_{2\omega}$ for the IMA stack [Pt 0.6/Hf 0.2]$_5$/Pt 0.6/Co 0.93 under in-plane bias fields of 3.5 kOe (230) and 1.0 kOe (240). The solid lines present the best fits to V$_{2\omega}$=V$_a$ cos φ+V$_p$ cos φ cos 2φ. FIG. 2C shows V$_a$ versus −V$_{AH}$/2(H$_{in}$+H$_k$). The solid line shows the best linear fit. FIG. 2D shows the damping-like spin-torque efficiency ($\xi_{DL}$) and FIG. 2E shows the apparent spin Hall conductivity ($\sigma_{SH}$) determined from harmonic-response measurements for both PMA (250) and IMA (260) samples plotted as a function of d. The dashed lines are guides to the eye. The reference numeral 270 denotes the value of σ*$_{SH}$ for 4 nm of a spatially uniform Pt$_{0.87}$Hf$_{0.13}$ alloy.

The multilayer spin-Hall-effect structure implemented based on some embodiments of the disclosed technology can utilize magnified spin-orbit torque by interfacial scattering. We first determine $\xi_{DL}$ by harmonic response measurements under a sinusoidal electric bias field with a constant magnitude of E=66.7 kV/m (see the measurement geometry and coordinate definitions in FIG. 1C) using FM Co detector layers with PMA (t=0.63 nm) and IMA (t=0.93 nm). Here $\xi_{DL}$=2eμ$_0$M$_s$tH$_{DL}$/hj$_e$, with μ$_0$, M$_s$, H$_{DL}$ and j$_e$=E/ρ$_{xx}$ being the permeability of vacuum, the Co magnetization, the damping-like effective SOT field, and the charge current density, respectively. For PMA samples, $$H_{DL} = -2 \frac{\partial V_{2\omega}}{\partial H_x} \Big/ \frac{\partial^2 V_{1\omega}}{\partial^2 H_x},$$

where the in-phase first and the out-of-phase second harmonic Hall voltages, V$_{1\omega}$ and V$_{2\omega}$, scale linearly and parabolically with the in-plane magnetic field (H$_x$) applied collinear with the electric bias field, within a macrospin model. For IMA samples, H$_{DL}$ can be determined by the angle (φ) dependence of V$_{2\omega}$ on the in-plane bias magnetic field (H$_{in}$), i.e. V$_{2\omega}$=V$_a$ cos φ+V$_p$ cos φ cos 2φ, where V$_a$=−V$_{AH}$H$_{DL}$/2(H$_{in}$+H$_k$)+V$_{ANE}$, and V$_p$=−V$_{PH}$H$_{FL}$/2H$_{in}$, with V$_{AH}$, V$_{ANE}$, V$_{PH}$, H$_k$, and H$_{FL}$ being the anomalous Hall voltage, the anomalous Nerst effect, the planar Hall voltage, the perpendicular anisotropy field, and the field-like effective SOT field. FIGS. 2A-2B show the representative V$_{2\omega}$ data for PMA and IMA multilayers with d=0.6 nm. The good linear H$_x$ dependence of V$_{2\omega}$ for the PMA stack and the dominant cow dependence of V$_{2\omega}$ for the PMA stack indicate a strong damping-like SOT generated by the SHE in the Pt/Hf multilayer. As shown in FIG. 2C, the linear fit of V$_a$ versus −V$_{AH}$/2(H$_{in}$+H$_k$) gives a large H$_{DL}$ of 5.0×10$^{-4}$ Oe m/V (the slope) and a negligible thermal effect (V$_{ANE}$<1 μV from the intercept). FIG. 2D summarizes the values of $\xi_{DL}$ determined from both the PMA and IMA multilayers as a function of d, with good agreement between the two types of measurements. For both the PMA and IMA samples, $\xi_{DL}$ increases quickly from ~0.17±0.01 at d=4 nm (pure Pt) to a peak at d=0.6 nm and then drops slightly as d increases further to 0.4 nm. The peak value of $\xi_{DL}$=0.37±0.01 for d=0.6 nm (i.e., [Pt 0.6/Hf 0.2]$_5$/Pt 0.6 multilayers) is significantly higher than the values reported for Pt$_{0.85}$Hf$_{0.15}$ ($\xi_{DL}$≈0.15), Au$_{0.25}$Pt$_{0.75}$ ($\xi_{DL}$≈0.30), β-W ($\xi_{DL}$≈0.2-0.3) and β-Ta ($\xi_{DL}$≈0.12). We attribute the increase of $\xi_{DL}$ for Pt/Hf multilayers nm to the enhanced resistivity from interface scattering (see FIG. 1C). The giant $\xi_{DL}$ for Pt/Hf multilayers can provide very compelling current and energy efficiencies for spin torque applications, for instance for SOT-driven magnetic random access memories (MRAMs), with a current efficiency superior to any other known material for practical applications.

The interesting peak behavior of $\xi_{DL}$ at d≈0.6 nm can be explained as due to a competition between ρ$_{xx}$ that increases quickly as a function of decreasing d (FIG. 1B) and the apparent spin Hall conductivity, $\sigma^*_{SH}=T_{int}\sigma_{SH}=(h/2e)\xi_{DL}/\rho_{xx}$, that decreases sharply as d decreases from 4 nm to 0.4 nm (FIG. 2D). This decrease in $\sigma^*_{SH}$ should be attributed partly to the enhanced attenuation of spin current in the Hf insertion layers and at the Pt/Hf interfaces. The amorphous Hf has a short $\lambda_s$ of ~1 nm and doesn't contribute to the generation of the spin current due to its negligible SHE. Therefore, in the multilayers with small d where the total Hf thickness reaches >1 nm, there should be a strong attenuation of the spin currents that diffuse to the FM interface from the bottom Pt layers to exert a spin-orbit torque. Each additional Pt/Hf interface could also contribute to spin backflow and spin memory loss that further reduce the spin-orbit torque. In addition, the decrease of $\sigma^*_{SH}$ with d could result in part from a strain-induced degradation of the Pt band structure (from a well-ordered fcc texture to a nearly amorphous structure). Nevertheless, in the Pt/Hf multilayers $\sigma^*_{SH}$ is better preserved compared to that of uniformly doped Pt with Hf impurities. As shown in FIG. 2E. 2e, $\sigma^*_{SH}$ for the 4 nm $Pt_{0.87}Hf_{0.13}$ is $1.5 \times 10^5$ (h/2e)$\Omega^{-1}m^{-1}$, which is a factor of 2 smaller than that of the Pt/Hf multilayers with similar Hf "concentration" (i.e. close to [Pt 1/Hf 0.2]3/Pt 1). This suggests that such HM multilayers with strong interfacial scattering can be generally advantageous over the corresponding impurity doping because in the latter $\sigma_{SH}$ can be degraded more substantially by a stronger disturbance to the Pt band structure. We speculate that an enhancement of $\xi_{DL}$ beyond the value of 0.37 that we obtain here should be possible if the increase of resistivity, the insertion layer attenuation of spin current, and the insertion-induced Pt strain can be better balanced, for instance, by using an insertion material that has a longer $\lambda_s$, and an atomic radius closer to that of Pt (e.g., Ti) to minimize the disruption of the Pt crystal lattice and band structure.

FIGS. 3A-3D show switching of a perpendicular magnetization of [Pt 0.6/Hf 0.2]$_5$/Pt 0.6/Co 0.63 multilayers. Specifically, FIG. 3A shows anomalous Hall voltage ($V_{AH}$) hysteresis curve showing abrupt field switching as a function of an applied perpendicular magnetic field. $V_{AH}$=2.66 mV and $H_c$=0.43 kOe. FIG. 3B shows $V_{1\omega}$ as a function of $H_x$ for initial magnetization states $\pm M_z$. FIGS. 3C-3D show Hall resistance (RH) hysteresis as a function of direct current (I). In FIGS. 3C-3D, magnetic fields of $\pm 3$ kOe were applied along the current direction (x direction), respectively.

The multilayer spin-Hall-effect structure implemented based on some embodiments of the disclosed technology can utilize spin-orbit torque switching of a perpendicular Co layer. Now we show that our optimal Pt/Hf multilayer with strong interfacial scattering, [Pt 0.6/Hf 0.2]$_5$/Pt 0.6, is a particularly compelling spin Hall material for SOT research and technological applications. As a first example, we show the deterministic switching of a PMA Co layer via the domain nucleation and propagation enabled by the giant $\xi_{DL}$ generated by the SHE of the [Pt 0.6/Hf 0.2]$_5$/Pt 0.6 multilayer (FIGS. 3C-3D). The Co layer has a thickness of 0.63 nm, a coercivity (pinning field) of He 0.43 kOe (see FIG. 3A) and a perpendicular magnetic anisotropy field $H_k \approx 8.5$ kOe (FIG. 3B) as determined by fitting the dependence of Vie) on the in-plane bias field fix following the parabolic relation $V_{1\omega}=\pm V_{AH}(1-H_x^2/2H_k^2)$, where $V_{AH}$=2.66 mV for E=66.7 kV/m, and the signs $\pm$correspond to the initial magnetization states of $\pm M_z$ (see FIG. 3A). An in-plane magnetic field of $H_x=\pm 3$ kOe may be applied along the current direction to overcome the Dzyaloshinshii-Moriya interaction at the Co interface with Pt/Hf multilayer. As shown in FIGS. 3C-3D, deterministic switching of the Co magnetization is observed at current of ~4.7 mA in the whole stack, which corresponds to $j_e=1.7\times10^7$ A/cm$^2$ in the Pt/Hf multilayer (in our samples the resistivity of the Co layer is $\rho_{Co}$~130 $\mu\Omega$ cm, higher than bulk Co due to the strong interfacial scattering).

FIGS. 4A-4F show switching of SOT-MRAM devices. Specifically, FIG. 4A shows schematic of the 3-terminal MRAM device, FIG. 4B shows minor loop for switching by an in-plane applied magnetic field, FIG. 4C shows direct current switching loop, FIG. 4D shows critical current for P→AP (solid) and AP→P (open) switching as a function of current ramp rate, FIG. 4E shows FMR linewidth $\Delta H$ as a function of the resonance frequency f, and FIG. 4F shows FMR resonance field $H_r$ for the 1.6 nm FeCoB magnetic free layers for Device A and Device B. The solid lines in FIGS. 4D-4F denote the best fits of data to Eq. (1), $\Delta H=\Delta H_0+(2\pi/\gamma)\alpha f$, and $f=(\gamma/2\pi)\sqrt{H_r(H_r+4\pi M_{eff})}$, respectively. $\Delta H_0$ and $\gamma$ are the inhomogeneous broadening of the FMR linewidth and the gyromagnetic ratio, respectively.

The multilayer spin-Hall-effect structure implemented based on some embodiments of the disclosed technology can utilize spin-orbit torque switching of magnetic tunnel junctions. For technological applications, e.g. MRAM, low-current spin-torque switching of a FeCoB thin layer is of great interest. Here, as an independent check of the effectiveness of the enhancement of the SOT efficiency by Pt/Hf interfaces, we demonstrate antidamping switching of IMA three-terminal MRAM devices based on FeCoB—MgO MTJs. We fabricated two types of MRAM devices, Devices A and B. Each MRAM device consists of a 300 nm-wide spin Hall channel of [Pt 0.6/Hf 0.2]$_n$/Pt 0.6 (n=5 for Device A and 6 for Device B), an elliptical MTJ pillar of $Fe_{0.6}Co_{0.2}B_{0.2}$ 1.6/MgO 1.6/$Fe_{0.6}Co_{0.2}B_{0.2}$ 4 (190×45 for Device A or 190×74 nm$^2$ for Device B), and protective capping layers of Pt 3/Ru 4 (see the schematic in FIG. 4A). All devices were annealed at 240° C. For Device B, a 0.25 nm and a 0.1 nm Hf spacers were inserted at the bottom and top of the 1.6 nm FeCoB free layer, respectively, to suppress the magnetic damping constant ($\alpha$) and reduce the effective magnetization ($4\pi M_{eff}$), thereby reducing the critical current for anti-damping switching. The long axis of the elliptical MTJ pillars was along y direction, transverse to the spin Hall channel and the write-current flow (x direction). In FIGS. 4B-4F, we compare the magnetization switching behaviors, $\alpha$, and $4\pi M_{eff}$ of two representative MRAM devices without (Device A, red) and with (Device B, black) the two Hf spacers. FIG. 4B shows the sharp switching minor loops of the MTJs under an in-plane magnetic field along the long axis of the MTJ pillar ($H_y$). The minor loops are artificially centered after subtraction of the dipole fields ($H_{offset} \approx$150 Oe for Device A and 180 Oe for Device B) of the 4 nm $Fe_{0.6}Co_{0.2}B_{0.2}$ reference layers. He of the free layer is 36 Oe for Device A and 9 Oe for device B. The apparent tunnel magnetoresistance ratio (~40% for Devices A and ~7% for Device B) is not very high, which we attribute to a large background resistance caused during the device fabrication process (i.e. the oxidization of the Ti adhesion layer between the MTJ pillars and the top Pt contact).

FIG. 4C shows the characteristic switching behavior of Devices A and B as the write current in the spin Hall channel is ramped quasi-statically (an in-plane field equal to $H_{offset}$ may be applied along pillar long axis to compensate the dipole field from the reference layer). The MTJs show abrupt switching at write currents of 16 μA for Device A and 20 μA for Device B. Since thermal fluctuations assist the reversal of a nanoscale MTJ device during slow current ramps, we carried out ramp rate measurements (FIG. 4D).

Within the macrospin model, the switching current $I_c$ should scale with the ramp rate (I) following:

$$I_c = I_{c0}\left(1 + \frac{1}{\Delta}\ln\frac{\tau_0\Delta|I|}{|I_{c0}|}\right) \quad \text{Eq. (1)}$$

Here $I_{c0}$ is the critical switching current in absence of thermal fluctuations, $\Delta$ the stability factor that represents the normalized magnetic energy barrier for reversal between the P and AP states, and $\tau_0$ the thermal attempt time which we assume to be 1 ns. By fitting to Eq. (1), we obtain $|I_{c0}|\approx 172\pm 18$ µA and $\Delta\approx 26$ for Device A and $|I_{c0}|\approx 73\pm 15$ µA and $\Delta\approx 29$ for Device B after averaging the critical currents for P→AP and AP→P switching. The small critical switching currents are consistently reproduced by other devices. Considering a parallel resistor approximation, the current shunted into the FeCoB free layer and Hf spacers ($\rho_{Pt/Hf}\approx 144$ µΩ cm, $\rho_{FecoB}\approx\rho Hf\approx 130$ µΩ cm) can be estimated to be $\approx 0.2 I_{c0}$ for both devices. The critical switching density in the Pt spin Hall channel is therefore $j_{c0}\approx (1.0\pm 0.1)\times 10^7$ A/cm² for Device A (no Hf spacers) and $j_{c0}\approx (3.6\pm 0.7)\times 10^6$ A/cm² for Device B (with Hf spacers). Both the total critical switching and the low switching current density obtained from Device B are the lowest yet reported for any in-plane or perpendicular spin-torque MTJ (see Table 1 below). According to the macrospin model, $j_{c0}$ for antidamping torque switching of an in-plane magnetized MTJ is given by $j_{c0}=(2e/h)\mu_0 M_s t\alpha(H_c+4\pi M_{eff}/2)/\xi_{DL}$. With $\alpha$ of 0.017 (0.011), $4\pi M_{eff}$ of 5.54 (1.94) kOe, and $M_s$ of 1240 emu/cm² for the magnetic free layer of Device A (B) as calibrated from ferromagnetic resonance (FMR) measurements (FIGS. 4E-4F) and VSM measurements on un-patterned thin film stacks, we estimate $\xi_{DL}$ to be ~0.29 for Device A and 0.17 for Device B. The slight reduction of $\xi_{DL}$ for Device B compared to Device A is attributed to the spin current attenuation and possible reduction of the effective spin mixing conductance due to the insertion of the 0.25 nm Hf layer in Device B between the Pt/Hf multilayer and the FeCoB layer. Despite this reduction, this Hf spacer layer is still beneficial in that the suppression of $\alpha$ and the reduction of $4\pi M_{eff}$ for the free layer interface more than compensates for the decrease in $\xi_{DL}$. The value of $\xi_{DL}\approx 0.29$ for Device A is significantly higher than those previously obtained in similar studies for MRAM devices based on β-W ($\xi_{DL}$=−0.15), $Pt_{0.85}Hf_{0.15}$ ($\xi_{DL}$=0.098), and Pt ($\xi_{DL}$=0.12). We do note that $\xi_{DL}$=0.29 from the MRAM ramp rate experiment is ~20% less that the value determined from harmonic response measurement (see FIG. 2C). This difference may be partly attributed to an increased magnetic damping of nanoscale devices compared to thin film stacks due to, e.g., the ion-beam damage and the side-wall oxidation of the nanopillar during the device fabrication process. Tapering of free layer which is formed during the ion milling process due to the resist shielding effect can significantly increase the effective volume of the free layer of the MRAM device and lead to additional current shunting into the free layer. This current shunting into the tapering area has not been taken into account in our calculation. For the same reasons (DL of spin Hall materials is generally found to be underestimated in the ramp rate results of other nanoscale MRAM devices compared to in direct SOT measurements on micro-scale Hall bars (e.g. for W, $\xi_{DL}$ is ~0.15 from MRAM ramp rate measurements and ~0.20 from bilayer spin-torque measurements).

Both the critical switching current ($I_c$) and the critical switching current density ($j_{c0}$) for our Pt/Hf multilayer device are the lowest among all spin-Hall materials demonstrated in room-temperature SOT-MRAM devices. Here $[Pt/Hf]_n$ represents the multilayers of $[Pt\ 0.6/Hf\ 0.2]_6/Pt\ 0.6$.

TABLE 1

| SOT device | | $I_{c0}$ (mA) | $j_{c0}$ (MA/cm²) |
|---|---|---|---|
| $[Pt/Hf]_n$ | In-plane MTJ | 0.073 | 3.6 |
| W | In-plane MTJ | 0.15 | 5.4 |
| W | In-plane MTJ | 0.95 | 18 |
| Pt | In-plane MTJ | 0.67 | 40 |
| Ta | In-plane MTJ | 2.0 | 32 |
| $Pt_{0.85}Hf_{0.15}$ | In-plane MTJ | 0.56 | 14 |
| Ta | PMA MTJ | >20 | >50 |

The multilayer spin-Hall-effect structure implemented based on some embodiments of the disclosed technology can significantly increase the spin-torque efficiency $\xi_{DL}$ by introducing additional interface electron scattering within Pt by inserting sub-monolayer layers of Hf. As discussed above, direct spin-torque measurements and also spin-torque switching experiments of magnetic layers with both perpendicular and in-plane magnetic anisotropy show an increase of $\xi_{DL}$ from ~0.17±0.01 for a simple 4 nm-thick single Pt layer to ~0.37±0.01 for a [Pt 0.6/Hf 0.2]₇/Pt 0.6 multilayer despite the attenuation of spin current from Pt by the atomic Hf insertion layers. Taking advantage of this interface-scattering-enhanced spin Hall ratio in the Pt/Hf multilayers, we demonstrate deterministic switching of IMA FeCoB-MRAM devices with a critical switching current of ~73 µA and critical switching current density of ~3.6×10⁶ A/cm² in absence of thermal fluctuations, both of which are the lowest values yet known. In some implementations, the optimized multilayer, [Pt 0.6/Hf 0.2]₅/Pt 0.6 (with $\xi_{DL}$=0.37, $\rho_{xx}$=144 42 cm), represents a highly-efficient generator of spin-orbit torque that is also compatible with integration technology (e.g., allowing easy growth with standard sputtering techniques on Si substrates) for development of low-power magnetic memories, oscillators, and logic. Our findings also provide a new strategy with the potential to magnify SOTs generated by other low-resistivity heavy metals, e.g. $Au_{0.25}Pt_{0.75}$ or Pd.

In some embodiments of the disclosed technology, the multilayer spin-Hall-effect structure may be fabricated as follows. All of the multilayer samples are sputter deposited at room temperature onto oxidized silicon substrates with an argon pressure of 2 mTorr and a base pressure of ~1×10⁻⁸ Torr. A 1 nm Ta underlayer is used to improve the adhesion and smoothness of the Si/SiO₂ substrate. The multilayer stacks are patterned into 5×60 µm² Hall bars by ultraviolet photolithography and ion beam etching for resistivity, harmonic response, and direct current switching measurements (FIG. 1C). The FeCoB multilayer samples are patterned into three-terminal MRAM devices with a three-step procedure. First, we defined the spin Hall channel using DUV lithography and ion beam etching and measured the channel size to be 300×600 nm² by atomic force microscopy. We then defined the elliptical MTJ nanopillars with different aspect ratios and µm-size "via" pillars (as vertical connector between the bottom channel to top contact) onto the spin Hall channel with e-beam lithography and ion beam etching, and isolated the pillars with 80 nm thick SiO₂ deposited by an e-beam evaporator. Finally, contacts of Ti 5/Pt 50 were sputtered on the top of the MTJ pillars and "via" pillars for electrical measurements. In some implementations, the Ti layer may be oxidized to some degree during deposition, and this contributed a large background resistance to the measured MTJ pillar.

For each value of d, the average resistivity of the [Pt d/Hf 0.2]$_n$/Pt d multilayers may be determined by measuring the conductance enhancement of the corresponding full stacks with respect to the stack with no [Pt d/Hf 0.2]$_n$/Pt d multilayers. For harmonic response measurements, a lock-in amplifier was used to source a sinusoidal voltage (Vin=4 V) onto the bar (length L=60 μm) orientated along the x axis and to detect the in-phase first and out-of-phase second harmonic Hall voltages, $V_{1\omega}$ and $V_{2\omega}$ (FIG. 1C). For switching measurement of the CoFeB MRAM devices, a lock-in amplifier was used to read the differential resistance of the magnetic tunnel junctions with a 0.1 V oscillatory voltage applied onto MTJ pillars series-connected to 10 MΩ resistor (read current≈1 μA).

The multilayer spin-Hall-effect structure implemented based on some embodiments of the disclosed technology can significantly increase spin-orbit torque by strong interfacial scattering from ultra-thin insertion layers within a spin Hall metals with intrinsic or side jump mechanisms, which can significantly enhance the spin Hall ratio. The dampinglike SOT may be enhanced by a factor of 2 via sub-monolayer Hf insertion, as evidenced by both harmonic response measurements and current-induced switching of in-plane magnetized magnetic memory devices with the record low critical switching current of ~73 μA (switching current density≈3.6× 10$^6$ A/cm$^2$).

Spin-orbit torques (SOTs) generated by the spin Hall effect (SHE) can efficiently switch thin-film nanomagnet devices, excite magnetization oscillations, and drive skyrmion and chiral domain wall displacement. Increasing SOT efficiencies is of great importance for enabling new research into spintronics phenomena and for advancing technological applications of SOTs. Of particular interest in this effort is to develop heavy metals (HMs) that can simultaneously provide a large damping-like SOT efficiency per current density ($\xi_{DL}^j$), easy growth, good chemical/thermal stability, and the capability to be readily integrated into complex experimental configurations and/or into manufacturing processes. A good representative of such HMs is Pt, which has giant spin Hall conductivity ($\sigma_{SH}$) arising from the Berry curvature of its band structure. For the SHE, $\xi_{DL}^j=(2e/h)T_{int}\sigma_{SH}\rho_{xx}$ with e, h, $\rho_{xx}$, and $T_{int}$ being the elementary charge, the reduced Planck constant, and the HM resistivity, the spin transparency of the HM/FM interface. $\xi_{DL}^j$ for Pt/ferromagnet (FM) systems is ~0.08 where $\rho_{xx}$=20 μΩ cm. Recently, impurity scattering has been demonstrated to increase $\xi_{DL}^j$ via enhancing $\rho_{xx}$. However, in all the previous work the increase of $\xi_{DL}^j$ was limited (e.g., to $\xi_{DL}^j$=0.12-0.3 for 4 nm Pt alloys) due to a fast decrease in $\sigma_{SH}$ with doping level or/and only a weak enhancement of $\rho_{xx}$.

Some embodiments of the disclosed technology that can be used to introduce strong interfacial electron scattering via the insertion of sub-monolayers of Hf into Pt can enhance $\rho_{xx}$ of a ~4 nm Pt layer by a factor of 5, which beneficially results in 100% enhancement of $\xi_{DL}^j$ (up to 0.37). The increase in $\xi_{DL}^j$ by the ultrathin insertion layers is approximately twice as effective as a uniform alloying of Hf into Pt. This giant enhancement of $\xi_{DL}^j$ by Hf insertion layers is reaffirmed by the deterministic switching of in-plane magnetic tunnel junctions (MTJs) at a low zero-temperature critical current of ≈73 μA (current density≈3.6×10$^6$ A/cm$^2$) as determined from ramp rate measurements.

The multilayer spin-Hall-effect structure implemented based on some embodiments of the disclosed technology shows the record-low critical switching current (current density) of the SOT-MRAMs based on Pt/Hf multilayers, which is a technologically important achievement. The 3-terminal SOT-MRAM is an advantageous current- and energy-efficient cache memory candidate because the separation of the read and write channels in the 3T geometry offers additional advantages over the conventional 2-terminal spin-transfer-torque geometry: e.g., unlimited endurance, faster write (sub-ns), faster readout without read disturbance, lower write energy, and allowance for thick MgO barrier for enhanced TMR.

Structural Characterization of Pt/Hf Multilayers

FIGS. 5A-5D show gradual degradation of the crystalline ordering in Pt due to the insertion of ultra-thin Hf layers. FIG. 5A shows Pt (111) x-ray diffraction peaks for the multilayers Si/SiO$_2$/Ta 1/[Pt d/Hf 0.2]$_n$/Pt 0.6/Co 1.4/MgO 2/Ta 1.5 with different individual Pt layer thicknesses d but similar total Pt thicknesses. FIG. 5B shows the full width at the half maximum (FWHM) and FIG. 5C shows the integrated intensity the Pt (111) peak, and FIG. 5D shows the spacing of Pt (111) lattice planes. The broadening and weakening of the Pt (111) x-ray diffraction peak with increasing d reveal an increasing degradation of the long-range crystalline ordering of Pt, i.e. from the highly ordered fcc phase to an amorphous phase. The degradation of the long-range crystalline order of Pt can disrupt the Pt band structure and reduce the intrinsic spin Hall conductivity. The line 510 indicates the Pt (111) peak shift as a function of d. The increase of the spacing of Pt (111) lattice planes with decreasing d indicates an increasing in-plane tensile strain caused because the Hf atoms are larger than Pt atoms.

FIGS. 6A-6B show X-ray diffraction (35°-45°) and reflectivity (0.5°-11°) patterns. The sample stacks measured are, in FIG. 6A, Si/SiO$_2$/Ta 1/[Pt 0.6/Hf 0.2]$_5$/Pt 0.6/Co 1.4/MgO 2/Ta 1.5, and, in FIG. 6B, Si/SiO$_2$/Ta 1/[Pt 0.6/Hf 0.2]$_5$/Pt 0.6/Co 1.4/MgO 2/Ta 1.5, differing only in the number of [Pt 0.6/Hf 0.2] repeat units: n=5 in FIG. 6A and 50 in FIG. 6B. For both samples, the Pt/Hf multilayers show a fcc (111) orientation and strong reflectivity oscillation. However, there are no observable satellites peaks around the Pt (111) diffraction peak due to the Pt/Hf superlattices, indicating that the 0.2-nm Hf insertion layers are too thin to be effective diffraction facets for x-ray reflection even though they strongly enhance electron scattering as indicated by the resistivity results plotted as discussed above. The absence of strong x-ray reflection from the Hf insertion layers is confirmed by the single dominant oscillation period in the low-angle reflectivity curves for both n=5 and n=50.

FIGS. 7A-7C show cross-sectional STEM and EDS imaging of a MRAM device. The device consists of a Si/SiO$_2$ substrate, a magnetic tunnel junction stack of Ta 1/[Pt 0.6/Hf 0.2]$_5$/Pt 0.6/Hf 0.3/FeCoB 1.4/MgO 2/FeCoB 4/Pt 3/Ru 4, and a top contact of Ti 5/Pt 50 (numbers are layer thicknesses in nm). FIG. 7A shows high-angle annular dark-field (HAADF) image of the entire device. FIG. 7B shows high-resolution TEM image of the MTJ pillar region. FIG. 7C shows HAADF image of the MTJ pillar region and the corresponding EDS imaging of Si, Ta, Pt, Hf, Co, Fe, Mg, O, Ru, and Ti.

Estimation of Current Shunting into the MTJ Free Layer

Figure 8:
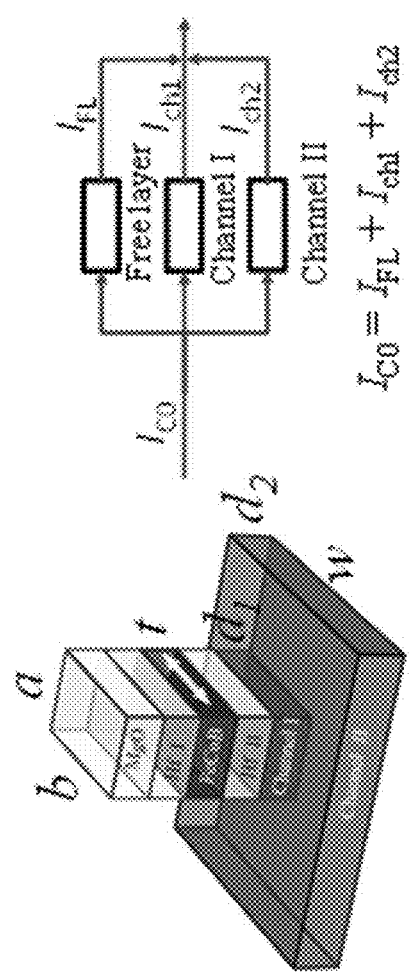
FIG. 8 shows calculation of current flows in the MTJ free layer and in the spin Hall channel.
Figure 9:
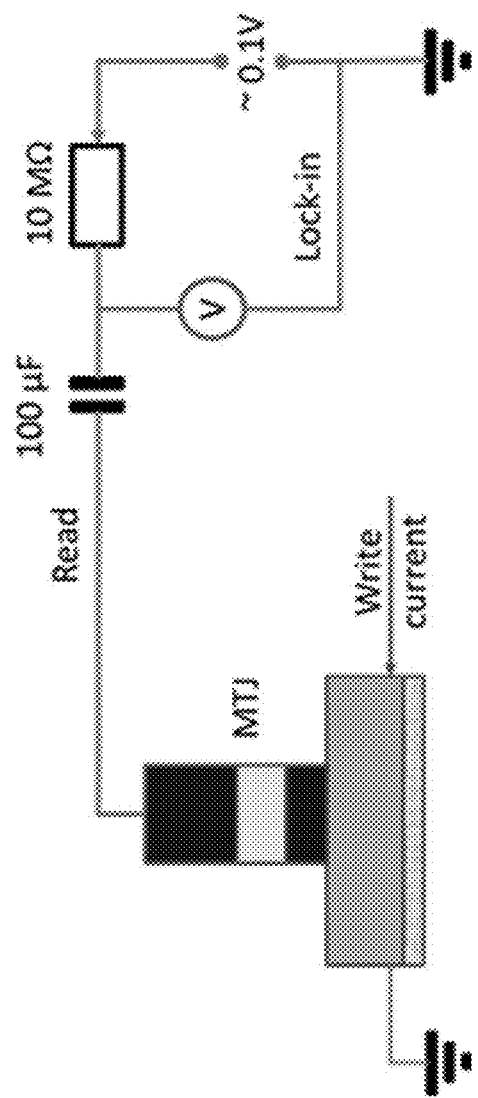
FIG. 9 shows current switching and ramp rate experiments of SOT-MRAM devices.

FIG. 8 shows calculation of current flows in the MTJ free layer and in the spin Hall channel. FIG. 9 shows current switching and ramp rate experiments of SOT-MRAM devices.

The dampinglike spin-orbit torque efficiency per current density (or effective spin Hall angle) can be estimated from the critical switching current ($I_{c0}$) of a 3-terminal spin-orbit torque MTJ device. However, the total switching current determined from the ramp rate measurement is generally larger than the current flow in the spin Hall channel below the MTJ free layer because there can be significant current shunting into the MTJ free layer. Neglecting the current shunting into the MTJ free layer may lead to underestimation of the dampinglike torque efficiency, especially when the conductance of the MTJ free layer is comparable or higher than that of the spin Hall channel in the MTJ device region. Here we provide the approach we used to separate the current flows in the spin Hall channel and MTJ free layer from the total switching current determined from ramp rate measurements.

As schematically shown in FIG. 8, the total write current sourced into a 3-terminal spin-orbit torque MTJ device can be computed as the sum of the current flows in the three parallel resistors, i.e. $I_{C0}=I_{FL}+I_{ch1}+I_{ch2}$, where Jim is the current in the free layer and spacers (a×b×t), $I_{ch1}$ is the current in Channel I—a region of the spin Hall layer beneath the free layer defined by etching to have a thickness $d_1$ and the same length and width as the MTJ pillar, and $I_{ch2}$ is the current in the un-etched portion of spin Hall channel (Channel II). The thicknesses of the Channel I ($d_1$) and Channel I ($d_2$) can be estimated by comparing the measured channel resistance $R_{measure}$ with the calculated channel resistance ($R_0$) for a un-etched spin Hall channel with total thickness of $d_0=d_1+d_2$, i.e. $d_2=d_0R_0/R_{measure}$ and $d_1=d_0(1-R_0/R_{measure})$. According to the parallel resistor model, we have current ratios $I_{ch1}/I_{FL}=\rho_{FCB} d_1/\rho_{Pt/Hf}$, $I_{ch2}/I_{FL}=\rho_{FCB} wd_2/\rho_{Pt/Hf} bt$, where w is the channel width. Using the current ratios, we can determine $I_{FL}=I_{c0}/(1+I_{ch1}/I_{FL}+I_{ch2}/I_{FL})$, thus $I_{ch1}$ and $I_{ch2}$. The critical switching current density in the spin Hall channel is then given by $j_{c0}=I_{ch2}/wd_2=I_{ch1}/bd_1$.

Assuming no over-etching into the spin Hall channel (i.e. $d_1=0$ nm and $d_0=d_2$), we get $I_{ch2}/I_{FL}=4$, $I_{FL}=I_{c0}/(1+I_{ch2}/I_{FL})\approx 0.2I_{c0}$ and $I_{ch2}\approx 0.8I_{c0}$ for both devices. Here $\rho_{FCB}=130$ μΩ cm, $\rho_{Pt/Hf}=144$ μΩ cm, w=300 nm, b=190 nm, $d_2$=4.6 nm for Device A, 5.4 nm for Device B, t=1.6 nm for Device A and t=1.6+0.35 nm for Device B. If we estimate the amount of over-etching from the channel resistance (i.e. $d_2=d_0R_0/R_{measure}$ and $d_1=d_0(1-R_0/R_{measure})$), we calculate values for $d_1$, $d_2$, and $I_{FL}/I_{c0}$ for Devices A and B as summarized in Table 2. Here $R_0$ is calculated using the effective channel length/width ratio of 7 as determined from finite element analysis based on COMSOL. Compared to the non-over-etched case where $I_{FL}/I_{c0}$=0.2 (see FIG. 8), this estimation yields slightly larger current shunting ratio, i.e. $I_{FL}/I_{c0}$=0.23 and 0.24 for Devices A and B, respectively. Of course, the above estimation assumes that $d_2$ is constant throughout the channel. Taking into account the free layer taper that expands the free layer area, the current shunting into the free layer could be a bit more significant, and therefore $j_{c0}$ should be even smaller. In the main text, we use $I_{FL}/I_{c0}$=0.2 to estimate the lower bound of the spin-torque efficiency for the Pt/Hf channels of the MTJ devices.

TABLE 2

Influence of channel over-etching on current shunting into the MTJ free layer.

| | Pillar a × b × t (nm³) | Channel w × $d_0$ (nm²) | $R_{measure}$ (kΩ) | $R_0$ (kΩ) | $d_1$ (nm) | $d_2$ (nm) | $I_{FL}/I_{c0}$ |
|---|---|---|---|---|---|---|---|
| Device A | 45 × 190 × 1.6 | 300 × 4.6 | 4.3 | 2.3 | 2.2 | 2.4 | 0.23 |
| Device B | 74 × 190 × (1.6 + 0.35) | 300 × 5.4 | 3.8 | 1.9 | 2.6 | 2.8 | 0.24 |

The multilayer spin-Hall-effect structure implemented based on some embodiments of the disclosed technology can be implemented by inserting one or more layers of Ti within the Pt layer to exhibit a giant spin Hall ratio in Pt/Ti multilayers with strong interfacial scattering.

The spin Hall ratio ($\theta_{SH}$) of an intrinsic spin Hall metal is proportional to the product of the spin Hall conductivity ($\sigma_{SH}$) and the resistivity ($\rho_{xx}$), i.e. $\theta_{SH} \propto \sigma_{SH}\rho_{xx}$, and may be enhanced by increasing $\rho_{xx}$ through various scattering mechanisms. However, increasing $\rho_{xx}$ is found to substantially decrease $\sigma_{SH}$ for different reasons, which limits the efficiency of enhancement of $\theta_{SH}$. New approaches that can best trade-off between $\rho_{xx}$ and $\sigma_{SH}$ is imperative for maximizing $\theta_{SH}$. In this work, we report giant $\theta_{SH}$ in Pt/Ti multilayers due to the strong interfacial scattering. The scattering at the Pt/Ti interfaces enhances $\rho_{xx}$ by a factor of 5 while reducing $\sigma_{SH}$ by a factor of 3.3. Since the reduction of $\sigma_{SH}$ in the multilayers is mainly attributed to the shortening of quasi-particle lifetime, a predicted nature for intrinsic $\sigma_{SH}$, the giant $\theta_{SH}$ of ~0.7 we obtain in the multilayers of [Pt 0.75/Ti 0.2]$_7$/Pt 0.75 appears to be the upper-bound value for the intrinsic spin Hall effect of Pt.

The spin Hall effect (SHE) in heavy metals (HMs) has promise for efficiently switch thin-film nanomagnet, excite magnetization oscillations, and drive skyrmion and chiral domain wall displacement. The energy efficiency of present spin Hall devices (e.g., memories and oscillators) are still limited due to a small spin Hall ratio ($\theta_{SH}$) or/and a high resistivity ($\rho_{xx}$) of the spin Hall materials. Developing new spin Hall metals with better trade-offs between $\theta_{SH}$ and $\rho_{xx}$ is of great importance for advancing technological applications of SOTs. Among the various spin Hall materials (metals and insulators), Pt is particularly distinguished because of its simultaneous combination of the giant intrinsic spin Hall conductivity ($\sigma_{SH}$) arising from the Berry curvature of its band structure, easy growth, good stability, and the capability to be readily integrated into experimental and/or manufacturing processes. For a SHE with a dominant intrinsic or/and side jump mechanisms, $\theta_{SH}$ (=$(2e/h)\sigma_{SH}\rho_{xx}$ with e/h being the elemental charge and the reduced Planck constant) may be enhanced by increasing $\rho_{xx}$ provided that the degradation of $\sigma_{SH}$ is less significant than the enhancement of $\rho_{xx}$ in the process. It is both of technological urgency and fundamental interest to explore and new effective approaches, that can better optimize the trade-offs between $\rho_{xx}$ and $\sigma_{SH}$, as well as to unveil the underlying mechanisms.

Inserting ultrathin 5*d* Hf layers into a 4 nm Pt layer can remarkably increase the scattering of electrons and spins as well as strongly interrupt the crystal structure of Pt. 3d Ti is advantageous for the interface scattering enhancement of $\theta_{SH}$ in Pt because it is light (long spin diffusion length) and close to Pt in atomic radius (less interruption in structural/ electronic structures). The multilayer spin-Hall-effect structure implemented based on some embodiments of the disclosed technology can exhibit the giant enhancement of the spin Hall ratio of Pt by engineering $\rho_{xx}$ and $\sigma_{SH}$ via inserting sub-monolayer Ti insertion layers into a 6 nm Pt layer, the only source of SHE. The optimized trade-offs between $\rho_{xx}$ and $\sigma_{SH}$ results in a giant spin Hall angle of >0.68 in Pt/Ti multilayers. The strong interfacial electron scattering from the insertion of sub-monolayers of Ti enhances the average $\rho_{xx}$ from 26.5 to 130 μΩ cm while reduces $\sigma_{SH}$ by a factor of 3.3. The considerable reduction of $\sigma_{SH}$ accompanying the enhancement of $\rho_{xx}$ is clarified to be due to the shortening of quasi-particle lifetime, as predicted by the tight-binding model calculation, which appears to set the upper limit for enhancing $\theta_{SH}$ for Pt via increasing the resistivity.

Figure 10A:
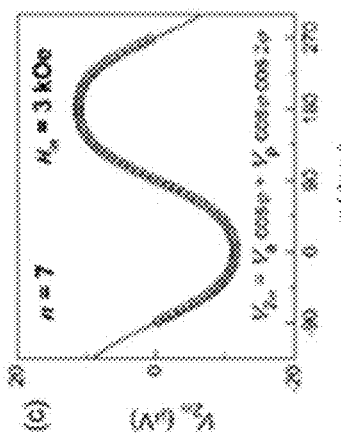
FIG. 10A shows schematic of the "in-plane" harmonic response measurement.
Figure 10B:
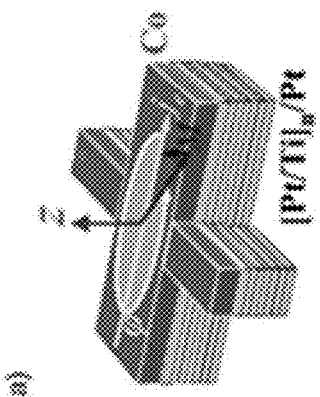
FIG. 10B shows in-plane field ($H_{in}$) dependence of $dV_{AH}/dH_z$.
Figure 10C:
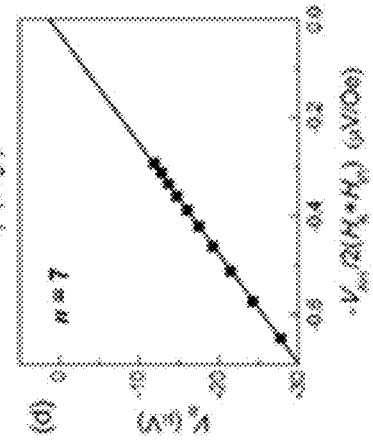
FIG. 10C shows in-plane field angle dependence of the second harmonic voltages ($V_{2\omega}$) ($H_{in}$=3 kOe)
Figure 10D:
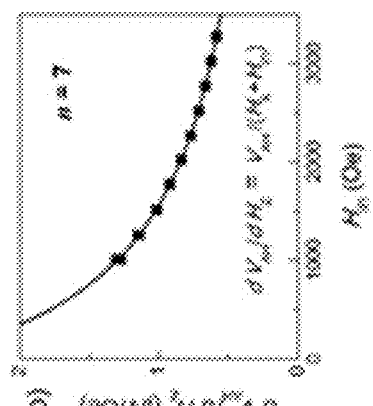
FIG. 10D shows $V_a$ versus $-V_{AH}/2(H_{in}+H_k)$. for [Pt 0.75/Ti 0.2]$_7$/Pt 0.75/Co 1.3.

FIG. 10A shows schematic of the "in-plane" harmonic response measurement. FIG. 10B shows in-plane field ($H_{in}$) dependence of $dV_{AH}/dH_z$, FIG. 10C shows in-plane field angle dependence of the second harmonic voltages ($V_{2\omega}$) ($H_{in}$=3 kOe), and FIG. 10D shows $V_a$ versus $-V_{AH}/2(H_{in}+H_k)$. for [Pt 0.75/Ti 0.2]$_7$/Pt 0.75/Co 1.3. The solid lines in FIGS. 10B-10D refer to the best fits of the data to $dV_{AH}/dH_z$=V mil ($H_{in}+H_k$), $V_{2\omega}=V_a \cos\varphi+V_p \cos\varphi \cos 2\varphi$, and $V_a=-H_{DL}V_{AH}/2(H_{in}+H_k)+V_{ANE}$, respectively.

The multilayer spin-Hall-effect structure implemented based on some embodiments of the disclosed technology can be implemented by sputter-depositing magnetic stacks of [Pt d/Ti 0.2]$_n$/Pt d/Co t (numbers are layer thicknesses in nm) with d=6/(n+1) nm and n=0, 1, 3, 5, 7, 9, and 11, respectively onto Si/SiO$_2$ substrates at room temperature. Each sample may be seeded by a 1 nm Ta adhesion layer and capped by a protective MgO 2.0/Ta 1.5 bilayers. We choose t=1.9 nm for n=0 and 1.3 nm for n≥1 to assure that the Co layer is thick enough to be fully in-plane magnetized as well as being thin enough to have a strong dampinglike effective SOT field ($H_{DL}$) during the "in-plane" harmonics response measurement (FIG. 10A). As determined by vibrating sample magnetometry, the effective saturation magnetization ($M_s^{eff}$) of the as-grown Co films, the total moment averaged over the volume of the Co films, are 1180-1250 emu/cc, depending on the details of the sample interfaces. The samples were patterned into 5×60 μm$^2$ Hall bars by ultraviolet photolithography and argon ion milling, followed by deposition of 5 nm Ti and 150 nm Pt as electrical contacts.

Within a macrospin model, $H_{DL}$ for in-plane magnetized HM/FM samples can be determined from the angle ($\varphi$) dependence of the second harmonic response voltage ($V_{2\omega}$) on the in-plane bias magnetic field (Ha), i.e. $V_{2\omega}=V_a \cos\varphi+V_p \cos\varphi \cos 2\varphi$, where $V_a=-V_{AH}H_{DL}/2(H_{in}+H_k)+V_{ANE}$, with $V_{AH}$, $V_{ANE}$, and $H_k$ being the anomalous Hall voltage, the anomalous Nernst effect, and the perpendicular anisotropy field. $V_p$ term is the contribution of fieldlike/Oersted torques. In this work, we use a sinusoidal electric bias field with a constant magnitude of E=66.7 kV/m as an excitation for the harmonic response measurement. As shown in FIG. 10B, we first determine $V_{AH}$ and $H_k$ by fitting the $H_{in}$ dependence of $dV_{AH}/dH_z$ to $dV_{AH}/dH_z=V_{AH}/(H_{in}+H_k)$. $V_a$ for each magnitude of $H_{in}$ was separated out from the $\varphi$ dependence of $V_{2\omega}$ (FIG. 10C). As shown in FIG. 10D, the linear fit of $V_a$ vs $V_{AH}/2(H_{in}+H_k)$ gives the value of $H_{DL}$ of $5.6\times10^{-4}$ Oe m/V (the slope) and a negligible thermal effect ($V_{ANE}$<0.9 μV from the intercept).

FIG. 11A shows the dampinglike spin-torque efficiency per applied electric field $\xi_{DL}^E$ and the spin Hall conductivity $\sigma_{SH}$, FIG. 11B shows the dampinglike spin-torque efficiency per unit bias current density $\xi_{DL}^j$ and the bulk spin Hall ratio $\theta_{SH}$, FIG. 11C shows the averaged resistivity $\rho_{xx}$, FIG. 11D shows the spin diffusion length $\lambda_s$, and FIG. 11E shows the spin transparency $T_{int}$ for Pt/Ti multilayers with different n.

FIG. 11A, the dampinglike SOT efficiency per applied electric field $\xi_{DL}^E=(2e/\hbar)\mu_0M_s^{eff}tH_{DL}/E$ with $\mu_0$ and t are the permeability of vacuum and Co thickness. Here $M_s^{eff}$ may be used in the calculation of spin-torque efficiencies to include any contribution of possible magnetic dead layers and/or proximity magnetism at the interfaces. $\xi_{DL}^E$ drops monotonically from $6.1\times10^5$ μΩ$^{-1}$m$^{-1}$ for n=0 to $2.6\times10^5$ μΩ$^{-1}$m$^{-1}$ for n=11, the trend of which is well consistent with previous observation that enhancing resistivity reduces $\xi_{DL}^E$ and $\sigma_{SH}$. We further calculated in FIG. 11B the dampinglike SOT efficiency per unit bias current density $\xi_{DL}^j=(2e/\hbar)\mu_0M_s^{eff}tH_{DL}/E$, where the charge current density in the HM layer $j_e=E/\rho_{xx}$ is calculated using the $\rho_{xx}$ values plotted in FIG. 11C. $\xi_{DL}^j$ increases quickly from ~0.16 at n=0 (d=6 nm) to a peak value of ~0.34 at n=7 (d=0.75 nm) and then slightly dropped to 0.33 at n=11 (d=0.5 nm). The uncertainty of $\xi_{DL}^j$ due to the harmonic response measurement is less than 2%. Here we used the average value of $\rho_{xx}$ for each Pt/Ti multilayers as determined by measuring the conductance enhancement of the corresponding stacks (d(n+1)=6 nm) with respect to a reference stack that does not include the Pt/Ti multilayers (d=0 nm). We point out that the scattering strength the travelling electrons "feel" in the materials should be best described by the average value of $\rho_{xx}$, while it is not justified to consider the resistivity inside of the Hf and Pt single "slices" from a parallel resistor model. As shown in FIG. 11C, $\rho_{xx}$ for the Pt/Ti multilayers goes up monotonically, from 26.6 μΩ cm for n=0 to 192.3 μΩ cm for n=11, with increasingly enhancing the interface scattering induced by the Ti insertions.

To better understand the underlying physics for the evolution of $\xi_{DL}^{j(E)}$ with Ti insertions, it is helpful to determine the bulk values of $\theta_{SH}=\xi_{DL}^j/T_{int}$ and $\sigma_{SH}=(\hbar/2e)\xi_{DL}^E/T_{int}$ for the Pt/Ti multilayers. According to drift-diffusion model, the spin transparency ($T_{int}$) of a HM/FM interface due to spin backflow (SBF) reads $$T_{int}=(1-\text{sech}(d_{HM}/\lambda_s))(1+G_{HM} \tanh(d_{HM}/\lambda_s)/2G_{HM/FM}^{\uparrow\downarrow})^{-1} \qquad \text{Eq. (2)}$$

where $d_{HM}$, $\lambda_s$, and $G_{HM}=1/\rho_{xx}\lambda_s$ are the thickness, spin diffusion length, spin conductance of the HM layer, and $G_{mix}^{\uparrow\downarrow}$ is the spin mixing conductance of the HM/FM interface. Assuming a dominant Elliot-Yafet spin relaxation mechanism, $G_{Pt}=1.3\times10^{15}$ μΩ$^{-1}$m$^{-2}$, and $G_{Pt/Co}^{\uparrow\downarrow}=0.59\times10^{15}$ Ω$^{-1}$m$^{-2}$ as calculated for Pt/Co interface, we determined $\lambda_s$ and $T_{int}$ of the interface of Co and Pt/Ti multilayers in FIGS. 11E and 11F, respectively. As drops quickly from 2.9 nm for n=0 (single Pt layer) to 0.6 nm for n=11 (FIG. 11D) while $T_{int}$ increases from 0.38 to 0.5 (see FIG. 11E). As plotted in FIGS. 11A-11B, $\theta_{SH}$ is enhanced from ~0.43 for pure Pt to ~0.68 for [Pt 0.75/Ti 0.2]$_7$/Pt 0.75, whereas $\sigma_{SH}$ is degraded by a factor of ~3.3, which unambiguously reveals that the strong interfacial scattering induced enhancement of $\rho_{xx}$ is the main reason for enhancement in $\theta_{SH}$. The increase of $\rho_{xx}$ also beneficially contributed to the enhancement of $\xi_{DL}^{j(E)}$ by via shortening $\lambda_s$ and improving $T_{int}$. In above discussions, we consider a negligible spin memory loss (SML) at the interface of Pt/Ti multilayers and Co layer. This is because SML in as-grown in-plane Pt/Co interfaces appears to be small. Notably, the experimental values of $\sigma_{SH}$ for Pt bulk is ~$1.6\times10^6$ ($\hbar/2e$) Ω$^{-1}$m$^{-1}$, which is more than a factor of ~3.6 greater than the zero-K values from first-principles and tight-binding model calculations ($<4.4\times10^6$ (h/2e) $\Omega^{-1}m^{-1}$)). We speculate that the spin-orbit effects in Pt systems is considerably underestimated in the existing theories.

FIG. 12A shows X-ray diffraction θ-2θ patterns, FIG. 12B shows the integrated intensity of Pt (111) peak $I_{(111)}$, FIG. 12C shows lattice plane spacing of Pt (111), and FIG. 12D shows scaling of spin Hall conductivity with electrical conductivity for Pt/Ti multilayers with different n. In FIG. 12D, the circles and squares represent spin Hall conductivity with and without spin backflow correction.

The multilayer spin-Hall-effect structure implemented based on some embodiments of the disclosed technology can be implemented based on the mechanisms of the decrease of $\sigma_{SH}$ with increasing n, which is key in determining the maximum magnitude of $\theta_{SH}$. X-ray diffraction study reveals a decrease in the intensity of the Pt (111) diffraction peak (Imo) and in the in-plane tensile strain (by ~0.5%) of the Pt layer (see FIGS. 12A-12C). The decrease in $I_{(111)}$ can indicate a disruption of the Pt structure by the Ti insertion layers. However, the degradation of the Pt band structure is unlikely to be the main reason for the degradation of $\sigma_{SH}$ because the reduction rate of $\sigma_{SH}$ turns out not to be in consistent with that of $I_{(111)}$. For example, $\sigma_{SH}$ for Pt/Hf multilayers was reduced only by 70% when $I_{(111)}$ was reduced by 95%. In the case of Pt/Ti multilayers where Ti has close atomic radius to Pt, $\sigma_{SH}$ decreases by 58% when $I_{(111)}$ decreases only by 50%. The strain reduction is unlikely to be related to the decrease of $\sigma_{SH}$. The first-principles calculations indicate that $\sigma_{SH}$ peaks at the Fermi level for the unstrained Pt bulk and decreases with increasing in-plane tensile strain. Moreover, the spin-orbit scattering at the Pt—Ti interfaces is expected to be rather weak because the spin-orbit interaction in 3d Ti is small. As reported previously, even the 5d Hf provides good passivation when inserted into Pt/FM interface. This leaves the shortening of the quasiparticle lifetime due to the increased $\rho_{xx}$ as the most likely mechanism for the decrease of $\sigma_{SH}$. As predicted by Tanaka et al, the increase in the electron scattering strength should result in a shortening in the quasiparticle lifetime and decrease in the intrinsic $\sigma_{SH}$. This appears to be consistent with our experimental data. As we plot in FIG. 12D, $\sigma_{SH}$ scales with the electrical conductivity, $\sigma_{xx}=1/\rho_{xx}$, in a quadratic manner. Since the degradation of $\sigma_{SH}$ with $\sigma_{xx}$ is a signature for the intrinsic SHE of Pt and cannot be avoided in any approaches that increases $\rho_{xx}$, it sets an upper limit for $\theta_{SH}$ of Pt. Using the relation $\theta_{SH}=(2e/h)\sigma_{SH}\rho_{xx}$ and the quadratic scaling of $\sigma_{SH}$ with $\sigma_{xx}$, we estimate the upper limit of ~0.7 for $\theta_{SH}$ of Pt due to intrinsic SHE. This finding indicates that, unless an additive extrinsic SHE (skew scattering or side jump) or interfacial spin Hall conductivity can be introduced, $\theta_{SH}$ in a Pt/FM system should not be more than the value ($\theta_{SH}=0.68$) we obtain in the Pt/Ti multilayers with n=7 ($\rho_{xx}=90$ μΩ cm).

Figure 13:
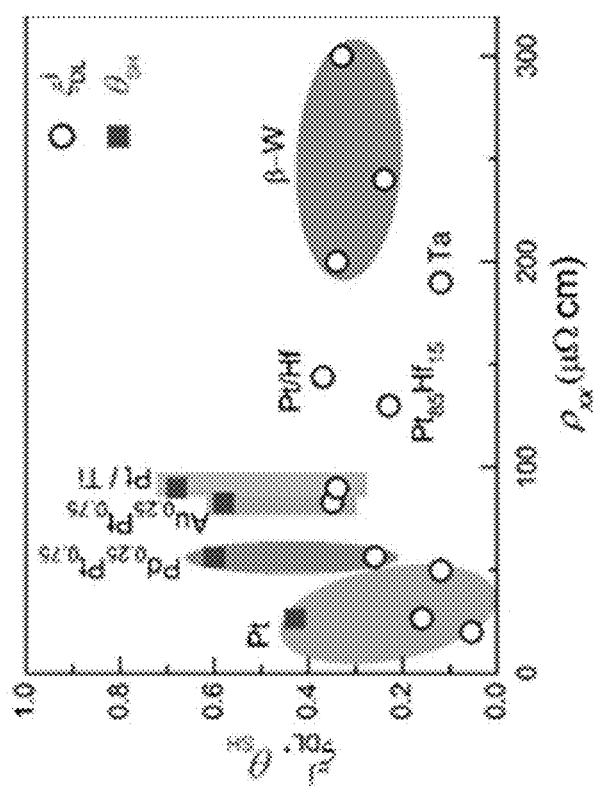
FIG. 13 shows comparison of $\xi_{DL}^j$, $\theta_{SH}$, and $\rho_{xx}$ for strong spin Hall metals.

FIG. 13 shows comparison of $\xi_{DL}^j$, $\theta_{SH}$, and $\rho_{xx}$ for strong spin Hall metals. The Pt—Ti multilayers is a very compelling spin Hall material. For spin-torque applications (e.g. memories and oscillators), spin Hall metals with a high $\theta_{SH}$ and relatively low $\rho_{xx}$ are highly desirable. If the HM is very resistive, current shunting into the adjacent magnetic layer will be significant so that the energy efficiency of the spin Hall devices will be degraded. FIG. 13 compares $\xi_{DL}^j$, $\theta_{SH}$, and $\rho_{xx}$ of various strong spin Hall metals. The maximum value of $\xi_{DL}^j=0.34$ we achieve for the Pt/Ti multilayers with n=7 ($\rho_{xx}=90$ μΩ cm) is significantly higher than the values reported for Pt ($\xi_{DL}\approx0.05$-0.16, $\rho_{xx}=20$-50 μΩ cm), $Pt_{85}Hf_{15}$ ($\xi_{DL}=0.15$-0.23, $\rho_{xx}=130$ μΩ cm), β-Ta ($\xi DL\approx0.12$, $\rho_{xx}=190$ μΩ cm), and $Pd_{0.25}Pt_{0.75}$ ($\xi_{DL}\approx0.26$, $\rho_{xx}=56$ μΩ cm), and comparable with that of $Au_{0.25}Pt_{0.75}$ ($\xi_{DL}\approx0.30$-0.35, $\rho_{xx}=83$ μΩ cm), Pt/Hf multilayers ($\xi_{DL}\approx0.37$, $\rho_{xx}=144$ μΩ cm), and β-W ($\xi_{DL}\approx0.2$-0.34, $\rho_{xx}=200$-300 μΩ cm). However, the low-resistivity Pt/Ti multilayers and $Au_{0.25}Pt_{0.75}$ are advantageous over the high-resistivity β-W.

The multilayer spin-Hall-effect structure implemented based on some embodiments of the disclosed technology can be implemented to exhibit the giant spin Hall ratio in the Pt/Ti multilayers resulting from the giant intrinsic spin Hall conductivity of Pt and the strong interfacial scattering of Pt/Ti interfaces. The optimized trade-off between $\rho_{xx}$ and $\sigma_{SH}$ results in a giant $\theta_{SH}$ of 0.68 in a multilayers of [Pt 0.75/Ti 0.2]$_7$/Pt 0.75. The strong interfacial electron scattering from the insertion of sub-monolayers of Ti enhances the average $\rho_{xx}$ a factor of 5 and reduces $\sigma_{SH}$ by a factor of 3.3 at the same time. The considerable reduction of $\sigma_{SH}$ accompanying the enhancement of $\rho_{xx}$ is mainly attributed to the shortening of quasi-particle lifetime, as predicted by the tight-binding model calculation. This sets the upper limit of 0.68-0.69 for the intrinsic SHE in Pt. This work also achieves a highly-efficient spin-current generator, [Pt 0.75/Ti 0.2]$_7$/Pt 0.75, that combination of the high $\theta_{SH}$ and relatively low $\rho_{xx}$ (90 μΩ cm), and good compatibility with integration technology (e.g., allowing easy growth with standard sputtering techniques on Si substrates) for development of low-power magnetic memories, oscillators, and logic.

In some embodiments of the disclosed technology, spin-orbit torque efficiency of Pt/Ti multilayers can be maximized through a tradeoff between intrinsic spin Hall conductivity and carrier lifetime. For example, the multilayer spin-Hall-effect structure implemented based on some embodiments of the disclosed technology can be implemented through the maximization of the spin Hall ratio ($\theta_{SH}$) in Pt thin films by the insertion of sub-monolayer layers of Ti to decrease carrier lifetime while minimizing the concurrent reduction in the spin Hall conductivity ($\sigma_{SH}$). In some implementations, the intrinsic $\sigma_{SH}$ of Pt, while robust against the strain and the moderate interruption of crystal order caused by these insertions, begins to decrease rapidly at high resistivity level because of the shortening carrier lifetime. The unavoidable trade-off between the intrinsic $\sigma_{SH}$ and carrier lifetime sets a practical upper bound of $\theta_{SH}\geq0.8$ for heterogeneous materials where the crystalline Pt component is the source of the spin Hall effect and the resistivity is increased by shortening carrier lifetime. This work also establishes a very promising spin-Hall metal of [Pt 0.75 nm/Ti 0.2 nm]$_7$/Pt 0.75 nm for energy-efficient, high-endurance spin-orbit torque technologies (e.g., memories, oscillators, and logic) due to its combination of a giant $\theta_{SH}\approx0.8$, or equivalently a dampinglike spin torque efficiency per unit current density $\xi_{DL}^j\approx0.35$, with a relatively low resistivity (90 μΩ cm) and high suitability for practical technology integration.

Figure 14A:
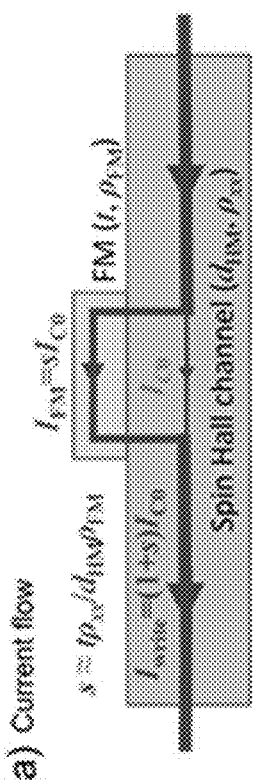
FIG. 14A shows current flow in a spin Hall channel and a FM dot, the core structure of SOT memory, logic and oscillator devices.
Figure 14B:
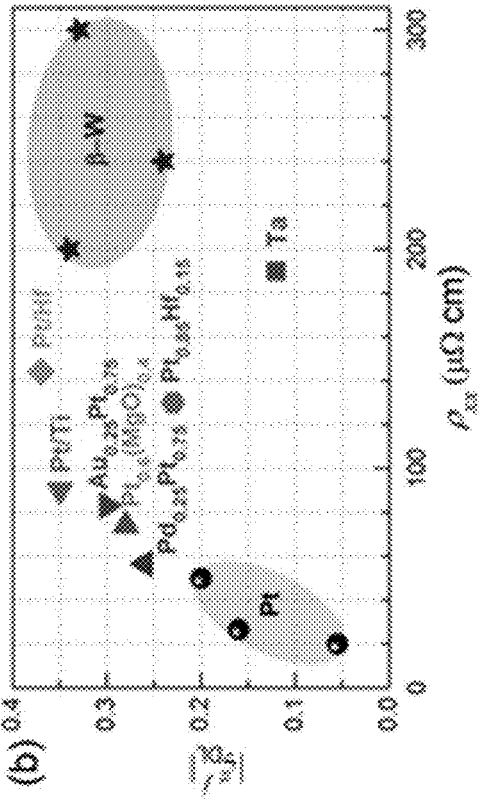
FIG. 14B shows comparison of $\xi_{DL}^j$ and $\rho_{xx}$ of HM/FM bilayers.

FIG. 14A shows current flow in a spin Hall channel and a FM dot, the core structure of SOT memory, logic and oscillator devices. $I_{c0}$ is the critical switching current in the spin Hall channel (thickness $d_{HM}$, resistivity $\rho_{xx}$) for SOT generation, while $I_{FM}=sI_{c0}$ represents the current shunting into the FM layer (thickness t, resistivity $\rho_{FM}$). FIG. 14B shows comparison of $\xi_{DL}$ and $\rho_{xx}$ of HM/FM bilayers.

Spin Hall metals with strong dampinglike spin-orbit torque (SOT) efficiency per unit current density ($\xi_{DL}^j$) and relatively low resistivity ($\rho_{xx}$) are the key for developing practical SOT technologies (e.g., memories, oscillators, and logic) that require high energy efficiency, high endurance, and low impedance. For example, for a SOT-MRAM device with a spin Hall channel (with thickness $d_{HM}$ and resistivity $\rho_{xx}$)/ferromagnetic (FM) free layer (with thickness t and resistivity $\rho_{FM}$), the write current is approximately $I_{write} \propto (1+s)/\xi_{DL}^j$, and the corresponding write energy is $P_{write} \propto [(1+s)/\xi_{DL}^j]^2 \rho_{xx}$, where $s \approx t\rho_{xx}/d_{HM}\rho_{FM}$ is the ratio of the current shunting in the FM layer over the current flow in the spin Hall channel (see FIG. 14A). Meanwhile, a high $\rho_{xx}$ of a spin Hall material (e.g., $\rho_{xx} \geq 200$ μΩ cm in Ta, W, and topological insulators) is problematic for applications that require a high endurance and low device impedance ($\propto \rho_{xx}$). For example, use of a large $\rho_{xx}$ spin Hall material (e.g., 200-300 μΩ cm for W, see FIG. 14B) will limit the endurance of SOT devices via Joule-heating-induced bursting and migration of the write line as well as result in a high write impedance that is challenging to accommodate for superconducting circuits in a cryogenic computing system. It is therefore of great technological importance to establish how, why, and to what limit the spin Hall ratio ($\theta_{SH}$) and $\xi_{DL}^j$ of a spin Hall metal with a giant spin Hall conductivity ($\sigma_{SH}$) and a relatively low $\rho_{xx}$ can be enhanced in practice.

Among the various spin Hall metals, Pt is particularly attractive for SOT technologies due to its low $\rho_{xx}$, the highest intrinsic $\sigma_{SH}$ known for the simple technologically viable metals (>$1.6 \times 10^6$ (h/2e) $\Omega^{-1}m^{-1}$ in the clean-metal regime), easy growth, and the capability to be readily integrated into experimental and/or manufacturing processes. However, $\xi_{DL}^j = (2e/h)T_{int}\sigma_{SH}\rho_{xx}$ for low-$\rho_{xx}$ Pt films is considerably lower than that of the meta-stable β-W alternative due to the much lower $\rho_{xx}$, e.g. $\xi_{DL}^j = 0.06$ when $\rho_{xx} = 20$ μΩ cm. Here, e is the elemental charge, h the reduced Planck's constant, and $T_{int}$ the spin transparency of the HM/FM interface. To take better advantage of the intrinsic nature and very high magnitude of $\sigma_{SH}$ of Pt, recent efforts have sought to enhance $\xi_{DL}^j$ by increasing $\rho_{xx}$ through the addition of a high density of impurities, by alloying, or by insertion of multiple sub-monolayers of a second material into a Pt film to take advantage of strong interfacial scattering. However, raising $\rho_{xx}$ via any of these approaches eventually results in a rapid degradation of the dampinglike SOT efficiency per applied electric field $\xi_{DL}^E = (2e/h) T_{int}\sigma_{SH}$, which may set a practical limit to which $\xi_{DL}^j = \xi_{DL}^E \rho_{xx}$ can be enhanced via these approaches. Insights into the mechanisms of such degradation of $\xi_{DL}^E$ and $\sigma_{SH}$ are the key for developing new effective techniques to optimize $\xi_{DL}^E$ for high-performance SOT applications through raising $\rho_{xx}$ without avoidable degradation of $\sigma_{SH}$.

In this work, we report the evolution of the spin Hall effect (SHE) of Pt achieved with the progressive insertion of multiple sub-monolayer (0.2 nm) layers of Ti into the Pt films. These insertions resulted in increases in $\rho_{xx}$ due to strong interfacial scattering but did not materially degrade the basic face-centered cubic (fcc) order of Pt. We surmise that this latter is the result of the almost identical atomic radii of Ti and Pt. At the optimum density of Ti insertion layers, we achieved a maximum $\theta_{SH} \approx 0.8$ and $\xi_{DL}^E \approx 0.35$ as measured with a thin Co SOT detector layer, while increasing $\rho_{xx}$ from 26.5 (no Ti insertion layers) to 90 μΩ cm. Upon further increasing the insertion layer density $\rho_{xx}$ continued to increase quasi-linearly with insertion layer density, but $\xi_{DL}^j$ begins to slowly decrease due to a more rapid decrease in $\sigma_{SH}$. We establish that this reduction of $\sigma_{SH}$ is mainly due to the effect of the shortening of carrier lifetime, while is insensitive to the strain and the moderate interruption of crystal order of Pt.

The spin Hall ratio and spin torque of magnetic stacks of [Pt d/Ti 0.2]$_m$/Pt d/Co t (numbers are layer thicknesses in nm) with (m+1)d=6 nm and m=0, 1, 3, 5, 7, 9, and 11, respectively, can be maximized as follows. Each sample was sputter-deposited onto Si/SiO$_2$ substrates with a 1 nm Ta seed layer and a capping layer of MgO 2.0/Ta 1.5 bilayers. We chose t=1.9 nm for m=0 and 1.3 nm for m≥1 to assure that the Co layer is thick enough to be fully in-plane magnetized as well as being thin enough to have a strong dampinglike effective SOT field ($H_{DL}$) during the harmonics response measurement. As determined by vibrating sample magnetometry, the effective saturation magnetization ($M_s^{eff}$) of the as-grown Co films, the total moment averaged over the volume of the Co films, are 1180-1250 emu/cc, depending on the details of the sample interfaces.

FIGS. 15A-15E show (a) $\xi_{DL}^E$, $\sigma_{SH}$, (b) $\xi_{DL}^j$, $\theta_{SH}$, (c) $\rho_{xx}$, (d) $\lambda_s$, and (d) the spin transparency for Pt/Ti multilayers with different m.

Figures 15A, 15B, 15C, 15D, 15E:
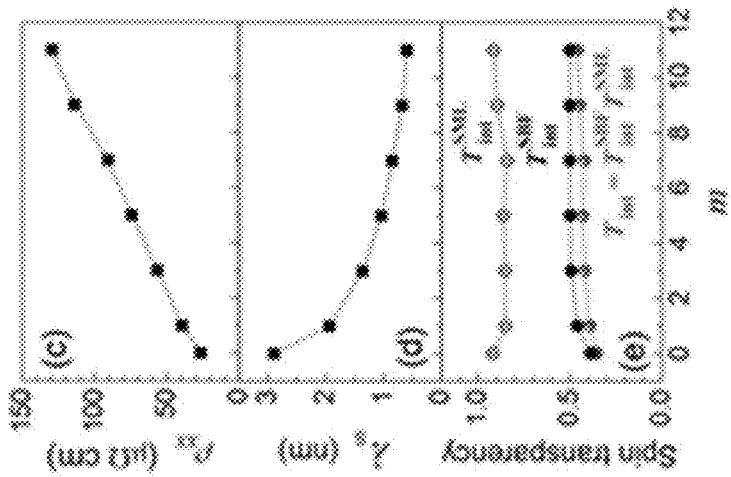
FIGS. 15A-15E show (a) $\xi_{DL}^E$, $\sigma_{SH}$, (b) $\xi_{DL}^j$, $\theta_{SH}$, (c) $\rho_{xx}$, (d) $\lambda_s$, and (d) the spin transparency for Pt/Ti multilayers with different m.

Using the values of $H_{DL}$ as determined in Supplementary Materials, we calculated SOT efficiencies for the [Pt d/Ti 0.2]$_m$/Pt d/Co t samples via $\xi_{DL}^E = (2e/h)\mu_0 M_s^{eff} tH_{DL}/E$ and $\xi_{DL}^j = (2e/h)\mu_0 M_s^{eff} tH_{DL}\rho_{xx}/E$, where $\mu_0$ is the permeability of vacuum, E=66.7 kV/m is the bias field, and $\rho_{xx}$ for each Pt/Ti multilayer sample was determined by measuring the conductance enhancement of the stack relative to the reference stack with no Pt/Ti multilayer. Here we use $M_s^{eff}$ in the calculation of the SOT efficiencies to include any contribution of possible magnetic dead layers and/or proximity magnetism at the interfaces. As shown in FIG. 15A, $\xi_{DL}^E$ drops monotonically with the Ti insertions from $6.1 \times 10^5$ $\Omega^{-1}m^{-1}$ for m=0 (d=6 nm) to $2.6 \times 10^5$ μ$\Omega^{-1}m^{-1}$ for m=11 (d=0.5 nm). The uncertainty of $\xi_{DL}^E$ due to the harmonic response measurement is less than 2%. Correspondingly, $\xi_{DL}^j$ increases quickly from ~0.16 at m=0 (d=6 nm) to a peak value of ~0.35 at m=7 (d=0.75 nm) and then drops slightly to 0.33 at m=11 (d=0.5 nm) (FIG. 15B), while $\rho_{xx}$ increases monotonically from 26.6 μΩ cm for m=0 to 192.3 μΩ cm for m=11 (FIG. 15C) due to the increased interfacial scattering added by each Ti insertion layer.

To best understand the physics responsible for the evolution of $\xi_{DL}^{j(E)}$ with Ti insertions, we need to determine the bulk values of $\theta_{SH} = \xi_{DL}^j/T_{int}$ and $\sigma_{SH} = (h/2e) \xi_{DL}^E/T_{int}$ for the Pt/Ti multilayers, which requires the quantification of $T_{int}$. It is generally considered that there are two effects that can reduce $T_{int}$ below unity: spin backflow (SBF) due to the finite spin-mixing conductance of the interface and spin memory loss (SML) due to interfacial spin-orbit scattering. According to the drift-diffusion analysis, the effect of SBF on $T_{int}$ is given by $$T_{int}^{SBF} = [1 - \text{sech}(d_{HM}/\lambda_s)][1 + G_{HM} \tanh(d_{HM}/\lambda_s)/2G_{HM/FM}^{\uparrow\downarrow}]^{-1} \quad \text{Eq. (3)}$$

where $\lambda_s$ and $G_{HM} = 1/\rho_{xx}\lambda_s$ are the spin-diffusion length and the spin conductance of the HM layer, and $G_{HM/FM}^{\uparrow\downarrow}$ is the bare spin-mixing conductance of the HM/FM interface. $G_{Pt} \approx 1.3 \times 10^{15}$ $\Omega^{-1}m^{-2}$ as determined by a thickness-dependent SOT experiment. This value of $G_{Pt}$ is consistent with that determined by spin valve experiments. The theoretical value of $G_{Pt/Co}^{\uparrow\downarrow} = 0.59 \times 10^{15}$ $\Omega^{-1}m^{-2}$ for the Pt/Co interface is in reasonable agreement with the experimental values for Pt/FM interfaces where the interfaces were engineered to reduce interfacial spin-orbit coupling (ISOC) and thereby minimize SML and two-magnon scattering. Assuming a dominant Elliot-Yafet spin relaxation mechanism, we determined $\lambda_s$ and $T_{int}^{SBF}$ of the interface between the Co and Pt/Ti multilayers in FIGS. 15D and 15E, respectively. Due to the rapid increase in $\rho_{xx}$, $\lambda_s$ drops quickly from 2.9 nm for m=0 (single Pt layer) to 0.6 nm for m=11 (FIG. 15D). This places the multilayers in the bulk limit, $T_{int}^{SBF} = 0.5$, for M≥3 (see FIG. 15E). Recent work has also established that the SML scales linearly with the interfacial perpendicular magnetic anisotropy energy density ($K_s$) of the HM/FM interface, which indicates the strength of ISOC. Specifically, $T_{int}^{SML} \approx 1-0.23 K_s$ for the in-plane magnetized Pt/Co interface with $K_s$ in erg/cm². Our [Pt d/Ti 0.2]$_m$/Pt d/Co samples were deposited in a manner to minimize $K_s$ of the Pt/Co interfaces which we determined to range between 0.36 and 0.65 erg/cm² as m was varied (see Supplementary Material). This indicates a relatively weak ISOC and a SML which at the maximum would result in less than a 15% attenuation (FIG. 15E).

Figure 16A:
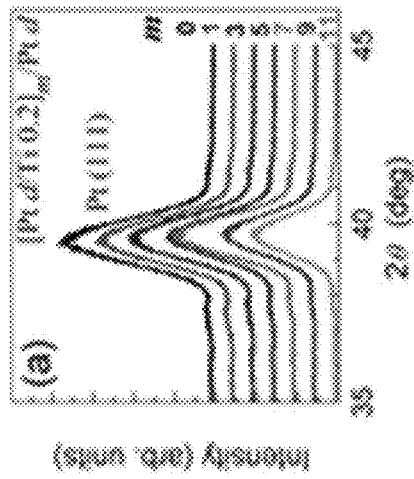
FIG. 16A shows X-ray diffraction θ-2θ patterns for [Pt d/Ti 0.2]$_m$/Pt d.
Figure 16B:
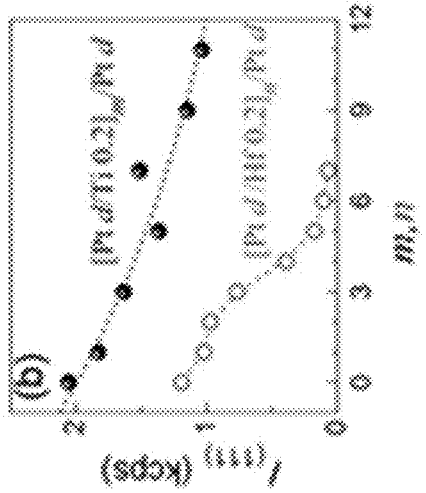
FIG. 16B shows the integrated intensity of Pt (111) peak and FIG. 16C shows lattice plane spacing of Pt (111) for [Pt d/Ti 0.2]$_m$/Pt d and for [Pt d/Hf 0.2]$_n$/Pt d, with total Pt thickness d(m+1)≈6 nm for Pt/Ti multilayers and d(n+1) 4 nm for Pt/Hf multilayers.
Figure 16C:
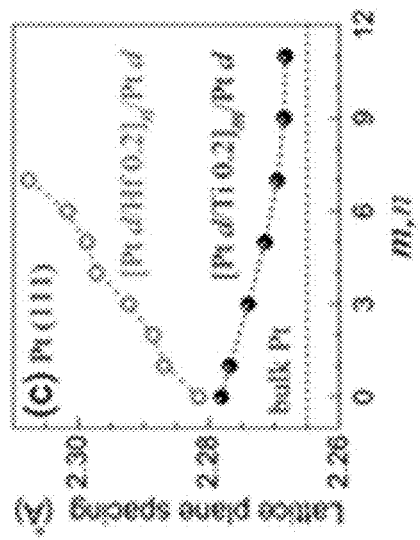
Figure 16D:
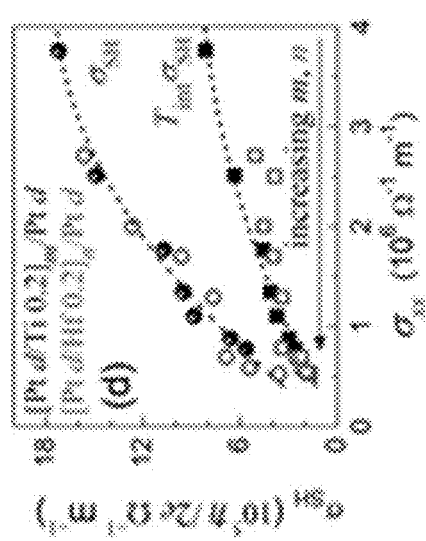
FIG. 16D shows scaling of $\sigma_{SH}$ with $\sigma_{xx}$ for [Pt d/Ti 0.2]$_m$/Pt d (solid, black) and for [Pt d/Hf 0.2]$_n$/Pt d (red, open), indicating the dominating role of carrier lifetime in degradation of $\sigma_{SH}$.

FIG. 16A shows X-ray diffraction θ-2θ patterns for [Pt d/Ti 0.2]$_m$/Pt d. FIG. 16B shows the integrated intensity of Pt (111) peak and FIG. 16C shows lattice plane spacing of Pt (111) for [Pt d/Ti 0.2]$_m$/Pt d and for [Pt d/Hf 0.2]$_n$/Pt d, with total Pt thickness d(m+1)≈6 nm for Pt/Ti multilayers and d(n+1) 4 nm for Pt/Hf multilayers. FIG. 16D shows scaling of $\sigma_{SH}$ with $\sigma_{xx}$ for [Pt d/Ti 0.2]$_m$/Pt d (solid, black) and for [Pt d/Hf 0.2]$_n$/Pt d (red, open), indicating the dominating role of carrier lifetime in degradation of $\sigma_{SH}$.

From this determination of $T_{int} \approx T_{int}^{SBF} T_{int}^{SML}$, we obtain the internal $\theta_{SH}$ and $\sigma_{SH}$ for each different multilayer sample. As plotted in FIGS. 16A-16B, NH is enhanced from 0.46 for the pure Pt sample (m=0) to 0.8 for m=7 while $\sigma_{SH}$ is continually degraded by increasing m (by a factor of 3 for m=11). Thus while $\theta_{SH}$ is increased by raising $\rho_{xx}$ of the HM the increase is much less than would be expected from a metal in the clean intrinsic limit where $\theta_{SH}$ should increase linearly with $\rho_{xx}$ if $\sigma_{SH}$ is constant.

The possible mechanisms for the decrease of $\sigma_{SH}$ with increasing m (decreasing d) are the key to understand what determines the maximum attainable value of $\theta_{SH}$. We consider three effects that may affect the changes in the intrinsic $\sigma_{SH}$ as progressively more sub-monolayers of Ti are inserted into the Pt: degradation of the Pt crystal order, thin film strain that distorts the fcc symmetry and hence modifies the Pt band structure, and electron self-energy effects due to a shortened carrier lifetime that places the material into, or further into, the dirty-metal regime. As revealed by the x-ray diffraction results in FIGS. 16A-16B, there is a 50% reduction of the intensity of the Pt (111) diffraction peak ($I_{(111)}$) due to the increasing Ti insertions, which may be indicative of a moderate disruption of the fcc crystal order of Pt by the insertion layers. However, there seems to be no clear direct correlation between this degree of structural disruption with the degradation of $\sigma_{SH}$. In the case of the Pt/Ti multilayers studied here where Ti has a close atomic radius to Pt, $I_{(111)}$ decreases only by 50% while $\sigma_{SH}$ is reduced by 75%. This is in contrast to the result of a previous study of Pt/Hf multilayers, where $\sigma_{SH}$ was reduced only by 65% when $I_{(111)}$ was reduced by 95%. With regard to possible strain effects, recent first-principles calculations have indicated that in-plane compressive strain can significantly reduce $\sigma_{SH}$ of Pt. As shown in FIG. 16C, the as-grown pure Pt samples are compressively strained in the film plane as indicated by the 0.6% increase of out-of-plane lattice plane spacing compared to that of the bulk Pt (111). We find that this strain is primarily the result of the low-pressure sputter deposition of the Pt onto the oxidized Si substrate, while the deposition of the Co overlayer adds a small additional contribution. As indicated in FIG. 16C, the in-plane compressive strain decreases with the increasing number of Ti insertions, while, in contrast, in the previous study of Hf insertions the in-plane compressive strain increased with increasing numbers of Hf layers. These opposite changes in strain indicate that the similar decreases of $\sigma_{SH}$ that occur with both Ti or Hf insertions cannot be readily explained by strain distortion from the ideal fcc lattice structure. Unambiguous evidence that the intrinsic $\sigma_{SH}$ of Pt is rather robust against the moderate disorder (FIG. 16B) and the strain (FIG. 16C) is the essentially identical scaling of $\sigma_{SH}$ with the electrical conductivity $\sigma_{xx}$ for Ti insertions (black dots) and Hf insertions (red circles), as shown in FIG. 16D.

The exclusion of the degradation of the Pt crystal order and the effects of tensile strain leaves the shortening of the carrier lifetime as the most likely mechanism for the $\sigma_{SH}$ decrease. A rapid decrease of the intrinsic $\sigma_{SH}$ due to the shortening of the carrier lifetime has been predicted for the dirty-metal regime even if the crystalline order is fully maintained, with the transition point predicted as being $\rho_{xx}$ 30 μΩ cm for Pt. This appears to explain our experimental results rather well. For both Ti and Hf insertions (see FIG. 16D), as the electrical conductivity $\sigma_{xx}$, which is proportional to the carrier lifetime, is decreased below the upper limit of the pure Pt film, $\sigma_{SH}$ decreases at first gradually and then more rapidly with the decreasing $\sigma_{xx}$. This variation of $\sigma_{SH}$ with $\sigma_{xx}$ is quite consistent with the predicted behavior in the dirty metal, short carrier lifetime, regime, unambiguously revealing that the shortening of carrier lifetime is the dominant mechanism of the reduction of $\sigma_{SH}$ in the low $\sigma_{xx}$ (high $\rho_{xx}$) regime.

As indicated theoretically, the high $\rho_{xx}$ dirty metal behavior of $\sigma_{SH}$ of Pt sets the limit to which $\theta_{SH} = \sigma_{SH}/\sigma_{xx}$ ($\xi_{DL}^{j=T}{}_{int}\sigma_{SH}/\sigma_{xx}$) can be enhanced via increasing the resistivity of Pt based spin Hall material. Since this reduction of $\sigma_{SH}$ cannot be avoided in any process that shortens the carrier lifetime, it sets a limit to which $\theta_{SH}$ (DL) of Pt can be enhanced by increasing the scattering rate. Although the exact theoretical limit of $\theta_{SH}$ and the corresponding resistivity have remained unsettled, the maximum value of $\theta_{SH} \approx 0.8$ that we have obtained for [Pt 0.75/Ti 0.2]$_7$/Pt 0.75 indicates an upper bound for $\theta_{SH}$ of at least 0.8 for the intrinsic SHE of Pt. The corresponding maximum $\xi_{DL}^j$ is ≥0.4 ($T_{int}^{SBF}$=0.5, $T_{int}^{SML}$=1).

In this example, only the SHE of the HMs is considered as a significant source of the measured SOTs. This is because in the Pt-based HM/FM systems, there is no evidence indicating a significant interfacial spin-galvanic effect, while the SHE of the HM is consistently found to be the dominant source of the measured SOTs. For the Pt-based HM/FM systems, $\xi_{DL}^E$ varies first slowly and then decreases rapidly towards zero as $d_{HM}$ is reduced from being far larger than $\lambda_s$ of the HM to zero, a clear indication of the spin diffusion behavior expected from a dominant bulk SHE. Moreover, $\xi_{DL}^j$ closely tracks $\rho_{xx}$, which strongly indicates that $\theta_{SH}$ of the HMs increases with $\rho_{xx}$ due to the intrinsic SHE. We also find that $\xi_{DL}^E$ can be reduced by at least a factor of two due to increasing SML as the result of thermal annealing. ISOC in HM/FM systems degrades the incident spin current from the bulk of the HM, via SML, rather than generates so-called interfacial SOTs.

FIG. 14B compares the experimental values of $\xi_{DL}^j$ and $\rho_{xx}$ for various strong spin Hall metals. $\xi_{DL}^j \approx 0.35$ ($\rho_{xx}$=90 μΩ cm) for the optimum Pt/Ti multilayers is comparable to that of optimum Pt/Hf multilayers (144 μΩ cm) and the best values for β-W (200-300 μΩ cm), whereas it is higher than that for less-resistive Pt (20-50 μΩ cm), Pd$_{0.25}$Pt$_{0.75}$ (57 μΩ cm), Au$_{0.25}$Pt$_{0.75}$ (83 μΩ cm), Pt$_{0.6}$(MgO)$_{0.4}$ (74 μΩ cm), and more resistive Pt$_{0.85}$Hf$_{0.15}$, β-Ta. As we calculated in Supplementary Materials, SOT-MRAMs based on the optimum Pt/Ti multilayers are also much more energy-efficient than the conventional HMs (Pt, Ta, and W) and the topological insulators Bi$_x$Se$_{1-x}$ and (Bi,Se)$_2$Te$_3$. Therefore, the multilayer [Pt 0.75/Ti 0.2]$_7$/Pt 0.75 with giant $\xi_{DL}$ and relatively low $\rho_{xx}$ at the same time is a very compelling spin Hall material for SOT applications that require high current/energy efficiency ($I_{write} \propto (1+s)/\xi_{DL}^j$, $P_{write} \propto [(1+s)/\xi_{DL}^j]^2 \rho_{xx}$), low impedance ($\propto \rho_{xx}$), and high endurance.

Based on a systematical study on the evolution of the SHE and $\rho_{xx}$ of Pt with interfacial scattering from sub-monolayer Ti insertion layers, an approximate doubling of $\xi_{DL}^j$ is obtained when $\rho_{xx}$ was increased from 26.5 to 130 μΩ cm via the strong interfacial scattering that was the result of the insertion of increasing numbers of sub-monolayers of Ti. At the same time there was a factor of 3 reduction of $\sigma_{SH}$ of the material. This reduction of $\sigma_{SH}$ is mainly due to the effect of the decrease of carrier lifetime, whereas $\sigma_{SH}$ of the fcc Pt is insensitive to the strain and the moderate interruption of crystal order caused by the Ti sub-monolayer insertions. Since the reduction of $\sigma_{SH}$ with shortening carrier lifetime is an inherent characteristic of the intrinsic SHE of Pt, it sets an effective upper bound of $\xi_{DL}^j \geq 0.4$ ($\theta_{SH} \geq 0.8$) for materials where Berry curvature of the Pt band structure is the source of the SHE. Some embodiments of the disclosed technology may include a highly-efficient spin-current generator, [Pt 0.75/Ti 0.2]$_7$/Pt 0.75, that combines a giant $\xi_{DL}^j$ with a relatively low $\rho_{xx}$ (90 μΩ cm), and good compatibility with integration technology (e.g., simple growth with standard sputtering techniques on Si substrates) for development of low-power, low-impedance, and high-endurance magnetic memories, oscillators, and logic.

Figures 17A, 17B, 17C, 17D:
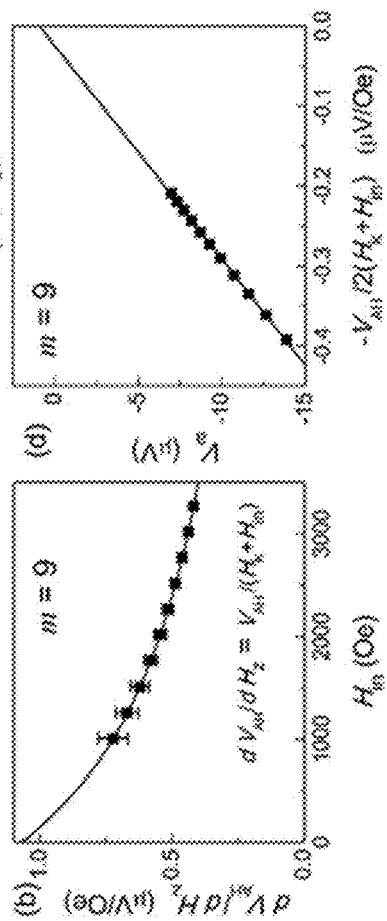
FIG. 17A shows schematic of the "in-plane" harmonic response measurement.
FIGS. 17B-17D shows (b) $dV_{AH}/dH_z$ versus $H_{in}$, (c) $V_{2\omega}$ versus p ($H_{in}$=3 kOe), and (d) $V_a$ versus $-V_{AH}/2(H_{in}+H_k)$ for [Pt 0.6/Ti 0.2]9/Pt 0.6/Co 1.3. The solid lines in (b)-(d) refer to the best fits of the data to $dV_{AH}/dH_z = V_{AH} = (H_{in}+H_k)$, $V_{2\omega} = V_a \cos\varphi + V_p \cos\varphi \cos 2\varphi$, and $V_a = H_{DL} V_{AH}/2(H_{in}+H_k) + V_{ANE}$, respectively.

FIG. 17A shows schematic of the "in-plane" harmonic response measurement. FIGS. 17B-17D shows (b) $dV_{AH}/dH_z$ versus $H_{in}$, (c) $V_{2\omega}$ versus $\varphi$ ($H_{in}$=3 kOe), and (d) $V_a$ versus $-V_{AH}/2(H_{in}+H_k)$ for [Pt 0.6/Ti 0.2]9/Pt 0.6/Co 1.3. The solid lines in (b)-(d) refer to the best fits of the data to $dV_{AH}/dH_z = V_{AH}/(H_{in}+H_k)$, $V_{2\omega} = V_a \cos \varphi + V_p \cos \varphi \cos 2\varphi$, and $V_a = H_{DL}V_{AH}/2(H_{in}+H_k) + V_{ANE}$, respectively.

To perform the "in-plane" harmonic response measurement, the samples were patterned into 5×60 μm² Hall bars by photolithography and ion milling, followed by deposition of 5 nm Ti and 150 nm Pt as contacts. Within the macrospin approximation, $H_{DL}$ for in-plane magnetized HM/FM samples can be determined from the angle ($\varphi$) dependence of the second harmonic response voltage ($V_{2\omega}$) under the in-plane bias magnetic field ($H_{in}$), i.e. $V_{2\omega} = V_a \cos \varphi + V_p \cos \varphi \cos 2\varphi$, where $V_a = -V_{AH}H_{DL}/2(H_{in}+H_k) + V_{ANE}$, with $V_{AH}$, $V_{ANE}$, and $H_k$ being the anomalous Hall voltage, the anomalous Nernst effect, and the perpendicular anisotropy field. The $V_p$ term is the contribution of the fieldlike SOT and the Oersted field. We used a sinusoidal electric bias field with a constant magnitude of E=66.7 kV/m as the excitation for the harmonic response measurement. As shown in FIG. 17B, we first determined $V_{AH}$ and $H_k$ simultaneously by fitting the Hun dependence of $dV_{AH}/dH_z$ to the relation $dV_{AH}/dH_z = V_{AH}/(H_{in}+H_k)$, where $dV_{AH}/dH_z$ is the derivative of $V_{AH}$ with respect to the swept out-of-plane field (Hz) under different fixed in-plane bias field $H_{in}$. $V_a$ for each magnitude of Hun was separated out from the $\varphi$ dependence of $V_{2\omega}$ (FIG. 17C). As shown in FIG. 17D, the linear fit of $V_a$ vs $V_{AH}/2(H_{in}+H_k)$ gives the value of $H_{DL}$ of 5.6×10$^{-4}$ Oe m/V (the slope) and a negligible thermal effect ($V_{ANE}$<0.9 μV from the intercept).

Figure 18:
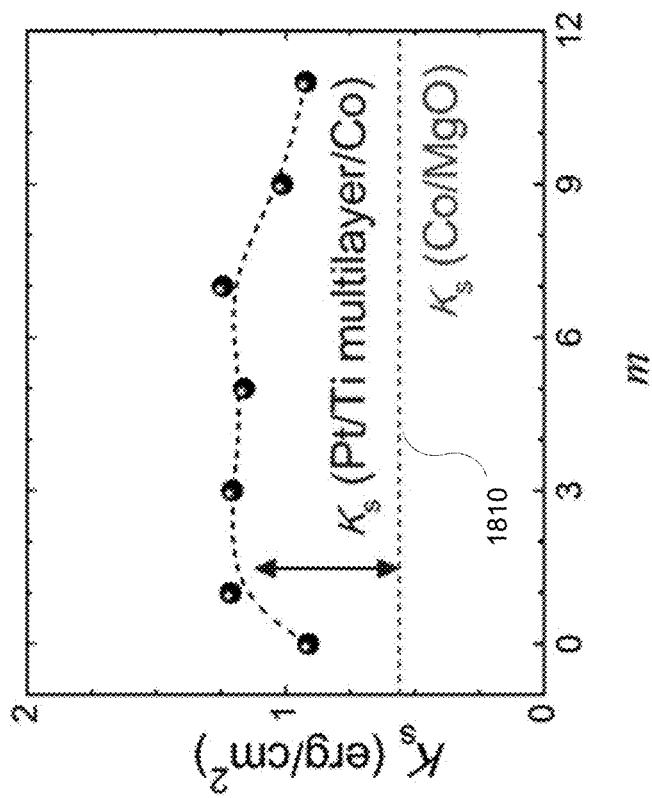
FIG. 18 shows interfacial magnetic anisotropy energy density ($K_s$) of [Pt d/Ti 0.2]$_m$/Pt d/Co t (black dots) plotted as a function of the insertion of Ti (m).

FIG. 18 shows interfacial magnetic anisotropy energy density ($K_s$) of [Pt d/Ti 0.2]$_m$/Pt d/Co t (black dots) plotted as a function of the insertion of Ti (m). $K_s$ was determined using the relation $H_k \approx 4\pi M_s - 2K_s/M_st$, where $H_k$ was determined from the harmonics response measurement (see FIG. 17B). The line 1810 indicates the $K_s$ value of 0.58 erg/cm² for the Co/MgO interface. The difference between $K_s$ (black dots) and $K_s$ (Co/MgO) is the contribution from the Pt—Ti multilayer/Co interface.

Figure 19:
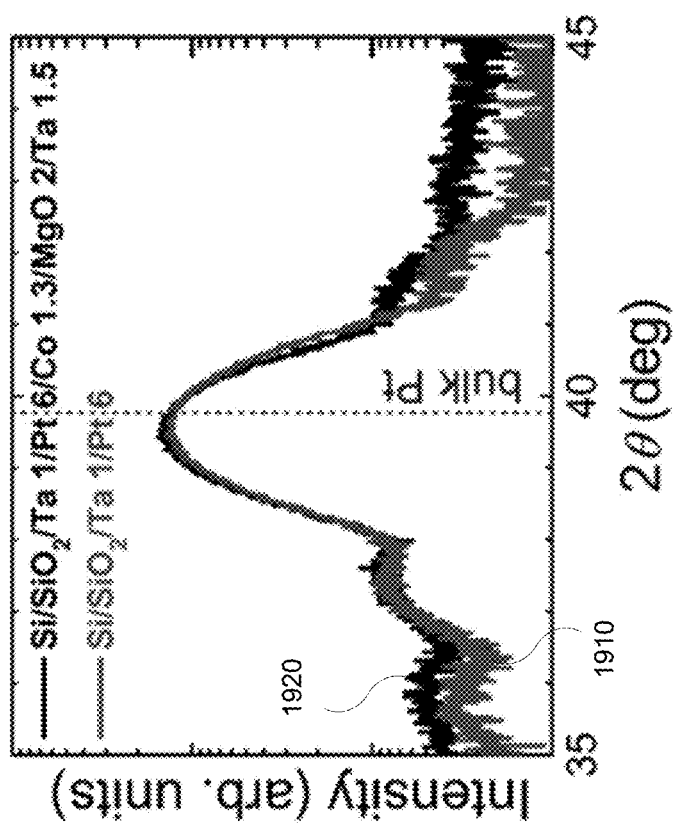
FIG. 19 shows X-ray diffraction θ-2θ patterns for as-grown Pt 6 (1910) and Pt 6/Co 1.3/MgO 2/Ta 1.5 (1920) samples grown on 1 nm Ta seeded Si/SiO$_2$ substrate by sputtering.

FIG. 19 shows X-ray diffraction θ-2θ patterns for as-grown Pt 6 (1910) and Pt 6/Co 1.3/MgO 2/Ta 1.5 (1920) samples grown on 1 nm Ta seeded Si/SiO$_2$ substrate by sputtering. The blue dashed line represents the (111) diffraction peak position for unstrained bulk Pt. The shifts of (111) diffraction peak with respect to that expected for bulk Pt indicates that the in-plane compressive strain in the Pt layer is mostly formed during sputtering growth on the substrate with a small contribution from the Co overlayer. The capping layers of MgO 2/Ta 1.5 are amorphous as indicated by tunneling electron microscopy images and have no contribution to x-ray diffraction signals.

Figure 20:
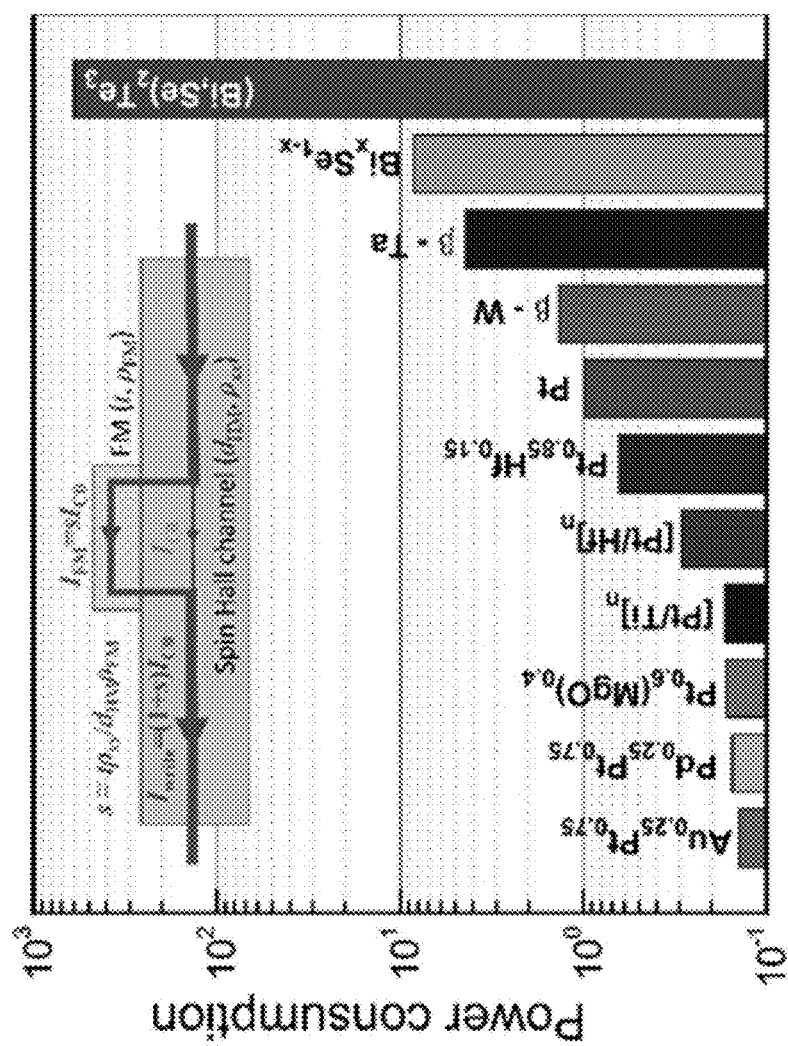
FIG. 20 shows calculated power consumption for in-plane spin-orbit-torque MRAM devices based on various strong spin Hall materials.

FIG. 20 shows calculated power consumption for in-plane spin-orbit-torque MRAM devices based on various strong spin Hall materials listed in Table 3. Values are normalized to low-resistivity Pt. Here power is calculated as $P_{write} \propto [(1+s)/\xi_{DL}^j]^2 \rho_{xx}$, where $\xi_{DL}$ is dampinglike spin-orbit torque efficiency per unit bias current density, and $s \approx t\rho_{xx}/d_{HM}\rho_{FM}$ is the ratio of the current shunting in the FM layer (with thickness t=1.6 nm and resistivity $\rho_{FM}$=130 μΩ cm) over the current flow in the spin Hall channel (with thickness $d_{HM}$=4 nm and resistivity $\rho_{xx}$).

TABLE 3

Dampinglike spin-orbit torque efficiency per unit bias current density ($\xi_{DL}^j$), the resistivity ($\rho_{xx}$), and current shunting ratio $s \approx t\rho_{xx}/d_{HM}\rho_{FM}$ for various strong spin Hall materials.

| Spin Hall material | $\rho_{xx}$ (μΩ cm) | $\xi_{DL}^j$ | s |
|---|---|---|---|
| Au$_{0.25}$Pt$_{0.75}$ | 83 | 0.35 | 0.25538 |
| Pt$_{0.25}$Pd$_{0.75}$ | 56.5 | 0.26 | 0.17385 |
| Pt$_{0.6}$(MgO)$_{0.4}$ | 74 | 0.3 | 0.22769 |
| [Pt/Ti]$_n$ | 90 | 0.34 | 0.27692 |
| [Pt/Hf]$_n$ | 144 | 0.37 | 0.44308 |
| Pt$_{0.85}$Hf$_{0.15}$ | 130 | 0.23 | 0.4 |
| Pt | 20 | 0.055 | 0.06154 |
| β-W | 300 | 0.33 | 0.92308 |
| β-Ta | 190 | 0.12 | 0.58462 |
| Bi$_x$Se$_{1-x}$ | 13000 | 18.6 | 40 |
| (Bi,Se)$_2$Te$_3$ | 4020 | 0.4 | 12.36923 | t = 1.6 nm, $\rho_{FM}$ = 130 μΩ cm, $d_{HM}$ = 4 nm.

The multilayer spin-Hall-effect structure implemented based on some embodiments of the disclosed technology can be implemented by doping the Pt layer with MgO. More than a decade after the first theoretical and experimental studies of the spin Hall conductivity (SHC) of Pt, both its amplitude and dominant origin remain in dispute. Resolving these questions is of fundamental importance for advancing understanding of very strong spin-orbit effects in conducting systems and for maximizing the spin Hall effect (SHE) for energy-efficient spintronics applications. Here we report the incorporation of MgO scattering centers to controllably vary the degree of long-range crystalline order of the Pt films (from a well-ordered fcc texture to a nearly amorphous structure) and consequently the corresponding band structure and quasi-particle lifetime. From this variation, we establish that the dominant mechanism for the giant SHC in Pt is the bulk intrinsic SHE, whereas its amplitude is considerably underestimated by the available theoretical calculations. Our work also establishes a compelling new spin Hall material Pt$_{0.6}$(MgO)$_{0.4}$ that combines a giant spin Hall ratio (>0.3), with a low resistivity, a strong Dzyaloshinskii-Moriya interaction, and good integration compatibility for spintronics technology.

Since the first theoretical and experimental efforts on its spin Hall conductivity (SHC) a decade ago, platinum (Pt), the archetypal spin Hall material, has been central in generating and detecting pure spin currents and key in establishing most of the recent spin-orbit-coupling phenomena. However, the correct physical understanding of the SHC of Pt has remained unresolved, both qualitatively and quantitatively, despite the extensive attention that has been given to this intriguing condensed matter physics problem. The bulk spin Hall effect (SHE) of a heavy metal (HM) has three possible contributions, i.e. the intrinsic contribution from the band structure and the extrinsic skew-scattering and side jump contributions from spin-orbit-interaction-related defect and impurity scattering. Theoretically, available first-principles calculations of the intrinsic SHC $\sigma_{SH}$ of Pt from the Berry curvature in the conduction band structure differ by more than a factor of 10 in the predicted room temperature values (i.e. $\sigma_{SH}$=(0.4-4.5)×10$^5$ (h/2e)$\Omega^{-1}$m$^{-1}$), due to the markedly different predictions as to whether there is strong temperature dependence in $\sigma_{SH}$. A tight-binding model calculation for Pt predicts a 0-K Pt SHC that is a factor of ~1.7 less than that from first-principles calculations and also predicts a degradation of the intrinsic SHC by decreasing quasi-particle lifetime (increasing impurity scattering), at first slowly, but then rapidly in the high resistivity range (e.g. the calculated intrinsic SHC decreases from 2.6×10$^5$, 1.6×10$^5$, to 0.1×10$^5$ (h/2e) $\Omega^{-1}$m$^{-1}$ for Pt resistivity ($\rho_{xx}$) increases from 8, 65 to 200 μΩ cm).

Experimentally, there is a strong disagreement as to both the strength (i.e. (3.2-23.6)×10$^5$ (h/2e) $\Omega^{-1}$m$^{-1}$)) and the dominant physical source for $\sigma_{SH}$ in Pt. Some experiments are interpreted as indicating that the main contribution to the Pt SHC is extrinsic bulk skew scattering and that therefore the spin Hall ratio ($\theta_{SH}$=(2e/h)$\sigma_{SH}\rho_{xx}$) is independent of $\rho_{xx}$, with $\sigma_{SH}$ varying inversely with $\rho_{xx}$. Other works suggested the side jump or/and intrinsic contribution of the bulk SHE providing the dominant contribution to $\sigma_{SH}$ of Pt by examining the correlation between $\sigma_{SH}$ and $\rho_{xx}$ by changing thickness or temperature or by alloying. However, the definitive determination of the mechanism and strength of the Pt SHC in these efforts are inconclusive. The thickness-dependent study cannot distinguish between intrinsic and side jump SHE. The temperature-dependent inverse spin Hall studies assumed an infinite spin-mixing conductance (i.e., zero spin backflow) at the Pt/FM interfaces and ignored the theoretically predicted dependence of the intrinsic SHC on temperature and on the quasi-particle lifetime. Meanwhile, both the magnitudes and the temperature-induced variations of $\sigma_{SH}$ of Pt are rather comparable with the uncertainty of $\sigma_{SH}$. In Pt-based alloys (e.g. Au$_{1-x}$Pt$_x$) where a second fcc HM element is substituted into Pt lattice, the source of the SHC is the new alloy phase rather than Pt as indicated by the greater SHC in the optimized Au$_{1-x}$Pt$_x$ phase than that in Pt and there is significant change in the tensile strain which can significantly reduce the SHC of Pt as indicated by first-principles calculations. Notably, when discussing the mechanism of the SHC, the alloying studies also did not take into account the influences of the $\rho_{xx}$ variations on the spin backflow (spin diffusion length) at the Pt/FM interfaces and the quasi-particle lifetime, which certainly degrade the accuracy in defining the SHC strength in Pt. Finally, there have also been experiments suggesting a significant interfacial SHC. Clarifying the underlying physics of the giant SHC of Pt is both of fundamental interest and technological urgency (e.g. for maximizing $\theta_{SH}$ for low-power device applications). Note that Pt and certain Pt-rich alloys are, arguably, the most attractive class of spin Hall metals for energy-efficient applications because their combination of the highest SHC of any known class of metals with comparatively low $\rho_{xx}$ provides a giant $\theta_{SH}$ and minimal current shunting into an adjacent ferromagnetic metal (FM) at the same time.

The multilayer spin-Hall-effect structure implemented based on some embodiments of the disclosed technology can be implemented based on a systematic variation of the degree of long-range crystalline ordering (LRCO) of a Pt film, from a well-ordered fcc texture to a nearly amorphous structure, with increasing MgO impurity concentration, which further provides a tuning of the corresponding Pt band structure and a concomitant variation of the Pt quasi-particle lifetime (indicated by $\rho_{xx}$). The SHC varies directly with the degree of LRCO of the Pt lattice and shows a dependence on the quasi-particle lifetime that is consistent with the tight-binding model prediction for the intrinsic SHC of Pt. In addition, the dampinglike spin-orbit torque (SOT) and thus $\theta_{SH}$ scale closely but not exactly in proportion with $\rho_{xx}$ due to the gradual changes in the SHC that occur along with the strong increase in $\rho_{xx}$ as the LRCO is reduced. These results may establish that the dominant source of the giant SHC in Pt is the intrinsic contribution related to the Berry curvature in the Pt band structure. Furthermore, the large experimental SHC values for Pt indicate that the existing first-principles and tight-binding theories are underestimating the true intrinsic SHC in Pt, particularly so if model calculations of spin backflow and/or spin memory loss at the Pt/Co interface are at least approximately applicable to the experimental situation. Finally, by utilizing this intrinsic SHE mechanism of Pt, we achieve a 100% enhancement in the dampinglike SOT efficiency ($\xi_{DL}$), thus $\theta_{SH}$, by increasing $\rho_{xx}$ via the incorporation of MgO scatters into Pt. This establishes a new ternary spin Hall material Pt$_{0.6}$(MgO)$_{0.4}$ that is very compelling for low-power SOT device technology because of its combination of a giant $\theta_{SH}$, a low $\rho_{xx}$, a large Dzyaloshinskii-Moriya interaction (DMI), and easy growth on silicon substrates by sputtering.

Figures 21A, 21B, 21C:
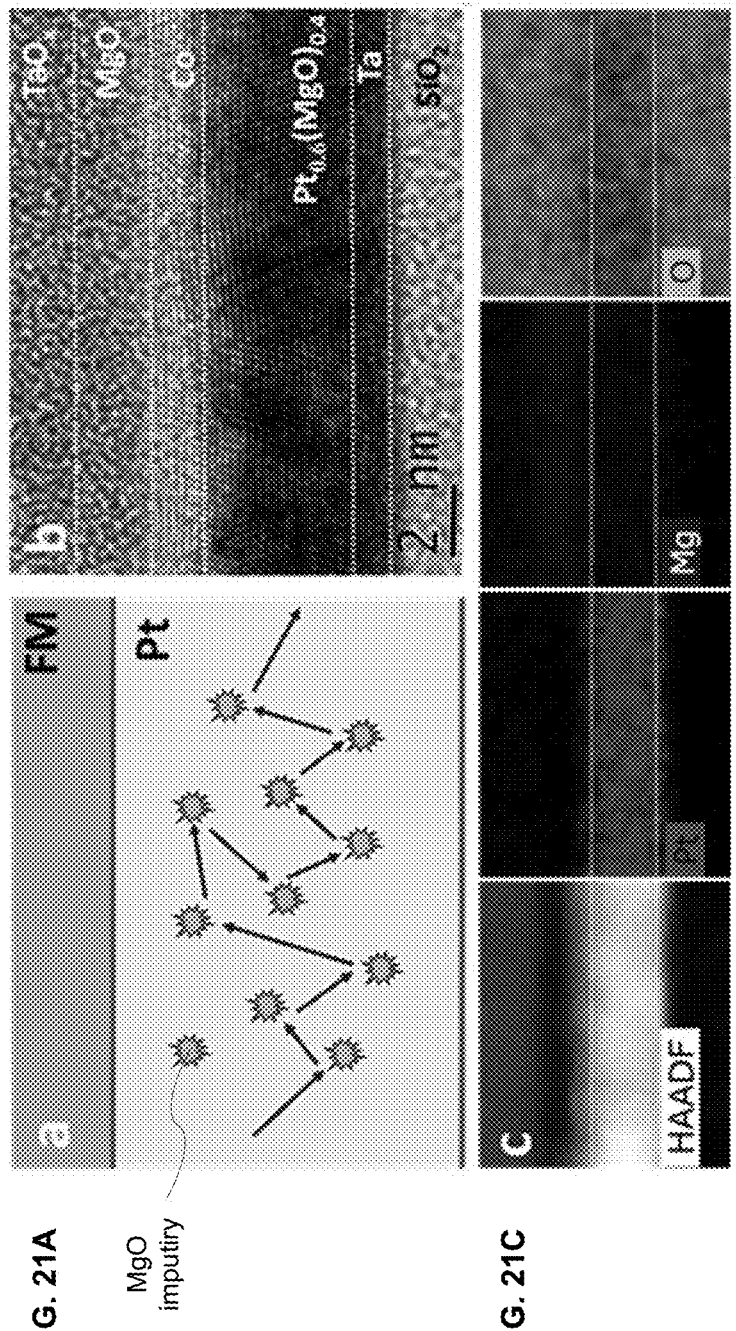
FIG. 21A shows schematic of enhanced electron scattering in Pt by MgO impurities.
FIG. 21B shows cross-sectional high-resolution TEM image (bright field) of a magnetic stack of Ta 1/Pt$_{0.6}$(MgO)$_{0.4}$ 4/Co 1.4/MgO 2/TaO$_x$ 1.5.
FIG. 21C shows cross-sectional HAADF image and EDS mapping of Pt, Mg, and O. The two dashed lines represent the upper and lower interfaces of the Pt$_{1-x}$(MgO)$_x$ layer.

FIG. 21A shows schematic of enhanced electron scattering in Pt by MgO impurities.

FIG. 21B shows cross-sectional high-resolution TEM image (bright field) of a magnetic stack of Ta 1/Pt$_{0.6}$(MgO)$_{0.4}$ 4/Co 1.4/MgO 2/TaO$_x$ 1.5. FIG. 21C shows cross-sectional HAADF image and EDS mapping of Pt, Mg, and O. The two dashed lines represent the upper and lower interfaces of the Pt$_{1-x}$(MgO)$_x$ layer.

FIGS. 22A-22E show degradation of LRCO and enhancement of electron scattering by MgO incorporation. Specifically, FIG. 22A shows XPS spectrum for Pt 4f peaks in a Pt$_{0.6}$(MgO)$_{0.4}$ layer (black line) and a pure Pt layer (red line), indicating non-oxidization of Pt in both cases, FIG. 22B shows XRD θ-2θ patterns for Pt$_{1-x}$(MgO)$_x$/Co bilayers with different x, indicating the tuning of the LRCO of Pt (within each crystal grain) from fcc to be almost amorphous with increasing MgO incorporation (Insert: Cartoon schematically illustrating the effect of the interstitial MgO in degrading the LRCO of Pt). FIGS. 22C-22E show integrated intensity of the Pt (111) peak, FWHM of the Pt (111) peak, and the average resistivity of the Pt$_{1-x}$(MgO)$_x$ layer plotted as a function of Pt concentration x.

Multilayer stacks of Ta 1.0/Pt$_{1-x}$(MgO)$_x$ 4.0/Co 0.68-1.4/MgO 2.0/Ta 1.5 (numbers are thickness in nm) with MgO volume percentage x=0, 0.05, 0.1, 0.15, 0.2, 0.25, 0.3. 0.35, 0.4, and 0.5, respectively, were sputter deposited on Si/SiO$_2$ substrates. The Pt$_{1-x}$(MgO)$_x$ layer was co-sputtered from a Pt target and a MgO target. The Co magnetization (M$_s$) for these samples was measured by a vibrating sample magnetometer (VSM) to be ~1220±85 emu/cc, indicating the absence of a significant magnetic proximity effect[22] in these as-grown samples. High-resolution cross-sectional scanning transmission electron microscopy (STEM) studies of the Pt(MgO) composites (see FIG. 21B for images of a $Pt_{0.6}$ $(MgO)_{0.4}$ sample) show that the co-sputtered $Pt_{1-x}(MgO)_x$ layer has a homogeneous polycrystalline texture where the grains are ~4 nm in vertical extent and that there is no indication of the presence of MgO clusters of observable size. FIG. 21C shows cross-sectional energy-dispersive x-ray spectroscopy (EDS) Mg and O mapping of the composite material under the HAADF mode, which supports, within the resolution, the conclusion that the MgO is finely dispersed within the Pt. We find from x-ray photoemission spectroscopy (XPS) studies (FIG. 22A) that the Pt $4f_{7/2}$ and $4f_{5/2}$ peaks are located at 71.1 and 74.4 eV, respectively, in both a $Pt_{0.6}(MgO)_{0.4}$ and a pure Pt layer. In contrast, the binding energies of $4f_{7/2}$ and $4f_{5/2}$ peaks for Pt oxides are reported to be shifted to ~72.3 and ~75.8 eV for $Pt^{2+}$, and 74.0 and 77.5 eV for $Pt^{4+}$, respectively. Meanwhile, we find that the XPS peaks for Mg KLL and I 1s are shifted by ≈±0.8 eV, respectively. This clearly indicates that the Pt atoms in the $Pt_{1-x}(MgO)_x$ layers are not oxidized while the Mg atoms are oxidized, consistent with the fact that Pt has a much stronger electronegativity than Mg.

FIG. 22B shows x-ray diffraction (XRD) θ-2θ patterns of $Pt_{1-x}(MgO)_x$ 4/Co 1.4 bilayers with different x. The $Pt_{1-x}(MgO)_x$ layer shows a broad face-centered-cubic (fcc) (111) peak due to the polycrystalline texture and the small thickness. However, unlike the case for Pt alloyed with another fcc metal, the fcc (111) peak for all different x is located at the Bragg angle of Pt and does not shift with x, indicating that the diffraction is from the periodic Pt lattice and that the MgO molecules are primarily dispersed in the Pt as inter-site impurities rather than being substituted into the Pt lattice, as schematically illustrated in the cartoon in FIG. 22B. However, the Pt (111) peaks $d_0$ show dramatic broadening and weakening with increasing MgO concentration. As shown in FIGS. 22C-22E, the decreasing integrated intensity and the increasing full width at half maximum (FWHM) of the Pt (111) diffraction peak clearly indicate that the Pt LRCO in the $Pt_x(MgO)_x$ layers is monotonically weakened by increasing MgO incorporation, from well-ordered fcc texture for x=0 (pure Pt) to the nearly-amorphous structure for x=0.5. We note here that, in this XRD measurement configuration where the grain size along the film normal is the film thickness (~4 nm, see FIG. 21B), the variation of the FWHM is dominated by a variation in LRCO that is not due to a variation of the Pt grain size. While the LRCO of the fcc crystalline lattice of Pt is clearly gradually diminished by the increasing MgO content, it is also somewhat surprising how resilient the lattice periodicity is against a larger degree of MgO incorporation, until a sharp structural degradation occurs at x=0.5. This certainly indicates that for x≤0.4 the Pt band structure, which is determined by the LRCO, is only disrupted slowly toward that of amorphous Pt with increasing addition of atomic scale interstitial defects. The average resistivity for $Pt_{1-x}(MgO)_x$ was determined for each x by measuring the conductance enhancement of the corresponding stacks with respect to a reference stack with no $Pt_{1-x}(MgO)_x$ layer. As summarized in FIG. 22E, $\rho_{xx}$ for the $Pt_{1-x}(MgO)_x$ increases gradually from 33 μΩ cm at x=0 (pure Pt) to 74 μΩ cm for x=0.4, and then jumps up to 240 μΩ cm, which is qualitatively consistent with the variation in the degree of LRCO indicated by the intensity and FWHM of XRD (111) peaks. We point out that the average resistivity best describes the effective scattering strength the electrons feel when flowing in the $Pt_{1-x}(MgO)_x$ layer, whereas treating the 4 nm $Pt_{1-x}(MgO)_x$ layer as a Pt 4(1−x)/MgO 4x bilayer is definitely incorrect here.

FIG. 23A shows the experimental values of the apparent SHC ($\sigma^*_{SH}$) plotted as a function of MgO concentration (x) of the $Pt_{1-x}(MgO)_x$ layers. FIG. 23B shows comparison of $\sigma^*_{SH}$ and theoretical values for the intrinsic SHC ($\sigma_{SH}$) of Pt as a function of electrical conductivity ($\sigma xx$). FIG. 23C shows the calculated spin transparency $T_{int}$ from spin backflow model. FIG. 23D shows scaling of the experimental SHC ($\sigma_{SH}=\sigma^*_{SH}/T_{int}$) and the theoretical values for intrinsic $\sigma_{SH}$ of Pt with $\sigma_{xx}$. In FIG. 23A, the circle 2310 represents $Pt_{1-x}(MgO)_x$ 8 nm/Co system; In (a) and (b), the red dots represent $\sigma^*_{SH}=T_{int}\sigma_{SH}$ for $Pt_{1-x}(MgO)_x$ 4 nm/Co system; In (b) the black circles, blue dot, and gray squares represent $\sigma_{SH}$ of Pt predicted by tight-binding model and first-principles calculations in Refs In the following, we show that the dominant source of the Pt SHC is the intrinsic SHE. In FIG. 23A, we calculated the apparent spin Hall conductivity $\sigma_{SH}=T_{int}\sigma_{SH}=\mu_0 M_s t H_{DL}/E$ as a function of x using the experimental results for damping-like SOT effective field ($H_{DL}$) as determined from harmonic response measurements. Here $T_{int}$ (<1) is the spin transparency of the HM/FM interface is set by spin backflow and spin memory loss at the interface; $\mu_0$ and t are the permeability of vacuum and the ferromagnetic layer thickness; E=66.7 kV/m is the applied electric field. Note that the volume percentage of Pt is not involved as the HM thickness is absent in the calculation of $\sigma^*_{SH}$. Well consistent with the LRCO modified by the MgO addition, $\sigma^*_{SH}$ (x) decreases only gradually from $4.9\times10^5$ (h/2e) $\Omega^{-1}m^{-1}$ at x=0 (well-ordered fcc texture) to $4.1\times10^5$ (h/2e) $\Omega^{-1}m^{-1}$ (a 16% decrease), at x=0.4 (partially ordered fcc texture), and then sharply drops to $1.3\times10^5$ (h/2e) $\Omega^{-1}m^{-1}$ at x=0.5 (nearly amorphous), which indicates a dominant intrinsic SHC mechanism where $\sigma^*_{SH}$ (x) arises from the band structure resultant from the Pt LRCO. Moreover, we show in FIG. 23B that our experimental result of the electrical conductivity ($\sigma_{xx}(x)$) dependence of $\sigma^*_{SH}$ (x) is qualitatively consistent with the tight-binding model prediction[1] that the Pt band structure components that give rise to the Berry curvature are relatively robust in the presence of moderate disorder and thus that $\sigma^*_{SH}$ should initially only vary slowly with decreasing $\sigma_{xx}$, before decreasing much more rapidly once σxx is below a critical threshold. Quantitatively, however, the experimental values of $\sigma^*_{SH}$ (x) are considerably larger than theoretically predicted for $\sigma_{SH}$ in the pure Pt limit and reduces more slowly with $\sigma_{xx}(x)$ in percentage terms than predicted for pure Pt with decreasing quasi-particle lifetime. From x=0 to 0.4, the experimental value of $\sigma^*_{SH}(x)$ decreases by 16%, while the theoretically calculated $\sigma_{SH}$ drops by 38%; most notably, at $\sigma_{xx}=4\times10^5$ $\Omega^{-1}m^{-1}$, our experiment obtains $\sigma^*_{SH}=1.3\times10^5$ (h/2e) $\Omega^{-1}m^{-1}$(26.5% of pure Pt) while the tight-binding calculation predicts an internal SHC of $\sigma_{SH}\approx1\times10^3$ (h/2e) $\Omega^{-1}m^{-1}$(3.8% of pure Pt). The quantitative disagreement with the tight-binding model prediction in the reduction rate, but not the magnitude of the SHC, can be reasonably attributed to the decrease in the effective spin diffusion length $\lambda_s(x)$ of $Pt_{1-x}(MgO)_x$ with increasing x. Assuming the Elliot-Yafet spin relaxation mechanism ($\lambda_s \propto \sigma_{xx}$) and using the spin conductance of Pt ($G_{Pt}=\sigma_{xx}/\lambda s\approx1.3\times10^{15}$ $\Omega^{-1}m^{-2}$), $\lambda_s$ of the $Pt_{1-x}(MgO)_x$ can be estimated to decrease from 2.35 nm for x=0, to 1.04 nm for x=0.4, and 0.32 nm for x=0.5. Taking into account the spin backflow, we determined $T_{int}$ of the $Pt_{1-x}(MgO)_x$/Co interface in FIG. 3C by $$T_{int}=(1-\text{sech}(d/\lambda_s))/(1+G_{Pt}\tanh(d/\lambda_s)/2G^{\uparrow\downarrow}) \quad (1)$$

as a function of x using the spin mixing conductance $G^{\uparrow\downarrow}\approx 0.59\times 10^{15}$ $\Omega^{-1}\text{m}^{-2}$. We plot in FIG. 23D the internal spin Hall conductivity $\sigma_{SH}=\sigma^*_{SH}/T_{int}$ as the function of $\sigma_{xx}$ for our samples with different x. If we scale the available tight-binding model predictions for the variation of $\sigma_{SH}$ with $\sigma_{xx}$ by a constant factor of 6 (FIG. 23D), we find rather good agreement between experiment and prediction. It worth emphasizing that we don't attribute the reduction of $\sigma_{SH}$ with $\sigma_{xx}$ to the decrease of the amount of Pt atoms in the Pt—MgO layers because, after correcting for the effects of spin diffusion length and spin backflow ($T_{int}$), the experimental values of $\sigma_{SH}$ represent the bulk SHC strength and are unrelated to the HM thickness or the total Pt volume in the HM layers. We also note that the reduction of $\sigma_{SH}$ with $\sigma_{xx}$ (FIG. 23D) is not due to the reduced volume percentage of the Pt atoms with increasing x, because $\lambda_s$ reduces faster than Pt volume in the Pt—MgO layers so that the thickness of 4(1−x) is still at the thick limit and $\sigma^*_{SH}$ approximately reaches its bulk values. As an example, we show in FIG. 23A that $\sigma_{SH}$ is the same for 8 nm and 4 nm $Pt_{0.6}(MgO)_{0.4}$ as $\sigma^*_{SH}$ is independent of the HM thickness in the thick limit.

FIGS. 24A-24E show spin-torque efficiencies and Current-induced switching of a perpendicular magnetization in a $Pt_{0.7}(MgO)_{0.3}$ 4/Co 0.68 bilayer. Specifically, FIG. 24A shows (HL(FL), FIG. 24B $V_{AH}$ versus I ($H_x$=−1500 Oe), FIG. 24C $V_{AH}$ versus I ($H_x$=1500 Oe), FIG. 24D $V_{AH}$ versus Hz, and FIG. 24E $V_{AH}$ versus $H_x$, respectively. The Hall bar dimension is 5×60 μm². The applied electric field is E=1.67 kV/m for FIGS. 24B-24E.

The extrinsic skew scattering and side jump are less important mechanisms in contributing the SHC of Pt, and in determining the SHC of Pt, the extrinsic skew scattering and side jump are often not taken into account. The non-linear relations between $\sigma_{xx}(x)$ and $\sigma_{SH}(x)$ (with SBF correction) and between $\sigma_{xx}(x)$ and $\sigma^*_{SH}(x)$ (without SBF correction) obviously disagree with the skew scattering mechanism ($\sigma_{SH}\propto\sigma_{xx}$), e.g. for x≤0.4 the percentage decrease in $\sigma_{xx}(x)$ is much greater (by ~56%) than that of $\sigma_{SH}(x)$(by ~16%). We also note that, qualitatively, the quasi-linear scaling of $\xi_{DL}(=T_{in}\theta_{SH})$ (see FIG. 24A) with $\rho_{xx}$ is in accord with that found previously with light Pt alloying. These results clearly reaffirm the absence of any important skew scattering to the bulk SHC of Pt and non-magnetic Pt alloys, because in that case one would expect $\xi_{DL}$ to be approximately independent of $\rho_{xx}$. With regard to the possibility of an extrinsic side jump contribution to the $\sigma_{SH}$ of Pt and $Pt_{1-x}(MgO)_x$, we can draw from the conclusions of previous studies of side jump contribution to the anomalous Hall conductivity. Such research indicates that the side jump contribution to $\sigma_{SH}$ should be expected to scale inversely with the square of the residual resistivity ratio ($RRR=\rho_{xx}/\rho_{xx0}$) of the metal, where $\rho_{xx0}$ is the residual, low-temperature resistivity due to elastic defect scattering. The RRR for our pure Pt sample (x=0) is approximately 1.4, while for x=0.4 it is 1.1. In light of the small decrease in $\sigma_{SH}$ between x=0 and x=0.4, this is certainly not consistent with side jump being a significant contributor to the SHC of Pt and $Pt_{1-x}(MgO)_x$. Therefore, we conclude that the intrinsic contribution is the dominant physical origin of the observed SHC in Pt and SOTs in Pt/FM systems.

Moreover, an interfacial origin of the SHC is safely ruled out in the Pt/Co and $Pt_{1-x}(MgO)_x$/Co systems. The clear qualitative correlation between the evolution of a $\sigma^*_{SH}(x)$ over the entire range (0<x≤0.5) and the changes in the LRCO of Pt bulk indicated by the FWHM and XRD intensity (FIGS. 22C-22D) confirms that the SOTs we observe in this system are the result of a bulk effect (i.e. due to the SHC from the Pt LCRO in the $Pt_{1-x}(MgO)_x$ layer) rather an interfacial effect. This conclusion of a predominant bulk origin of the SOTs in our structurally disordered Pt system is consistent with the previously reported rapid decrease of the SOTs strength ($\sigma^*_{SH}(x)$) when the Pt or Pt alloy thickness becomes less than $\lambda_s$. Here we take note of a recent report of a strong spin torque from a Pt oxide/NiFe interface. In that case, there was no current flow in the insulating Pt oxide ($\rho_{xx}$=2.2×10⁷ μΩ cm), which is in sharp contrast to our case where the current is flowing in the conductive $Pt_{1-x}(MgO)_x$ layer. Thus the Pt oxide/NiFe does not have any connection to our $Pt_{1-x}(MgO)_x$/Co study.

After having established the intrinsic nature of the Pt SHC, we return to the quantitative comparison of the measured SHC results to the available theoretical predictions. It is important to note that, even before we make any corrections for the effect of the thickness of the sample compared to its $\lambda_s$ and less than perfect $T_{int}$, the experimental values we obtain for $\sigma^*_{SH}$ are equal to or larger than the available theoretical predictions for Pt from first-principles or tight-binding calculations (see comparison in FIG. 23B). If we only consider the ideal situation of spin backflow being important, the available band structure calculations for Pt/Co predict $T_{int}\approx 0.32$ for the Pt thickness d=4 nm (see FIG. 23C). Therefore, the actual intrinsic SHC of Pt is then at least ~1.6×10⁶ (h/2e) $\Omega^{-1}\text{m}^{-1}$ (see FIG. 23D). This is significantly larger than any of the existing theoretical predictions: (0.4-4.5)×10⁵ (h/2e)$\Omega^{-1}\text{m}^{-1}$, indicating that the available theoretical calculations are underestimating the true intrinsic SHC of Pt by at least a factor of 4, and most likely more since there is significant evidence of substantial spin memory loss at Pt/Co interfaces. We infer that there is still important underlying physics related to the generation of spin currents by intrinsic effects in Pt that is yet to be fully understood and that could benefit from the additional theoretical investigation.

The dampinglike and fieldlike SOT efficiencies per unit bias current density, (DL and $\xi_{FL}$, which are the efficiencies by which a bias charge current in the HM generates a spin current that exerts torques on an adjacent FM layer, are the most direct parameters that characterize the useful strength of the phenomenon. We show in FIG. 24A the results for $\xi_{DL}$ and $\xi_{FL}$ as calculated from $\xi_{DL(FL)}=2e\mu_0 M_s t H_{DL(FL)}/\hbar j_e$, where $j_e=E/\rho_{xx}$ is the charge current density in the $Pt_{1-x}(MgO)_x$ layer. In consistence of the dominance of the intrinsic SHE, (DL rather closely scales with $\rho_{xx}$ when $\sigma_{SH}$ varies only moderately for x≤0.4, i.e. $\xi_{DL}$ increases from 0.16 at x=0 (33 μΩ cm) to 0.30 at x=0.4 (74 μΩ cm). At x=0.5, despite that $\rho_{xx}$ increases sharply to 240 μΩ cm, $\xi_{DL}$ only slightly increases to 0.31 due to the strong decrease in $\sigma_{SH}$ as the result of the sharp increase in structural disorder. This large change in $\sigma_{SH}$ breaks the approximate scaling between $\xi_{DL}$ and $\rho_{xx}$ that is followed for x≤0.4.

The giant $\xi_{DL}$ of 0.30 for the 4 nm $Pt_{0.6}(MgO)_{0.4}$ ($\rho_{xx}$=74 μΩ cm) is comparable to the high value reported for fcc-$Au_{0.25}Pt_{0.75}$ ($\rho_{xx}$~83 μΩ cm) and β-W ($\rho_{xx}$~300 μΩ cm) and 3 times higher than that of β-Ta ($\rho_{xx}$≈190 μΩ cm). The SHE in those HMs has been demonstrated to enable sub-ns deterministic magnetic memories, gigahertz and terahertz oscillators, and fast skyrmion/chiral domain wall devices. However, for low-power device applications, new HMs that simultaneously combines a giant $\xi_{DL}$ with a low $\rho_{xx}$ and a good compatibility for device integration are still urgently required. In that regard, we first point out that $Pt_{0.6}(MgO)_{0.4}$ ($\xi_{DL}=0.30$ and $\rho_{xx}=74$ μΩ cm) is somewhat more energy-efficient than $Au_{0.25}Pt_{0.75}$, and progressively more so than Pt, β-W, β-Ta and the topological insulator $Bi_xSe_{1-x}$ ($\xi_{DL}=3.5$-18.6) for SOT applications with metallic magnets, e.g. in-plane magnetized FeCoB/MgO MRAMs (see quantitative comparison in Table 4), after taking into account the current shunting into the ferromagnetic layer. The relatively small $\rho_{xx}$ of the $Pt_{0.6}(MgO)_{0.4}$ is also highly desirable for applications that require high energy efficiency but small write impedance, e.g. the prospective implementation of SOT devices in cryogenic computing systems. In that case, the very resistive β-W, β-Ta, and $Bi_xSe_{1-x}$ spin Hall materials are all problematic.

As an independent check of the validity of the strong damping-like SOT generated by the $Pt_{1-x}(MgO)_x$, we show in FIGS. 24B-24C the sharp deterministic switching of a perpendicularly magnetized Co layer through domain wall depinning driven by the strong damping-like SOT generated by the SHE in a 4 nm $Pt_{0.7}(MgO)_{0.3}$ layer (we use $Pt_{0.7}(MgO)_{0.3}$ rather than $Pt_{0.6}(MgO)_{0.4}$ to provide stronger perpendicular magnetic anisotropy and larger coercivity). The Co layer has a thickness of 0.68 nm, coercivity (He) of ~80 Oe (FIG. 24D), and effective perpendicular anisotropy field ($H_k$) of ~2.0 T as determined by fitting the dependence of $V_{1\omega}$ on the in-plane bias field $H_x$ following the parabolic relation $V_{1\omega}=\pm V_{AH}(1-H_x^2/2H_k^2)$ (see FIG. 24E). The switching current of ~2.7 mA (FIG. 24B-24C) corresponds to a critical switching current density of $j_e=1.15\times10^7$ A/cm² in the $Pt_{0.7}(MgO)_{0.3}$ layer. To obtain reliable switching in this configuration it was necessary to apply an in-plane magnetic field of >1000 Oe along the current direction to overcome the domain wall chirality imposed by the DMI at the HM/Co interface.

Here we also note that the requirement of a large in-plane bias field (>1000 Oe) for switching perpendicular magnetization indicates a strong DMI at the $Pt_{1-x}(MgO)_x$/FM interface, which, together with the high $\xi_{DL}$, makes $Pt_{1-x}(MgO)_x$ particularly attractive for energy-efficient skyrmion and chiral domain wall devices driven by SHE-governed domain wall depinning. However, such a bias field is not required for the anti-damping SOT switching of collinear or "y-type" in-plane magnetized spin memories, which have been demonstrated to be surprisingly efficient and fast (e.g. critical switching current (density) ~110 μA (~$5\times10^6$ A/cm²), ~200 ps for W-based FeCoB—MgO MRAM devices).

Our study shows that the origin of the giant SHC in Pt is the intrinsic SHE arising from the band structure of the Pt bulk by systematically tuning the perfection of the crystalline and thus the electronic structure via incorporation of MgO inter-site scattering centers into the Pt bulk. The conclusion that the SHE in Pt and $Pt_{1-x}(MgO)_x$ is dominated by the intrinsic band structure effect is clearly validated by the qualitative correlation between $\sigma_{SH}$ and the degree of LRCO, by the consistency of the experimental observations with the tight-binding model predictions with respect to the dependence of $\sigma_{SH}(x)$ on the quasi-particle lifetime (or the density of elastic scattering centers as indicated by $\rho_{xx}(x)$ or $\sigma_{xx}(x)$), and by the quantitative scaling of (DL and $\rho_{xx}$, and skew-scattering, side jump, or interfacial contributions to the SHE in this system may not be taken into account in determining the SHE. Moreover, the internal SHC is experimentally found to be >$1.6\times10^6$ (h/2e) $\Omega^{-1}m^{-1}$, a value that is considerably underestimated by the existing first-principle and tight-binding theories. By utilizing the intrinsic nature of the SHE in Pt, we obtained a 100% enhancement of the dampinglike SOT efficiency $\xi_{DL}$ by increasing Pt resistivity via incorporating MgO impurities. This establishes a new spin Hall material $Pt_{0.6}(MgO)_{0.4}$ that is very compelling for low-power SOT applications in magnetic memories, oscillators, and skyrmion/chiral domain wall devices due to its combination of a giant spin Hall angle ($\theta_{SH}>\xi_{DL}=0.3$) with a relatively low resistivity (~74 μΩ cm), a strong DMI, and a good compatibility with the fabrication requirements for integrated circuit technologies.

All the samples were sputter deposited at room temperature on Si/SiO₂ substrates with argon pressure of 2 mTorr and a base pressure of below $1\times10^{-8}$ Torr. The volume percentage (x) of MgO in the $Pt_{1-x}(MgO)_x$ was determined using the calibrated Pt and MgO growth rates. The 1 nm Ta underlayer was introduced to improve the adhesion and the uniformity of the stack. The 1.5 nm Ta capping layer was fully oxidized upon exposure to the atmosphere. The sample structure was first characterized by combining cross-sectional high-resolution scanning transmission electron microscopy (STEM) imaging, high-angle annular dark field (HAADF) STEM imaging, and energy-dispersive x-ray spectroscopy (EDS) mapping in a spherical-aberration-corrected (Cs-corrected) 300-kV FEI Titan G2 microscope equipped with a Super-X detector. Focused ion beam was used during the preparation of the STEM samples. The stacks were patterned into $5\times60$ μm² Hall bars by ultraviolet photolithography and argon ion milling for harmonic response measurements and direct current switching experiments. The magnetization of Co layers and the chemical bond information in the $Pt_{1-x}(MgO)_x$ layers are measured by vibrating sample magnetometer and x-ray photoemission spectroscopy, respectively. In the magnetization switching experiment, the dc current is applied, and the differential Hall resistance may be detected by the lock-in amplifier (E=1.67 kV/m).

TABLE 4

Comparison of $\xi_{DL}$, $\rho_{xx}$, $\sigma_{SH}^*$ (x), and normalized power consumption of SOT-MRAM devices for various strong spin current generators. Here we use a $600 \times 300 \times 4$ nm² spin Hall channel, a $190 \times 30 \times 1.8$ nm³ FeCoB free layer (resistivity ≈ 130 μΩ cm) and the parallel resistor model for the illustrative calculation (see Supporting information for details on the power calculations).

| | $\xi_{DL}$ | $\rho_{xx}$ (μΩ cm) | $\sigma_{SH}^*$ ($10^5$ $(\hbar/2e)\Omega^{-1}m^{-1}$) | Power |
|---|---|---|---|---|
| $Pt_{0.6}(MgO)_{0.4}$ | 0.3 | 74 | 4.1 | 1.0 |
| $Au_{0.25}Pt_{0.75}$ | 0.3 | 83 | 3.6 | 1.2 |
| Pt | 0.16 | 33 | 4.9 | 1.3 |
| $Bi_2Se_3$ | 3.5 | 1755 | 2.0 | 2.9 |
| β-W | 0.3 | 300 | 1.0 | 8.1 |
| β-Ta | 0.12 | 190 | 0.63 | 24 |
| $Bi_xSe_{1-x}$ | 18.6 | 13000 | 1.4 | 28 |

With respect to the spin Hall conductivity (SHC) of Pt, both its dominant origin and amplitude remain in dispute. Resolving these questions is of fundamental importance for advancing understanding of very strong spin-orbit effects in conducting systems and for maximizing the spin Hall effect for energy-efficient spintronics applications. Here, we report the experimental determination of the rapid variation of the intrinsic SHC of Pt with the carrier lifetime (τ) in the dirty-metal regime by incorporating finely dispersed MgO inter-site impurities into the Pt while maintaining the essential elements of its band structure (face-centered-cubic order). This findings conclusively validate the theoretical prediction that the SHC in Pt in the dirty-metal regime should be dominated by the intrinsic Berry curvature contribution and should decrease rapidly with shortening τ. This also establishes the limit to which the spin Hall ratio $\theta_{SH}$ of pure Pt can be increased by shortening τ. When the spin backflow at the Pt/ferromagnet interface due to the finite interfacial spin-mixing conductance is taken into account, the amplitude of the intrinsic SHC of Pt in the clean limit is found to be at least $1.6 \times 10^6$ (h/2e) $\Omega^{-1} m^{-1}$, more than 3.5 times greater than the available theoretical predictions. Our work also establishes a compelling spin Hall metal $Pt_{0.6}(MgO)_{0.4}$ that combines a giant $\theta_{SH}$ (≈0.73) with a moderate resistivity (74 μΩ cm), a strong Dzyaloshinskii-Moriya interaction, easy growth, and good integration compatibility for spintronics technology.

In some embodiments of the disclosed technology, giant intrinsic spin Hall conductivity of Pt layer in the multilayer spin-Hall-effect structure allows the maximization of the energy efficiency of spin-torque technologies.

FIG. 25A shows schematic of enhanced impurity scattering in Pt by finely dispersed MgO molecules. FIG. 25B shows XPS spectrum for Pt 4f peaks in a $Pt_{0.6}(MgO)_{0.4}$ layer (black line) and a pure Pt layer (red line), indicating non-oxidization of Pt in both cases. FIG. 25C shows XPS spectrum for Pt 4d and 4p peaks, Mg KLL peak, and O 1s, indicating that Pt atoms are not oxidized while Mg and O atoms coexist as MgO molecules in the $Pt_{1-x}(MgO)_x$ layer peak. The solid lines represent the peak positions expected for non-bonding instances. Different from the Pt peaks, the Mg KLL and I 1s peaks show clear shifts of ±0.8 eV in binding energy, suggesting that Pt is not oxidized, while Mg is oxidized. FIG. 25D shows cross-sectional HAADF image (low-resolution mode) and EDS mapping of Pt, Mg, and O, showing no indication of Pt or MgO clusters. The two dashed lines represent the upper and lower interfaces of the $Pt_{0.6}(MgO)_{0.4}$ layer. FIG. 25E shows cross-sectional high-resolution TEM image (bright field) of a magnetic stack of Ta 1/$Pt_{0.6}(MgO)_{0.4}$ 4/Co 1.4/MgO 2/$TaO_x$ 1.5. FIG. 25F shows XRD θ-2θ patterns for $Pt_{1-x}(MgO)_x$/Co bilayers with different x, indicating the robustness of the long-range fcc order of Pt (peak position) in the presence of increasing MgO impurities (peak weakening and broadening).

Since the first theoretical and experimental efforts on its spin Hall conductivity (SHC) a decade ago, platinum (Pt), the archetypal spin Hall material, has been central in generating and detecting pure spin currents and key in establishing most of the recent spin-orbit-coupling phenomena. However, the correct physical understanding of the SHC of Pt has remained unresolved, both qualitatively and quantitatively, despite the extensive attention that has been given to this intriguing condensed matter physics problem. The bulk spin Hall effect (SHE) of a heavy metal (HM) can have three possible contributions, i.e., the intrinsic contribution from the Berry curvature of the band structure and the extrinsic skew-scattering and side jump contributions from spin-orbit-interaction-related defect and impurity scattering. Theoretically, the intrinsic contribution should dominate the SHC of Pt in the dirty-metal and clean regimes where the carrier lifetime (z) is short, whereas the extrinsic contributions can become important only in the ultraclean regime where z is very long. A tight-binding model calculation by Tanaka et al. has specified that a Pt sample is in the dirty-metal regime when its resistivity ($\rho_{xx} \propto \tau^{-1}$) is larger than ~30 μΩ cm. As a result, the intrinsic SHC of Pt, while being almost constant in the clean limit, is calculated to degrade rapidly with increasing $\rho_{xx}$ or shortening τ in the dirty-metal regime (e.g., the calculated intrinsic SHC decreases from $2.6 \times 10^5$, $1.6 \times 10^5$, to $0.1 \times 10^5$ (h/2e) $\Omega^{-1} m^{-1}$ as $\rho_{xx}$ increases from 8, 65 to 200 μΩ cm). Despite the consensus on the decrease of the SHC with r in the dirty-metal regime, it is important to note that, quantitatively, the predicted clean-limit values of the intrinsic SHC ($\sigma_{SH}$) of Pt from the available theoretical calculations differ by more than a factor of 10 (i.e. $\sigma_{SH}$=(0.4-4.5)×$10^5$ (h/2e) $\Omega^{-1} m^{-1}$).

Experimentally, the characteristic variation of the intrinsic SHC with r in the dirty-metal regime has never been quantified because it is a challenge to tune r over a large range without varying the band structure and the Berry curvature. For example, in the composition-dependent studies on Pt-based binary alloys (e.g. $Pd_{1-x}Pt_x$ or $Au_{1-x}Pt_x$), the source of the SHC is the new alloy phase rather than Pt as indicated by the greater SHC in the more resistive $Au_{1-x}Pt_x$ and $Pd_{1-x}Pt_x$ phases than that in Pt and there is also a significant change in the lattice constant (tensile strain) of the material upon alloying which first-principles calculations have indicated to significantly alter the SHC of Pt. In previous composition- or thickness-dependent studies, the increase of the dampinglike spin-orbit torque (SOT) efficiency per unit bias current density ($\xi_{DL}^j$) with increasing $\rho_{xx}$ was not a definitive indication of an intrinsic SHC because the side jump contribution to $\xi_{DL}^j$ can also increase with $\rho_{xx}$. Since $\xi_{DL}^j = T_{int} \sigma_{SH} \rho_{xx}$ with $T_{int}$ being the spin transparency of the HM/ferromagnet (FM) interface, the experimental situation can also have an additional complication when the HM layer is thinner than 4 times of its spin diffusion length ($\lambda_s$) because raising $\rho_{xx}$ can increase $T_{int}$ (see Eq. (6)) by shortening $\lambda_s$ of the HM ($\lambda_s \propto 1/\rho_{xx}$ in the Elloit-Yafet spin relaxation mechanism) and thus affect spin backflow (SBF) when the HM thickness is not >>$4\lambda_s$. Finally, in a recent temperature-dependent nonlocal spin valve study of Pt with varying $\rho_{xx}$, the amplitudes and the variations of $\sigma_{SH}$ are both comparable with the reported measurement uncertainty in the dirty-metal regime, preventing any examination of the variation of the intrinsic $\sigma_{SH}$ of Pt with $\rho_{xx}$ and thus τ.

There is also strong disagreement between experiments on the amplitude of $\sigma_{SH}$ in Pt in the clean limit. Direct SOT measurements reveal a lower bound value of $1.5 \times 10^6$ (h/2e) $\Omega^{-1} m^{-1}$ for the intrinsic $\sigma_{SH}$ of Pt with $\rho_{xx}$ 30-50 μΩ cm when the less than unitary $T_{int}$ due to SBF and spin memory loss (SML) at the Pt/FM interfaces is taken into account. In contrast, the nonlocal spin valve study where all interfaces were assumed to be fully spin-transparent reported a much smaller constant $\sigma_{SH}$ of $0.3 \times 10^6$ (h/2e) $\Omega^{-1} m^{-1}$ for both dirty and clean limits ($\rho_{xx}$=6-80 μΩ cm) within the experimental uncertainty. Generally, since the bare spin-mixing conductance at a HM/FM interface ($G_{HM/FM}^{\uparrow\downarrow}$) is only comparable to the spin conductance of the HM ($G_{HM}$) rather being infinite, the drift-diffusion model predicts that SBF will substantially reduce $T_{int}$, e.g. by more than 50% for Pt/FM interfaces. The discovery of the spin Hall magnetoresistance in Pt/FM systems has unambiguously confirmed that there must be substantial SBF. Any spin memory loss due to significant interfacial spin-orbit scattering (ISOC) at the interface will further decrease $T_{int}$. Clarifying the underlying physics of the giant SHC of Pt is both of fundamental interest and technological urgency (e.g. for maximizing $\xi_{DL}^j$ for low-power devices). Arguably, Pt and certain Pt-rich alloys are the most attractive class of spin Hall metals for energy-efficient spin-torque applications because their combination of the highest SHC of any known class of metals with comparatively low $\rho_{xx}$ provides a high $\xi_{DL}^j$ and minimal current shunting into an adjacent FM at the same time.

Our study shows a substantial (×3) tuning of carrier mean lifetime i in Pt films by varying the concentration of MgO inter-site impurities (FIG. 25A) while maintaining the long-range face-centered-cubic (fcc) order of the Pt. From this, we observe a rapid degradation (×5) of the intrinsic SHC of Pt with decreasing z in the dirty-metal regime, providing the first experimental validation of the tight-binding model prediction of the characteristic variation of the intrinsic SHC of Pt with carrier lifetime. The extrinsic and interfacial mechanisms may not be taken into account as important contributions to the SHC of Pt over the investigated resistivity range (30 µΩ cm≤$\rho_{xx}$≤240 µΩ cm). These results conclusively establish that the dominant source of the giant SHC in Pt in the dirty-metal regime is the bulk intrinsic SHE arising from the Berry curvature of its band structure. This also establishes the limit to which $\theta_{SH}$ can be increased by shortening carrier lifetime of Pt. Moreover, the giant experimental SHC values for Pt (e.g., ≥1.6×10$^6$ (h/2e) Ω$^{-1}$m$^{-1}$ in the clean limit) indicate that the existing first-principles and tight-binding theories are underestimating the true intrinsic SHC in Pt by more than a factor of 3.5. Finally, we achieve a 100% enhancement in $\xi_{DL}^j$ by increasing $\rho_{xx}$ via the incorporation of MgO impurities into Pt. This establishes a new ternary spin Hall material Pt$_{0.6}$(MgO)$_{0.4}$ that is very compelling for low-power SOT applications because of its combination of a giant $\theta_{SH}$, a comparably low $\rho_{xx}$, a large Dzyaloshinskii-Moriya interaction (DMI), and easy growth on silicon substrates by sputtering.

Multilayer stacks of Ta 1.0/Pt$_{1-x}$(MgO)$_x$ 4.0/Co 0.68-1.4/MgO 2.0/Ta 1.5 (numbers are thickness in nm) with MgO volume percentage x=0, 0.05, 0.1, 0.15, 0.2, 0.25, 0.3. 0.35, 0.4, and 0.5, respectively, were sputter deposited on Si/SiO$_2$ substrates. The Pt$_{1-x}$(MgO)$_x$ layer was co-sputtered from a Pt target and a MgO target. The Co magnetization (M$_s$) for these samples was measured by a vibrating sample magnetometer to be ~1220±85 emu/cm$^3$, indicating the absence of a significant magnetic proximity effect in these as-grown samples. We find from x-ray photoemission spectroscopy (XPS) studies (FIG. 25B) that the Pt 4f$_{7/2}$ and 4f$_{5/2}$ peaks are located at 71.1 and 74.4 eV, respectively, in both a Pt$_{0.6}$(MgO)$_{0.4}$ and a pure Pt layer. In contrast, the binding energies of 4f$_{7/2}$ and 4f$_{5/2}$ peaks for Pt oxides are reported to be shifted to ~72.3 and ~75.8 eV for Pt$^{2+}$, and 74.0 and 77.5 eV for Pt$^{4+}$, respectively. Meanwhile, we find that the XPS peaks for Mg KLL and O is are shifted by ±0.8 eV, respectively (FIG. 25C). This clearly indicates that in the Pt$_{1-x}$(MgO)$_x$ layers the Pt atoms are not oxidized while the Mg atoms are oxidized and Mg and O coexist as MgO molecules, consistent with the fact that Pt has a much stronger electronegativity than Mg. FIG. 25D shows cross-sectional energy-dispersive x-ray spectroscopy (EDS) Pt, Mg, and O mapping of the composite material Pt$_{0.6}$(MgO)$_{0.4}$ under the HAADF mode (a low-resolution mode), which indicates, within the resolution, that the MgO molecules are finely dispersed within the Pt. High-resolution cross-sectional scanning transmission electron microscopy (STEM) studies of the Pt(MgO) composites (see FIG. 25E for image of a Pt$_{0.6}$(MgO)$_{0.4}$ sample) show that the co-sputtered Pt$_{1-x}$(MgO)$_x$ layer has a homogeneous polycrystalline texture where the grains are ~4 nm in vertical extent and that there is no indication of the presence of Pt or MgO clusters of observable size. The high-resolution TEM result in FIG. 25E indicates that the long-range fcc order of Pt is essentially maintained despite the high-concentration MgO impurities (x=0.4 in FIG. 25E). This is further reaffirmed by the x-ray diffraction (XRD) θ-2θ patterns of Pt$_{1-x}$(MgO)$_x$ 4/Co 1.4 bilayers in FIG. 25F. The Pt$_{1-x}$(MgO)$_x$ layer shows a broad fcc (111) peak due to the polycrystalline texture and the small thickness. However, unlike the case for Pt alloyed with another fcc metal, the fcc (111) peak for all different x does not shift with x but is located at the Bragg angle of Pt for all different x, indicating that the diffraction is from the periodic Pt lattice and that the MgO molecules are primarily dispersed in the Pt as inter-site impurities rather than being substituted into the Pt lattice. However, the Pt (111) peaks do show a dramatic broadening and weakening with increasing x due to the increasing presence of MgO impurities and the reducing Pt atomic volume. We also note here that, in this XRD measurement configuration where the grain size along the film normal is the film thickness (~4 nm, see FIG. 25E), the broadening of the Pt (111) peaks is not indicating a variation of the Pt grain size. It is somewhat surprising that the lattice periodicity of Pt is so resilient against a large degree of MgO incorporation. More detailed high-resolution analysis in the future can be useful for better understanding this material, but it is beyond the scope of the present work.

FIGS. 26A-26C show the experimental values of (A) the average resistivity, (B) carrier lifetime, (C) the apparent SHC ($\sigma^*_{SH}$) for Pt$_{1-x}$(MgO)$_x$ 4 nm/Co bilayers plotted as a function of MgO concentration (x) of the Pt$_{1-x}$(MgO)$_x$ layers. FIG. 26D shows experimental and theoretical values for the (apparent) spin Hall conductivity of Pt plotted as a function of $\sigma_{xx}/(1-x)$, with $\sigma_{xx}/(1-x)$ being an approximate linear indicator of carrier lifetime. Inset: non-linear dependence of the experimental values of $\sigma^*_{SH}$ and $\sigma_{SH}$ on $\sigma_{xx}$.

The average resistivity $\rho_{xx}$ for the Pt$_{1-x}$(MgO)$_x$ layers was determined for each x by measuring the conductance enhancement of the corresponding stacks with respect to a reference stack with no Pt$_{1-x}$(MgO)$_x$ layer. Note that the average resistivity $\rho_{xx}$ best describes the effective scattering (by impurities, interfaces, and phonons) a charge carrier experiences when flowing in the Pt$_{1-x}$(MgO)$_x$ layer (see FIG. 25A) and directly determines the charge current density (j$_e$) via j$_e$=E/$\rho_{xx}$ for a given applied electric field E. As summarized in FIG. 26A, $\rho_{xx}$ for the Pt$_{1-x}$(MgO)$_x$ is enhanced by a factor of ~8, i.e., increases gradually from 33 µΩ cm at x=0 (pure Pt) to 74 µΩ cm for x=0.4, and then jumps up to 240 µΩ cm for x=0.5. These high values of $\rho_{xx}$ (>30 µΩ cm) place the Pt$_{1-x}$(MgO)$_x$ films with 0≤x≤0.5 in the dirty-metal regime as calculated by Tanaka et al. and as indicated by our experimental results discussed below. The increase in $\rho_{xx}$ with x is due in part to the increase in carrier scattering rate (1/τ) and in part to the decrease in charge carrier density n=n$_{Pt}$(1−x). To separate these two contributions we use the Drude model approximation for the resistivity $$\rho_{xx}=1/\sigma_{xx}=m^*/ne^2\tau, \qquad \text{Eq. (4)}$$

where $\sigma_{xx}$ is the electrical conductivity and m* is the effective mass of the charge carriers. In this approximation, the carrier lifetime in Pt$_{1-x}$(MgO)$_x$ is $$\tau=\sigma_{xx}m^*/ne^2 \approx \tau_{Pt}\sigma_{xx}/\sigma_{xx,Pt}(1-x), \qquad \text{Eq. (5)}$$

where $\sigma_{xx,Pt}$ and $\tau_{Pt}=\sigma_{xx,Pt}m^*/ne^2$ are the electrical conductivity and the carrier lifetime of the 4 nm pure Pt film (x=0). As shown in FIG. 26B, with increasing impurity concentration x, τ for Pt$_{1-x}$(MgO)$_x$ decreases monotonically from $\tau_{Pt}$ for x=0, moderately to 0.74$\tau_{Pt}$ for x=0.4, and then more abruptly to 0.27$\tau_{Pt}$ for x=0.5. We speculate that the modest increase in the carrier scattering rate with the MgO incorporation for x up to 0.4 is due to the very small scattering cross-section of MgO molecules, while the substantial increase in scattering rate when x is increased from 0.4 to 0.5 may be due to an increase of very small MgO aggregates with a higher scattering cross-section at that higher MgO content.

In the following, we determine that the dominant source of the Pt SHC is the intrinsic SHE. We first calculated the apparent spin Hall conductivity $\sigma^*_{SH} = T_{int}\sigma_{SH} = (h/2e)\xi_{DL}^E$ as a function of x from our experimental results in FIG. 26C. Here $\xi_{DL}^E = \mu_0 M_s t H_{DL}/E$ is the dampinglike SOT per applied electric field, $\mu_0$ is the permeability of vacuum, t is the ferromagnetic layer thickness, $H_{DL}$ is the dampinglike SOT effective field for E=66.7 kV/m as determined from harmonic response measurements. Note that the thickness (d) and the carrier density (thus $\sigma_{xx}$) of the HM are not involved in the calculation of $\sigma^*_{SH}$ and $\xi_{DL}^E$. In good accord with the changes in r caused by the MgO addition, $\sigma^*_{SH}$ decreases only moderately from $4.9\times10^5$ (h/2e) $\Omega^{-1}m^{-1}$ at x=0 to $4.1\times10^5$ (h/2e) $\Omega^{-1}m^{-1}$ at x=0.4, and then sharply drops to $1.3\times10^5$ (h/2e) $\Omega^{-1}m^{-1}$ at x=0.5.

To obtain the internal values of $\sigma_{SH} = \sigma^*_{SH}/T_{int}$, $T_{int}$ of the $Pt_{1-x}(MgO)_x$/Co interfaces has to be calculated for each x. With the drift-diffusion analysis, the interfacial spin transparency set by SBF is given by $$T_{int} = (1-\text{sech}(d/\lambda_s))/(1+G_{HM}\tanh(d/\lambda_s)/2G_{HM/FM}^{\uparrow\downarrow}), \quad \text{Eq. (6)}$$

where $G_{HM} = \sigma_{xx}/\lambda_s$ is spin conductance of the HM. Since $G_{HM/FM}^{\uparrow\downarrow}$ typically scales with the Sharvin conductance $G_{sh}$ of the HM and both $G_{sh}$ and $G_{HM}$ are proportional to n and independent of $\tau$, we have $G_{Pt-MgO} = (1-x)G_{Pt}$ and $G_{Pt-MgO/Co}^{\uparrow\downarrow} = (1-x)G_{Pt/Co}$. Assuming a dominant Elliott-Yafet spin relaxation mechanism ($\lambda_s \propto \sigma_{xx}$) and using the experimental value $G_{Pt} \approx 1.3\times10^{15}$ $\Omega^{-1}m^{-2}$ and the theoretical value $G_{Pt/Co} \approx 0.59\times10^{15}$ $\Omega^{-1}m^{-2}$, we estimated that $\lambda_s$ of $Pt_{1-x}(MgO)_x$ decreases monotonically, from 2.35 nm for x=0, to 1.73 nm for x=0.4 and 0.64 nm for x=0.5 and that $T_{int}$ of the $Pt_{1-x}(MgO)_x$/Co interface increases monotonically from 0.32 for x=0 to 0.39 for x=0.4 and 0.47 for x=0.5.

The following description examines the effect of r on the SHC. FIG. 26D compares our experimental results of $\sigma^*_{SH}$ and $\sigma_{SH} = \sigma^*_{SH}/T_{int}$ for different x to the theoretical predictions of intrinsic SHC as a function of $\sigma_{xx}/(1-x)$. Here we use $\sigma_{xx}/(1-x) \propto \tau$ as an approximate linear indicator of r. Functionally, the scaling of $\sigma_{SH}$ and $\sigma^*_{SH}$ with $\sigma_{xx}(x)/(1-x)$ and thus with r is quite consistent with the tight-binding model prediction. The 4 nm-thick pure Pt sample with a relatively low $\sigma_{xx,Pt} = 3\times10^6$ $\Omega^{-1}m^{-1}$ due to the strong scattering at its interfaces is just on the predicted crossover from the clean limit to the dirty-metal regime with respect to its intrinsic SHC behavior. As $\tau$ is gradually decreased by increasing x, the intrinsic SHC decreases monotonically, in accord with the theoretical prediction for the variation of $\sigma_{SH}$ with electrical conductivity ($\tau$) in the dirty-metal regime. The amplitude of the measured SHC is clearly quite different from the predicted values, but if we rescale the magnitude of the tight-binding model result by a constant factor of 6 (FIG. 26D), we find good agreement between the experiment and the prediction. Therefore, the tight-binding model captures the functional form, but not the magnitude, of the experimental behavior. More specifically, our experiment and the tight-binding model prediction establish that the giant SHC of Pt is dominated by intrinsic Berry curvature contribution in the clean and dirty-metal regimes and that the intrinsic SHC varies strongly with the carrier lifetime $\tau$ in the dirty-metal regime. The good qualitative consistency of the experiment and theory also indicates that the topology of the Fermi surface of the fcc Pt is rather robust to the inter-site impurities, but is, as predicted, quite sensitive to r in this high-resistivity regime. This establishes a practical limit to which $\theta_{SH}$ of pure Pt can be enhanced (i.e. $\theta_{SH} \approx 0.65$) solely by reducing $\tau$ even if the structure order can be maintained while reducing $\tau$. We d$_0$ note that there is a minor difference between the experimental data of $\sigma_{SH}$ and the rescaled tight-binding model prediction ($\times 6$) in the dirty-metal regime, which we tentatively attribute to a small SML at the $Pt_{1-x}(MgO)_x$/Co interfaces. As established previously, SML can result from ISOC of the HM/FM interface and increases linearly with the interfacial perpendicular magnetic anisotropy energy density of the HM/FM interface ($K_s^{HM/FM}$) $K_s^{Pt-MgO/Co}$ for these un-annealed in-plane $Pt_{1-x}(MgO)_x$/Co samples gradually decreases from $\sim 0.66$ erg/cm$^2$ for x=0 to be negligible for x=0.5. These overall small amplitudes of ISOC are well consistent with the high amplitude of $\sigma_{SH}$ of the low-MgO concentration samples being close to that of Pt/Co samples after SML correction (the star in the FIG. 26D). The MgO dopants may also interrupt the perfection of the long-range fcc order of Pt and thus contribute to the difference between the measured and rescaled theoretical values of $\sigma_{SH}$. This, however, should be a minor effect compared to the dominant role of the carrier lifetime in determining the variation of $\sigma_{SH}$.

As shown in the inset of FIG. 26D, the obvious non-linear relations between $\sigma_{xx}$ and $\sigma_{SH}$ (with SBF correction) and between $\sigma_{xx}$ and $\sigma^*_{SH}$ (without SBF correction) for different x obviously disagree with a dominant skew scattering mechanism ($\sigma_{SH} \propto \sigma_{xx}$). This is consistent with the theoretical expectation that the skew scattering should not be important in the dirty-metal regime. With regard to the possibility of a side jump contribution to $\sigma_{SH}$ of Pt and $Pt_{1-x}(MgO)_x$, we can draw from the conclusions of previous studies of side jump contribution to the anomalous Hall conductivity. Such research indicates that the side jump contribution to $\sigma_{SH}$ should scale inversely with the square of the residual resistivity ratio (RRR=$\rho_{xx}/\rho_{xx0}$) of the metal, where $\rho_{xx0}$ is the residual, low-temperature resistivity due to elastic defect scattering. The RRR for our pure Pt sample (x=0) is approximately 1.4, while for x=0.4 it is 1.1. Therefore, if the side jump was dominant, we should expect a 60% increase in $\sigma_{SH}$ as x increases from x=0 to x=1.1. In light of the decrease in $\sigma_{SH}$ between x=0 and x=0.4, we can rule out side jump as a significant contributor to the SHC of Pt and $Pt_{1-x}(MgO)_x$ in the dirty-metal limit. It is interesting to note that the anomalous Hall conductivity (AHC) of some FMs (e.g. L1$_0$-ordered MnGa, MnAl, or FePt) may have a distinguishable extrinsic SHC even in the "dirty-metal" regime, but in that case the intrinsic AHC is very small, at least two orders in magnitude smaller than the intrinsic SHC of Pt. Therefore, we conclude that the intrinsic contribution is the dominant physical origin of the observed SHC in Pt.

An interfacial origin of the SHC can also be safely ruled out as a significant factor in the Pt/Co and $Pt_{1-x}(MgO)_x$/Co systems. The clear qualitative correlation between the evolution of $\sigma^*_{SH}$ over the entire range ($0 < x \leq 0.5$) and the changes in carrier lifetime of the Pt films confirms that the SOTs we observe in this system are the result of a bulk effect (i.e. due to the SHC from the long-range fcc order of Pt in the $Pt_{1-x}(MgO)_x$ layer) rather than an interfacial effect. This conclusion of a predominant bulk origin of the SOTs in our doped Pt system is consistent with the previously reported rapid decrease of the SOTs strength ($\sigma^*_{SH}$) when the Pt or Pt alloy thickness becomes less than $\lambda_s$. Here we take note of a recent report of a strong SOT from a Pt oxide/NiFe interface. In that case there was no current flow in the insulating Pt oxide ($\rho_{xx} = 2.2\times10^7$ $\mu\Omega$ cm), which is in sharp contrast to our case where the current is flowing in the conductive $Pt_{1-x}(MgO)_x$ layer. Thus the Pt oxide/NiFe does not have any connection to our $Pt_{1-x}(MgO)_x$/Co study.

After having established the intrinsic nature of the Pt SHC, we return to the quantitative comparison of the measured SHC results to the available theoretical predictions. It is important to note that, even before we make any corrections for the effect of the thickness of the sample compared to its $\lambda_s$ and less than perfect $T_{int}$, the experimental values we obtain for $\sigma^*_{SH}$ are equal to or larger than the available theoretical predictions for Pt from first-principles or tight-binding calculations (see the comparison in FIG. 26D). If we only consider the ideal situation of SBF being important, with no additional SML, the experiments determine the actual intrinsic SHC of $(1.1-1.6)\times10^6$ (h/2e) $\Omega^{-1}m^{-1}$ in for $\sigma_{xx}>2.2\times10^5$ $\Omega^{-1}m^{-1}$ (or $\rho_{xx}\leq74$ μΩ cm) (see FIG. 26D). In the clean limit (e.g. $\rho_{xx}\leq32$ μΩ cm), the actual intrinsic SHC of Pt is then at least $\sim1.6\times10^6$ (h/2e) $\Omega^{-1}m^{-1}$. This is significantly larger than any of the existing theoretical predictions: $(0.4-4.5)\times10^5$ (h/2e)$\Omega^{-1}m^{-1}$, indicating that the available theoretical calculations are underestimating the true intrinsic SHC of Pt by more than a factor of 3.5, and most likely more since there can be SML at Pt/Co interfaces. We infer that there is still important underlying physics related to the generation of spin currents by intrinsic effects in Pt that is yet to be fully understood and that could benefit from the additional theoretical investigation.

FIG. 27A shows the MgO-concentration dependence of $\theta_{SH}$ and $\xi_{DL}^j$ for the $Pt_{1-x}(MgO)_x$ 4/Co 1.4 bilayers. FIG. 27B shows $V_{AH}$ versus I ($H_x=-1500$ Oe), FIG. 27C shows $V_{AH}$ versus I ($H_x=1500$ Oe), FIG. 27D shows $V_{AH}$ versus $H_z$, and FIG. 27E shows $V_{AH}$ versus $H_x$ for a $Pt_{0.7}(MgO)_{0.3}$ 4/Co 0.68 bilayers. The Hall bar dimension is 5×60 μm². The applied electric field is E=1.67 kV/m for FIGS. 27B-27E.

$\theta_{SH}$ and $\xi_{DL}^j$ are the most direct parameters that characterize the useful strength of the phenomenon. FIG. 27A shows the results for $\theta_{SH}=(2e/h)\sigma_{SH}\rho_{xx}$ for the $Pt_{1-x}(MgO)_x$ layers and $\xi_{DL}^j=T_{int}\theta_{SH}=\xi_{DL}\rho_{xx}$ for $Pt_{1-x}(MgO)_x$ 4/Co 1.4 bilayers, where the HM thickness of 4 nm is chosen from the viewpoint of the optimized current efficiency of a spin-orbit torque switching of magnetic tunneling junctions. In consistence with the bulk intrinsic SHE, $\theta_{SH}$ increases monotonically from 0.51 for pure Pt to 0.73 for x=0.4, and then slightly drops back to 0.66 for x=0.5 due to the strong decrease in $\sigma_{SH}$ as the result of the sharp decrease in carrier lifetime. We note that $\theta_{SH}=0.73$ is still a low bound value for $Pt_{0.6}(MgO)_{0.4}$ as there is still SML. The internal value of $\theta_{SH}$ for $Pt_{0.6}(MgO)_{0.4}$ would be ≈0.95 if the difference between the experimental and rescaled tight-binding model values of $\sigma_{SH}$ in FIG. 26D is attributed solely to SML. Note that $\theta_{SH}\approx0.95$ should be the upper bound for the case where Pt is diluted by an insulator (e.g. MgO here) that does not alter the band structure. This upper limit ($\theta_{SH}\approx0.95$) is higher than that for pure Pt ($\tau_{SH}\approx0.65$) because for the same $\sigma_{SH}$ and $\tau$, the enhancement of $\rho_{xx}$ for $Pt_{0.6}(MgO)_{0.4}$ is more significant than in pure Pt due to the additional dilution effect of the carrier density in $Pt_{0.6}(MgO)_{0.4}$. Benefiting from the increase of both $\theta_{SH}$ and $T_{int}$ with x, $\xi_{DL}^j$ increases from 0.16 at x=0 (33 μΩ cm) to 0.28 at x=0.4 (74 μΩ cm). At x=0.5, despite that $\rho_{xx}$ increases sharply to 240 μΩ cm, $\xi_{DL}^j$ only slightly increases to 0.31. The giant $\xi_{DL}^j$ of ≈0.3 we obtained with the 4 nm $Pt_{0.6}(MgO)_{0.4}$ ($\rho_{xx}=74$ μΩ cm) is comparable to the high value reported for fcc-$Au_{0.25}Pt_{0.75}$ ($\rho_{xx}\sim83$ μΩ cm) and β-W ($\rho_{xx}\sim300$ μΩ cm) and 3 times higher than that of β-Ta ($\rho_{xx}\sim190$ μΩ cm). The SHE in those HMs has been demonstrated to enable sub-ns deterministic magnetic memories, gigahertz and terahertz oscillators, and fast skyrmion/chiral domain wall devices. However, for low-power device applications, new HMs that simultaneously combine a giant $\xi_{DL}^j$ with a low $\rho_{xx}$ and a good compatibility for device integration are still urgently required. In that regard, we first point out that $Pt_{0.6}(MgO)_{0.4}$ ($\xi_{DL}^j=0.28$ and $\rho_{xx}=74$ μΩ cm) is as efficient as $Pd_{0.25}Pt_{0.75}$ and $Au_{0.25}Pt_{0.75}$, and progressively more so than Pt, β-W, β-Ta and the topological insulator $Bi_xSe_{1-x}$ ($\xi DL^j=3.5-18.6$) for SOT applications with metallic magnets, e.g. in-plane magnetized FeCoB/MgO MRAMs (see the quantitative comparison in Table 5), after taking into account the current shunting into the ferromagnetic layer. The $Pt_{0.6}(MgO)_{0.4}$ is also better than Pt, β-W, and β-Ta in current efficiency. The relatively small $\rho_{xx}$ of the $Pt_{0.6}(MgO)_{0.4}$ is also highly desirable for applications that require high energy/current efficiencies but small write impedance, e.g. the prospective implementation of SOT devices in cryogenic computing systems. In that case, the very resistive spin Hall materials of β-W, β-Ta, and $Bi_xSe_{1-x}$ are all problematic.

As an independent check of the validity of the strong damping-like SOT generated by the $Pt_{1-x}(MgO)_x$, we show in FIG. 27B-27C the sharp deterministic switching of a perpendicularly magnetized Co layer through domain wall depinning driven by the strong damping-like SOT generated by the SHE in a 4 nm $Pt_{0.7}(MgO)_{0.3}$ layer (we use $Pt_{0.7}(MgO)_{0.3}$ rather than $Pt_{0.6}(MgO)_{0.4}$ to provide stronger perpendicular magnetic anisotropy and larger coercivity). The Co layer has a thickness of 0.68 nm, coercivity (He) of ~80 Oe (FIG. 27D), and effective perpendicular anisotropy field ($H_k$) of ~2.0 T as determined by fitting the dependence of $V_{1\omega}$ on the in-plane bias field $H_x$ following the parabolic relation $V_{1\omega}=\pm V_{AH}(1-H_x^2/2H_k^2)$ (see FIG. 27E). The switching current of ~2.7 mA (FIGS. 27B-27C) corresponds to a critical switching current density of $j_e=1.15\times10^7$ A/cm² in the $Pt_{0.7}(MgO)_{0.3}$ layer. To obtain reliable switching in this configuration it was necessary to apply an in-plane magnetic field of >1000 Oe along the current direction to overcome the domain wall chirality imposed by the DMI at the HMCo interface.

Here we also note that the requirement of a large in-plane bias field (>1000 Oe) for switching perpendicular magnetization indicates a strong DMI at the $Pt_{1-x}(MgO)_x$/FM interface, which, together with the high $\xi_{DL}^j$, makes $Pt_{1-x}(MgO)_x$ particularly attractive for energy-efficient skyrmion and chiral domain wall devices driven by SHE-governed domain wall depinning. However, such a bias field is not required for the anti-damping SOT switching of collinear or "y type" in-plane magnetized magnetic memories, which have been demonstrated to be surprisingly efficient and fast (e.g. critical switching current (density) ~110 μA (~5×10⁶ A/cm²), ~200 ps for W-based FeCoB—MgO MRAM devices).

The multilayer spin-Hall-effect structure implemented based on some embodiments of the disclosed technology can utilize the rapid variation of the intrinsic SHC of Pt with the carrier lifetime in the dirty-metal regime, a characteristic of the intrinsic SHC as theoretically predicted more than a decade ago. Via tuning the scattering from the finely dispersed MgO inter-site impurities, the carrier lifetime τ and intrinsic SHC were varied by a factor of 3 and 5, respectively, while the basic fcc order of Pt was maintained. We have also excluded any important skew-scattering, side jump, or interfacial contributions to the SHE in this system. These results unambiguously determine the dominant intrinsic nature of the giant spin Hall effect in the archetypal material of Pt, and also establish the limit to which the spin Hall efficiency of Pt can be enhanced by shortening τ (i.e., $\theta_{SH}\approx0.65$ for pure Pt). Moreover, the internal intrinsic SHC in the clean limit is experimentally found to be >$1.6\times10^6$ (h/2e) $\Omega^{-1}m^{-1}$, a value that is considerably underestimated by the existing first-principle and tight-binding theories. Our effort in shortening z via MgO incorporation into Pt also enables a 100% enhancement of $\xi_{DL}^j$ for the $Pt_{0.6}(MgO)_{0.4}$/Co bilayers compared to the Pt/Co bilayer. This establishes a new spin Hall material $Pt_{0.6}(MgO)_{0.4}$ that is very compelling for low-power SOT applications in magnetic memories, oscillators, and skyrmion/chiral domain wall devices due to its combination of a giant spin Hall ratio ($\theta_{SH}$=0.73 with a upper bound of ≈0.95 if the SML is diminished) with a relatively low resistivity (~74 μΩ cm), a strong DMI, and a good compatibility with the fabrication requirements for integrated circuit technologies.

All the samples were sputter deposited at room temperature on $Si/SiO_2$ substrates with argon pressure of 2 mTorr and a base pressure of below $1\times10^{-8}$ Torr. The volume percentage (x) of MgO in the $Pt_{1-x}(MgO)_x$ was determined using the calibrated growth rates of Pt and MgO. The 1 nm Ta underlayer was introduced to improve the adhesion and the uniformity of the stack. The 1.5 nm Ta capping layer was fully oxidized upon exposure to the atmosphere. The magnetization of Co layers and the chemical bond information in the $Pt_{1-x}(MgO)_x$ layers are measured by vibrating sample magnetometer and x-ray photoemission spectroscopy, respectively. The sample structure was also characterized by combining cross-sectional high-resolution scanning transmission electron microscopy (STEM) imaging, high-angle annular dark field (HAADF) STEM imaging, and energy-dispersive x-ray spectroscopy (EDS) mapping in a spherical-aberration-corrected (Cs-corrected) 300-kV FEI Titan G2 microscope equipped with a Super-X detector. Focused ion beam was used during the preparation of the STEM samples. The stacks were patterned into 5×60 μm² Hall bars by ultraviolet photolithography and argon ion milling for harmonic response measurements and direct current switching experiments. In the magnetization switching experiment, the dc current was sourced by a Yokogawa 7651 and the differential Hall resistance was detected by the lock-in amplifier (E=1.67 kV/m).

show composition dependence of the intensity and the FWHM of the x-ray diffraction patterns.

FIG. 31A shows optical microscopy image of Hall bar devices. The effective spin-orbit-torque fields, $H_{DL}$ and $H_{im}$, are oriented along the z and y directions, respectively. FIG. 31B shows φ dependence of $V_{1ω}$ (x=0.4), FIG. 31C shows φ dependence of $V_{2ω}$ (x=0.4), FIG. 31D shows $V_a$ versus $-V_{AH}/2(H_{in}+H_k)$, and FIG. 31E shows $V_p$ versus $-V_{PH}/H_{in}$ for $Pt_{1-x}(MgO)_x$/Co bilayers with different x. The solid lines in FIGS. 31B-31E represent best fits of data to $V_{1ω}=V_{PH}\cos 2\varphi$, $V_{2ω}=V_a \cos \varphi + V_p \cos \varphi \cos 2\varphi$, $V_a=-V_{AH}H_{DL}/2(H_{in}+H_k)+V_{ANE}$, and $V_p=-V_{PH}(H_{FL}+H_{Oe})/H_{in}$+offset, respectively. The slope in FIG. 31E represents the sum of dampinglike torque field and the Oersted field (i.e. $H_{FL}+H_{Oe}$). $H_{im}$ become small for x=0.5 in consistence with the dampinglike torque field $H_{DL}$. Since the sign of $H_{im}$ is opposite to $H_{Oe}$, the sum of the two fields $H_{FL}+H_{Oe}$ become positive. In our definition, the sign of $H_{FL}$ is defined as positive if it is parallel to $H_{Oe}$.

Figures 32A, 32B, 32C:
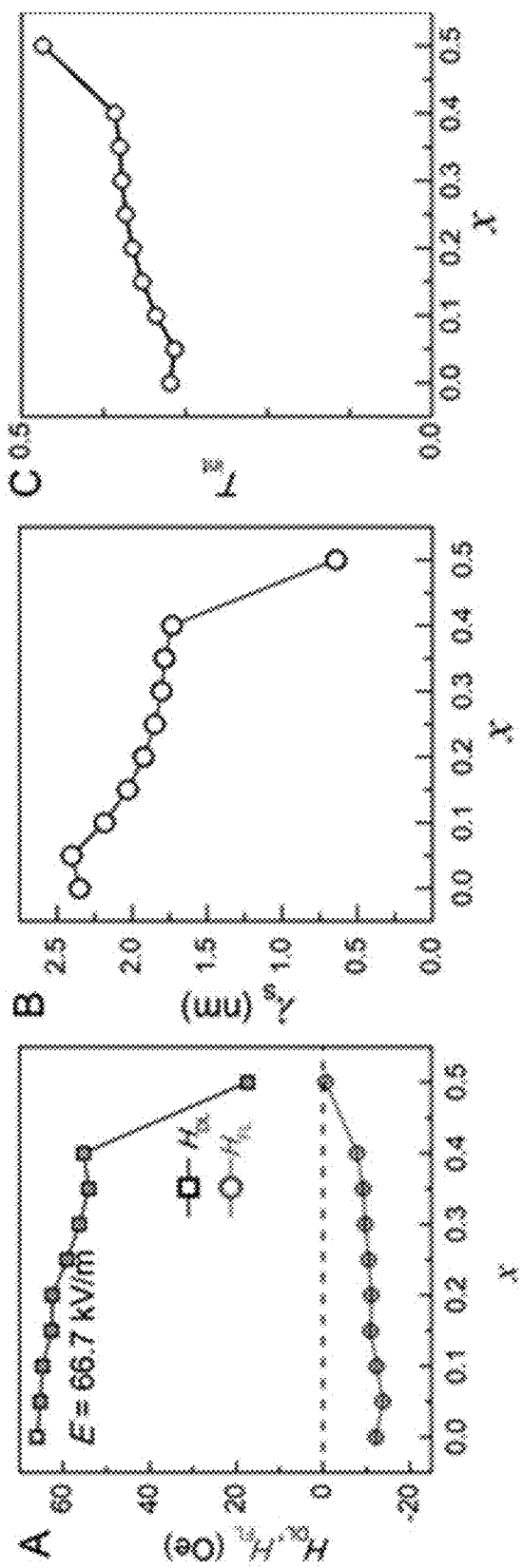
FIG. 32A shows dampinglike and fieldlike spin-torque effective fields in $Pt_{1-x}(MgO)_x/Co$ layers.
FIG. 32B shows spin diffusion length ($\lambda_s$) of $Pt_{1-x}(MgO)_x$.
FIG. 32C shows interfacial spin transparency at the $Pt_{1-x}(MgO)_x/Co$ interface.

FIG. 32A shows dampinglike and fieldlike spin-torque effective fields in $Pt_{1-x}(MgO)_x$/Co layers. FIG. 32B shows spin diffusion length ($\lambda_s$) of $Pt_{1-x}(MgO)_x$. FIG. 32C shows interfacial spin transparency at the $Pt_{1-x}(MgO)_x$/Co interface.

Figure 33:
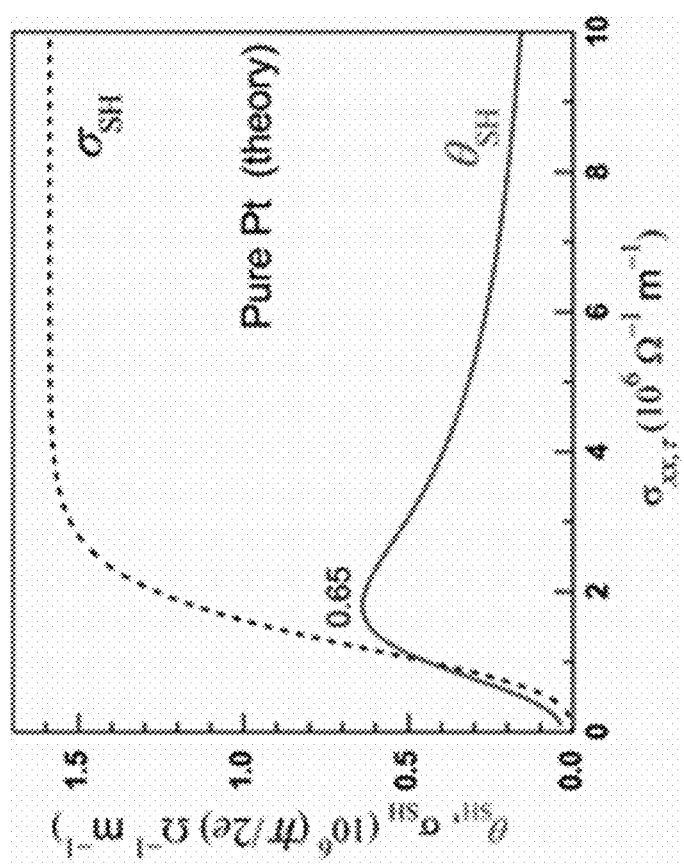
FIG. 33 shows enhancement of the spin Hall ratio in Pt by shortening carrier lifetime.

FIG. 33 shows enhancement of the spin Hall ratio in Pt by shortening carrier lifetime. The variation of electrical conductivity ($\sigma_{xx,\tau}$) is assumed to be due only to the shortening of carrier lifetime (τ). The black dashed line represents the rescaled tight-binding prediction (×6) of the intrinsic spin Hall conductivity ($\sigma_{SH}$) of pure Pt. The red line represents the calculated spin Hall ratio using $\theta_{SH}=(2e/h)\sigma_{SH}/\sigma_{xx,\tau}$, indicating a peak value of $\theta_{SH}\approx 0.65$ at $\sigma_{xx,\tau}=1.8\times10^6$ $\Omega^{-1}m^{-1}$ (resistivity $\rho_{xx}\approx 56$ μΩ cm). Note that we determined a $\theta_{SH}$=0.73 for $Pt_{0.6}(MgO)_{0.4}$, which is higher than the 0.65 for pure Pt. This is because $\rho_{xx}$ ($\sigma_{xx}$) of $Pt_{1-x}(MgO)_x$ was

TABLE 5

Comparison of $\xi_{DL}^j$, $\theta_{SH}$, $\rho_{xx}$, $\sigma_{SH}^*$ (x), and calculated power and current consumption of SOT-MRAM devices for various strong spin current generators. Here we use a 600 × 300 × 4 nm² spin Hall channel, a 190 × 30 × 1.8 nm³ FeCoB free layer (resistivity ≈130 μΩ cm) and the parallel resistor model for the illustrative calculation (see Supporting information for details on the power and current calculations). Power and current are normalized to that of the $Pt_{0.6}(MgO)_{0.4}$-based device.

| | $\xi_{DL}^j$ | $\theta_{SH}$ | $\rho_{xx}$ (μΩ cm) | $\sigma_{SH}^*$ ($10^5$ ($\hbar$/2e)$\Omega^{-1}m^{-1}$) | Power | Current | Ref. |
|---|---|---|---|---|---|---|---|
| $Pt_{0.6}(MgO)_{0.4}$ | 0.28 | >0.73 | 74 | 3.8 | 1.0 | 1.0 | This work |
| $Pd_{0.25}Pt_{0.75}$ | 0.26 | >0.6 | 58 | 4.5 | 0.9 | 1.0 | |
| $Au_{0.25}Pt_{0.75}$ | 0.3 | >0.6 | 83 | 3.6 | 1.0 | 0.95 | |
| Pt | 0.16 | 0.51 | 33 | 4.9 | 1.2 | 1.6 | This work |
| $Bi_2Se_3$ | 3.5 | n.a. | 1755 | 2.0 | 2.6 | 0.3 | |
| $Pt_{0.5}(MgO)_{0.5}$ | 0.31 | 0.66 | 240 | 1.3 | 4.5 | 1.2 | Tins work |
| β-W | 0.3 | n.a. | 300 | 1.0 | 7.1 | 1.3 | |
| β-Ta | 0.12 | n.a. | 190 | 0.63 | 21 | 2.8 | |
| $Bi_xSe_{1-x}$ | 18.6 | n.a. | 13000 | 1.4 | 25 | 0.4 | |

Figure 28:
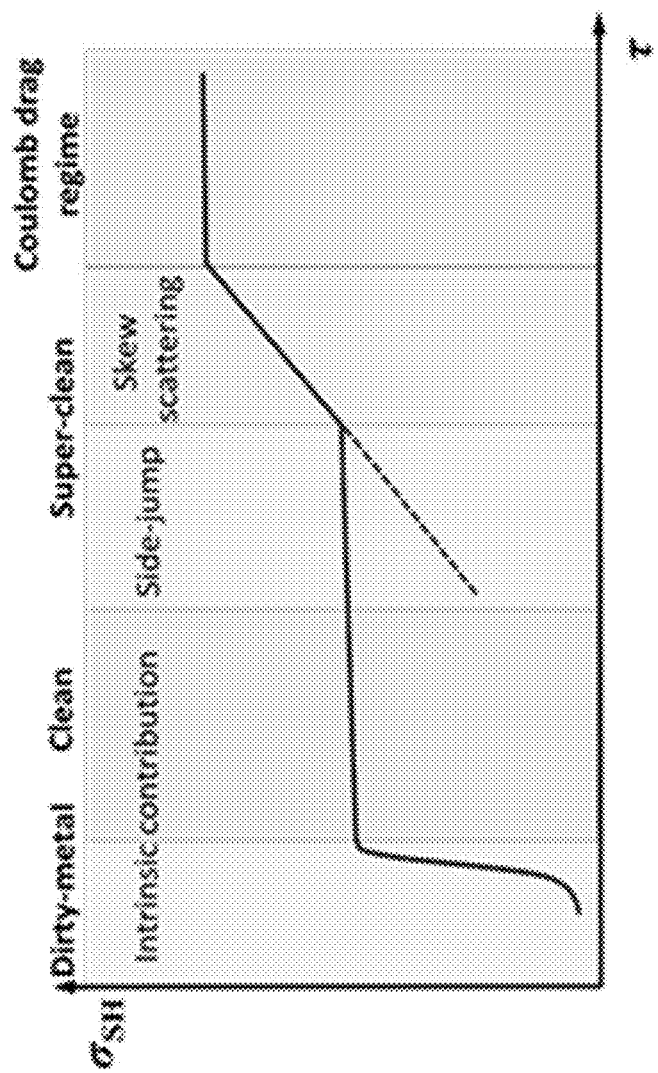
FIG. 28 shows evolution of spin Hall conductivity with carrier lifetime.
Figures 30A, 30B:
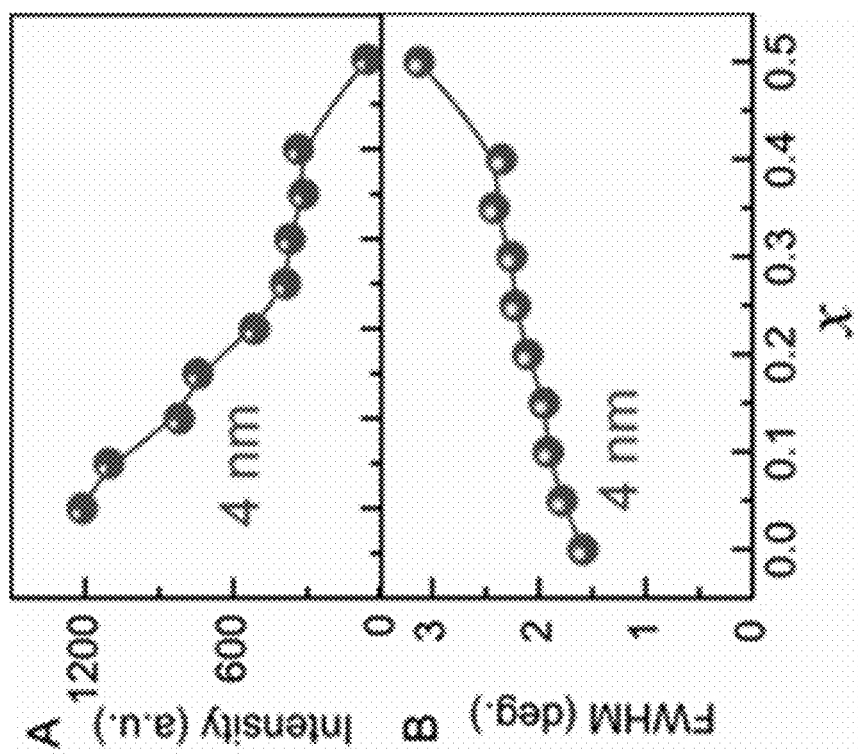
FIGS. 30A-30B show composition dependence of the intensity and the FWHM of the x-ray diffraction patterns.

FIG. 28 shows evolution of spin Hall conductivity with carrier lifetime. FIG. 29A shows scattering by finely dispersed MgO molecules in an uniform single layer of $Pt_x(MgO)_{1-x}$. FIG. 29B shows interface scattering in a Pt single layer. FIG. 29C shows cluster boundary scattering from large MgO clusters embedded in Pt bulk. The average resistivity, which reflects the sum of the scatterings by impurities, interfaces, grain boundaries, and phonons, is the best description of the scattering strength a carrier experiences when flowing in the conductive layer. FIGS. 30A-30B enhanced (reduced) due to both the reduction of carrier density and carrier lifetime. For the same values of $\sigma_{SH}$ and τ, $\rho_{xx}$ in $Pt_{1-x}(MgO)_x$ is higher than in pure Pt and thus leads to $\theta_{SH}$ that is larger than 0.65 predicted for pure Pt.

Figure 34:
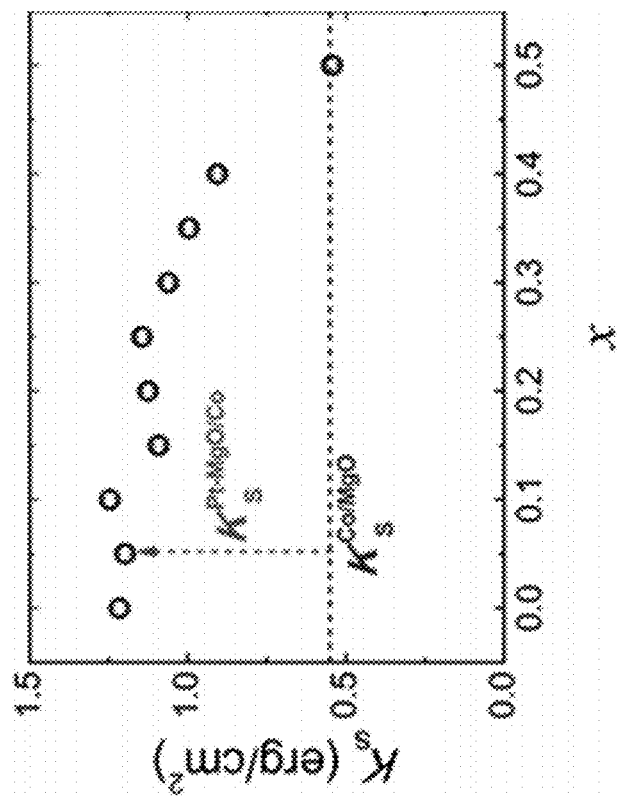
FIG. 34 shows MgO concentration dependence of interfacial magnetic anisotropy energy density.

FIG. 34 shows MgO concentration dependence of interfacial magnetic anisotropy energy density. The measured $K_s$ values for the $Pt_{1-x}(MgO)_x$/Co/MgO samples (black circles) are the sum of the contributions from the $Pt_{1-x}(MgO)_x$/Co and Co/MgO interfaces. The dashed blue line denotes the $K_s$ value of ≈0.55 erg/cm² for Co/MgO interfaces as determined from Ta/Co/MgO and Hf/Co/MgO control samples. The difference between the total $K_s$ and $K_s$ (Co/MgO) are the contribution from the $Pt_{1-x}(MgO)_x$/Co interfaces that influence the spin transport from $Pt_{1-x}(MgO)_x$ to Co.

Figure 35:
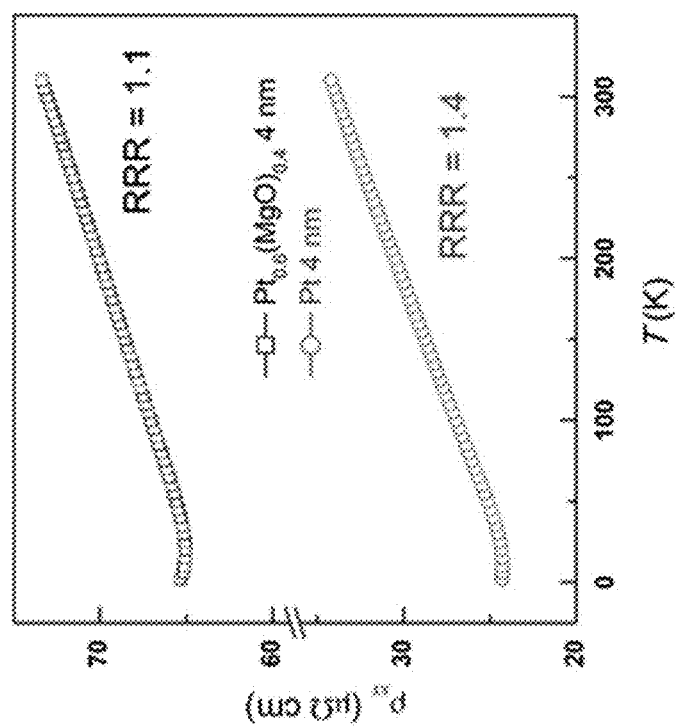
FIG. 35 shows temperature dependence of resistivity for 4-nm-thick Pt and $Pt_{0.6}(MgO)_{0.4}$ films.

FIG. 35 shows temperature dependence of resistivity for 4-nm-thick Pt and $Pt_{0.6}(MgO)_{0.4}$ films. The residual resistivity ratios (RRR) at 300 K are determined to be 1.4 for Pt and 1.1 for $Pt_{0.6}(MgO)_{0.4}$.

Figures 36A, 36B:
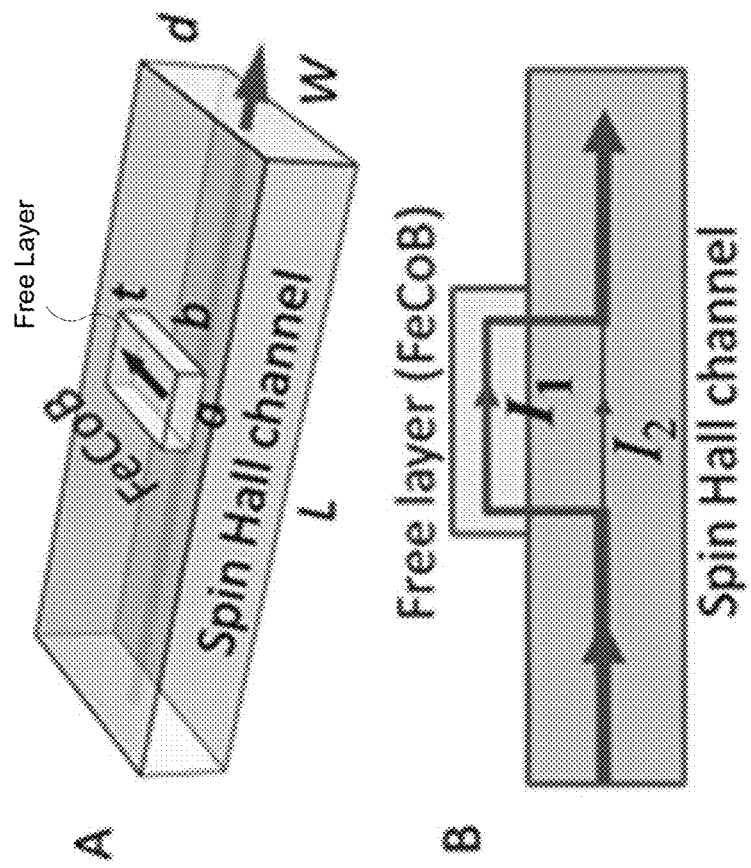
FIG. 36A shows dimension definitions.
FIG. 36B shows current shunting into free layer.

FIGS. 36A-36B shows schematics for a spin-orbit torque MRAM device. FIG. 36A shows dimension definitions, and FIG. 36B shows current shunting into free layer.

A lock-in amplifier was used to source a sinusoidal voltage ($V_{in}$=4 V) across the length of the bar (L=60 μm) orientated along the x axis and to detect the in-phase first harmonic and out-of-phase second harmonic Hall voltages, $V_{1\omega}$ and $V_{2\omega}$. For in-plane magnetized HM/FM bilayer, the dependence of $V_{2\omega}$ on the in-plane field angle ($\varphi$) is given by $V_{2\omega}=V_a \cos \varphi + V_p \cos \varphi \cos 2\varphi$, where $V_a=-V_{AH}H_{DL}/2(H_{in}+H_k)+V_{ANE}$, and $V_p=-V_{PH}(H_{FL}+H_{Oe})/H_{in}$ with $V_{AH}$, $V_{ANE}$, $H_{in}$, $H_k$, $V_{PH}$, $H_{DL}$, $H_{FL}$, and $H_{Oe}$ being anomalous Hall voltage, anomalous Nernst voltage, in-plane bias field, perpendicular anisotropy field, planar Hall voltage, damping-like effective spin torque field, and field-like effective spin torque field, and Oersted field. The $\varphi$ dependence of $V_{1\omega}$ is given by $V_{1\omega}=V_{PH} \cos 2\varphi$, from which the planar Hall voltage $V_{PH}$ can be determined. We separated the damping-like term $V_a$ and the field-like term $V_p$ for each Hip and each x by fitting $V_{2\omega}$ data to $V_{2\omega}=V_a \cos \varphi + V_p \cos \varphi \cos 2\varphi$. From the linear fits of $V_a$ versus $-V_{AH}/2(H_{in}+H_k)$ and $V_p$ versus $-V_{PH}/H_{in}$, we determine the values of $H_{DL(FL)}$ for $Pt_{1-x}(MgO)_x$/Co bilayers for a constant applied electric field $E=V_{in}/L=66.7$ kV m$^{-1}$. Both $H_{DL}$ and $H_{FL}$ vary significantly and monotonically with x.

Here we calculate the power efficiency of a model spin-orbit torque MRAM device consisting of a 600×300×4 nm$^3$ spin Hall channel and a 190×30×1.8 nm$^3$ FeCoB free layer (resistivity $\rho_{FeCoB}$=130 μΩ cm) by taking into account the current shunting into the free layer. For the convenience of discussion, we note the device dimensions: channel length L=600 nm, channel width W=300 nm, channel thickness d=4 nm; free layer "length" a=30 nm, free layer "width" b=190 nm, free layer thickness t=1.8 nm, free layer length a=30 nm, free layer width b=190 nm, and free layer thickness t=1.8 nm. Since t<<a and t<<b, current spreading has minimal influence and a parallel resistor model can be used. The total write current (Lot) in the spin Hall channel is given by $$I_{tot} = I_2 + I_1 = I_2\left(1 + \frac{I_1}{I_2}\right) = I_2\left(1 + \frac{\rho_{HM}}{\rho_{FM}} \frac{ta}{dW}\right) \quad \text{Eq. (7)}$$

where $I_1$ is the current shunted into the FeCoB free layer and $I_2$ is the "useful" current in the spin Hall channel that drives the magnetization switching. $\rho_{FM}$ and $\rho_{HM}$ are resistivity of the free layer and heavy metal layers, respectively. According to the macrospin model, which is found to work reasonably well for in-plane magnetized magnetic tunneling junctions, we have $$I_2 = \frac{2e}{\hbar}\mu_0 M_s t_{FM} \alpha(H_c + 4\pi M_{eff}/2)/\xi_{DL} \quad \text{Eq. (8)}$$

in which e, $\mu_0$, h, $\alpha$, $H_c$, $M_{eff}$, and $\xi_{DL}$ are the elementary charge, the permeability of vacuum, the reduced Planck constant, the magnetic damping, the coercivity, the effective magnetization, the damping-like spin torque efficiency, respectively. The power consumption is then given by:

$$P = I_1^2 \rho_{FM} \frac{a}{bt} + I_2^2 \rho_m \frac{a}{Wd} + I_{tot}^2 \rho_{HM} \frac{L-a}{Wd} \quad \text{Eq. (9)}$$

FIGS. 37A-37B show examples of a magnetic device 3710, 3720 implemented based on some embodiments of the disclosed technology. The magnetic device 3710, 3720 may include a magnetic tunneling junction (MTJ) and a spin Hall effect metal layer. The MTJ includes (1) a pinned magnetic layer having a fixed magnetization direction, (2) a free magnetic layer having a magnetization direction that is changeable, and (3) a non-magnetic junction layer between the magnetic free layer and the pinned magnetic layer and formed of an insulator material sufficiently thin to allow tunneling of electrons between the magnetic free layer and the pinned magnetic layer. The spin Hall effect metal layer includes a metal exhibiting a large spin Hall effect to react to a charge current directed into the spin Hall effect metal layer to produce a spin-polarized current that is perpendicular to the charge current, and the spin Hall effect metal layer being parallel to and adjacent to the free magnetic layer to direct the spin-polarized current generated in the spin Hall effect metal layer into the free magnetic layer. As shown in FIG. 37A, the spin Hall effect metal layer includes one or more insertion metal layers to interface with the MTJ to introduce interfacial scattering of electrons. As shown in 37B, the spin Hall effect metal layer includes multiple sub-layers and the one or more insertion metal layers include multiple sub-layers such that multiple sub-layers of the spin Hall effect metal layer and multiple sub-layers of the insertion layer are interleaved.

In an embodiment of the disclosed technology, the one or more insertion metal layers may include at least one of Hf layer or Ti layer. For example, the spin Hall effect metal layer includes Pt and the one or more insertion metal layers include Hf layers such that Pt and Hf layers are interleaved. In another embodiment of the disclosed technology, the one or more insertion metal layers may include a metal that is different from Hf or Ti. For example, the spin Hall effect metal layer includes Pt and the one or more insertion metal layers include metal layers that are different from Hf and Ti to enhance the scattering of electrons in the Pt such that the Pt and the metal layers are interleaved.

Figure 38:
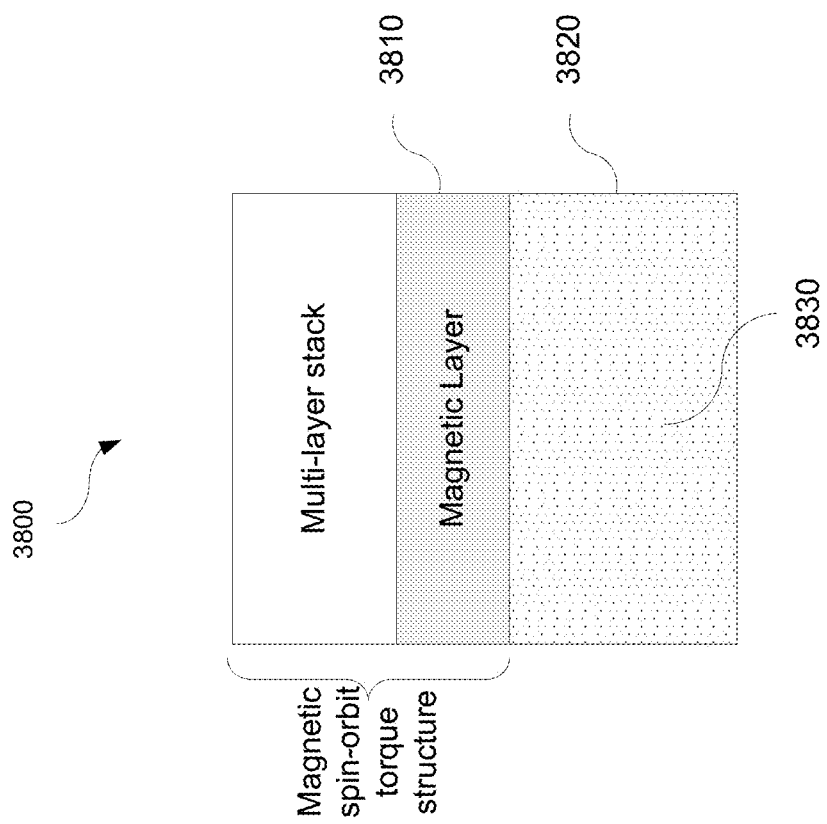
FIG. 38 shows an example of a magnetic device 3800 implemented based on some embodiments of the disclosed technology.

FIG. 38 shows an example of a magnetic device 3800 implemented based on some embodiments of the disclosed technology. The magnetic device 3800 may include a magnetic spin-orbit torque structure including multi-layer stack of layers 3810 structured to include a magnetic layer 3810 to exhibit a spin-orbit torque, a spin Hall metal layer 3820 coupled to the magnetic layer 3810 to produce a charge current in the spin Hall metal layer, and a scattering enhancement layer 3830 arranged in the spin Hall metal layer 3820 to induce interfacial scattering of electrons within the spin Hall metal layer 3820.

In some implementations, the scattering enhancement layer 3830 includes at least one of Hf layer or Ti layer. In some implementations, the scattering enhancement layer 3830 includes multiple sub-layers such that multiple sub-layers of the spin Hall metal layer and the multiple sub-layers of the scattering enhancement layer 3830 are interleaved. In some implementations, the scattering enhancement layer 3830 includes a Pt layer and the multiple sub-layers of the scattering enhancement layer 3830 includes Hf layers such that Pt and Hf layers are interleaved. In some implementations, the spin Hall metal layer further includes particles dispersed in the spin Hall metal layer to further introduce interfacial scattering of electron. In some implementations, the particles include MgO molecules.

In some implementations, the scattering enhancement layer 3830 includes a Pt layer and the multiple sub-layers of the scattering enhancement layer 3830 includes Ti layers such that Pt and Ti layers are interleaved. In some implementations, the spin Hall metal layer further includes particles dispersed in the spin Hall metal layer to further introduce interfacial scattering of electrons. In some implementations, the particles include MgO molecules. In some implementations, the scattering enhancement layer 3830 includes MgO molecules dispersed in the spin Hall metal layer. In some implementations, the scattering enhancement layer 3830 includes a plurality of clusters of MgO molecule dispersed in the spin Hall metal layer.

While this patent document and attached Appendices A through E contain many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is what is disclosed and illustrated, including:

1. A magnetic device, comprising:
   a magnetic tunneling junction (MTJ) that includes (1) a pinned magnetic layer having a fixed magnetization direction, (2) a free magnetic layer having a changeable magnetization direction, and (3) a non-magnetic junction layer between the free magnetic layer and the pinned magnetic layer and formed of an insulator material sufficiently thin to allow tunneling of electrons between the free magnetic layer and the pinned magnetic layer; and
   a spin Hall effect metal layer including a metal exhibiting a large spin Hall effect to react to a charge current directed into the spin Hall effect metal layer to produce a spin-polarized current that is perpendicular to the charge current, and the spin Hall effect metal layer being parallel to and adjacent to the free magnetic layer to direct the spin-polarized current generated in the spin Hall effect metal layer into the free magnetic layer,
   wherein the spin Hall effect metal layer includes one or more insertion metal layers arranged inside the spin Hall effect metal layer and operable to introduce interfacial scattering of electrons flowing in the spin Hall metal layer to increase the spin current that interacts with and changes the magnetization of the free magnetic layer of the MTJ.

2. The device as in claim 1, wherein the one or more insertion metal layers include at least one of Hf layer or Ti.

3. The device as in claim 1, wherein the one or more insertion metal layers include a metal that is different from Hf or Ti.

4. The device as in claim 1, wherein the spin Hall effect metal layer includes Pt and the one or more insertion metal layers include Hf layers such that Pt and Hf layers are interleaved.

5. The device as in claim 4, wherein the spin Hall effect metal layer further includes particles to further introduce interfacial scattering of electrons.

6. The device as in claim 5, wherein the particles include MgO particles.

7. The device as in claim 1, wherein the spin Hall effect metal layer includes Pt and the one or more insertion metal layers include Ti layers such that the Pt and Ti layers are interleaved.

8. The device as in claim 7, wherein the spin Hall effect metal layer further includes particles to further introduce interfacial scattering of electrons.

9. The device as in claim 8, wherein the particles include MgO particles.

10. The device as in claim 1, wherein the spin Hall effect metal layer includes Pt and the one or more insertion metal layers include metal layers that are different from Hf and Ti to enhance the scattering of electrons in the Pt such that the Pt and the metal layers are interleaved.

11. The device as in claim 1, wherein the free magnetic layer includes a Co layer or a thin ferromagnetic layer that exhibits a perpendicular magnetic anisotropy (PMA), wherein the interfacial scattering of electrons induced by the one or more insertion metal layers magnifies a spin-orbit torque switching of the Co layer or the thin ferromagnetic layer.

12. The device as in claim 1, wherein the one or more insertion metal layers arranged inside the spin Hall effect metal layer form boundaries between the one or more insertion metal layers and a material of the spin Hall effect metal layer, and wherein the interfacial scattering of electrons occurs at the boundaries.

13. The device as in claim 12, wherein the material of the spin Hall effect metal layer includes Pt and the one or more insertion metal layers include Ti layers such that the Pt and Ti layers are interleaved.

14. The device as in claim 12, wherein the spin Hall effect metal layer further includes particles, and wherein the interfacial scattering of electrons further occurs at the particles.

15. The device as in claim 14, wherein the particles include MgO particles.

16. The device as in claim 1, wherein the one or more insertion metal layers include two or more insertion metal layers spaced apart from each other inside the spin Hall effect metal layer.

17. The device as in claim 16, wherein the two or more insertion metal layers form boundaries between the two or more insertion metal layers and a material of the spin Hall effect metal layer, and wherein the interfacial scattering of electrons occurs at the boundaries.

18. The device as in claim 17, wherein the material of the spin Hall effect metal layer includes Pt and the two or more insertion metal layers include Ti layers such that the Pt and Ti layers are interleaved.

19. The device as in claim 17, wherein the spin Hall effect metal layer further includes particles, and wherein the interfacial scattering of electrons further occurs at the particles.

20. The device as in claim 19, wherein the particles include MgO particles.

\* \* \* \* \*